(12) United States Patent
Shimojuku et al.

(10) Patent No.: US 9,755,127 B2
(45) Date of Patent: Sep. 5, 2017

(54) SEMICONDUCTOR LIGHT EMITTING DEVICE AND METHOD FOR MANUFACTURING SAME

(71) Applicant: Kabushiki Kaisha Toshiba, Minato-ku (JP)

(72) Inventors: Miyuki Shimojuku, Kawasaki (JP); Hideto Furuyama, Yokohama (JP); Shuji Itonaga, Yokohama (JP); Mitsuyoshi Endo, Yamato (JP); Yukihiro Nomura, Fuchu (JP); Akihiro Kojima, Nonoichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/066,601

(22) Filed: Mar. 10, 2016

(65) Prior Publication Data

US 2017/0077367 A1  Mar. 16, 2017

(30) Foreign Application Priority Data

Sep. 11, 2015  (JP) .................... 2015-179422

(51) Int. Cl.
  *H01L 33/62* (2010.01)
  *H01L 33/40* (2010.01)
  *H01L 33/58* (2010.01)

(52) U.S. Cl.
  CPC ............ *H01L 33/62* (2013.01); *H01L 33/405* (2013.01); *H01L 33/58* (2013.01); *H01L 2933/0016* (2013.01); *H01L 2933/0058* (2013.01); *H01L 2933/0066* (2013.01)

(58) Field of Classification Search
  None
  See application file for complete search history.

(56) References Cited

U.S. PATENT DOCUMENTS

| 8,916,901 | B2 | 12/2014 | Kimura et al. |
| 9,006,764 | B2 | 4/2015 | Akimoto et al. |
| 9,087,974 | B2 | 7/2015 | Kimura et al. |
| 2011/0297986 | A1* | 12/2011 | Nishiuchi ........... H01L 33/0079 257/98 |
| 2011/0300644 | A1* | 12/2011 | Akimoto ............ H01L 33/508 438/7 |

(Continued)

FOREIGN PATENT DOCUMENTS

| JP | 2002-335020 | 11/2002 |
| JP | 2003-273408 | 9/2003 |
| JP | 2014-186343 A | 10/2014 |

*Primary Examiner* — Khaja Ahmad
(74) *Attorney, Agent, or Firm* — Oblon, McClelland, Maier & Neustadt, L.L.P.

(57) ABSTRACT

According to one embodiment, a semiconductor light-emitting device includes a semiconductor layer including a first semiconductor layer, a second semiconductor layer, a light emitting layer, a first surface, and a second surface; a p-side electrode; an n-side electrode; a first p-side pillar; a first n-side pillar; a first insulating layer; a fluorescer layer; a second insulating layer; a p-side interconnect; and an n-side interconnect. The second insulating layer is provided as one body in at least a portion of an outer side of a side surface of the first insulating layer and at least a portion of an outer side of a side surface of the fluorescer layer.

16 Claims, 36 Drawing Sheets

(56) References Cited

U.S. PATENT DOCUMENTS

| | | | |
|---|---|---|---|
| 2013/0248910 A1* | 9/2013 | Kimura | H01L 25/167 257/98 |
| 2013/0285091 A1* | 10/2013 | Akimoto | H01L 33/44 257/98 |
| 2013/0313590 A1* | 11/2013 | Akimoto | H01L 33/62 257/98 |
| 2013/0334539 A1* | 12/2013 | Kojima | H01L 33/44 257/76 |

* cited by examiner

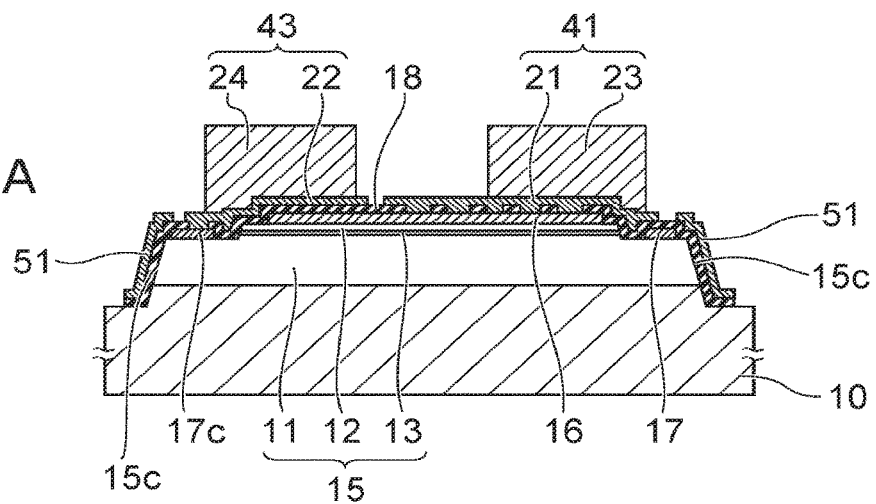
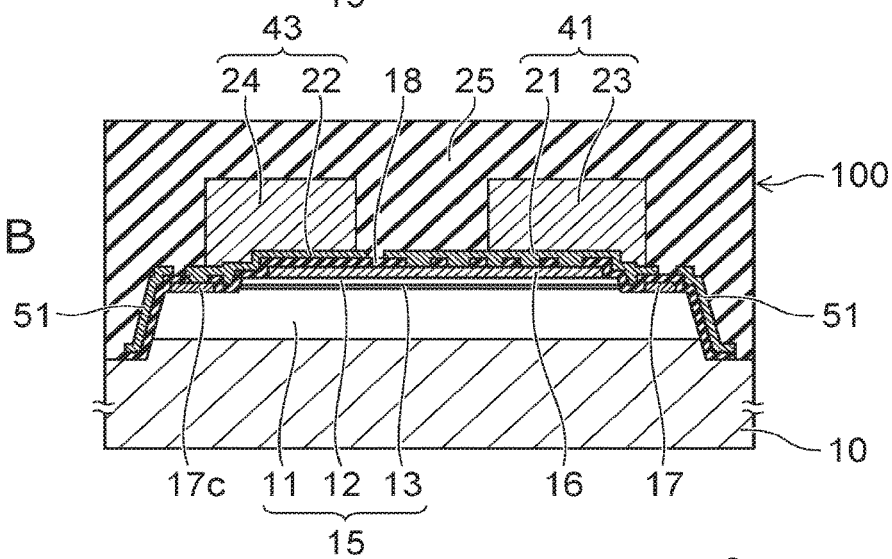
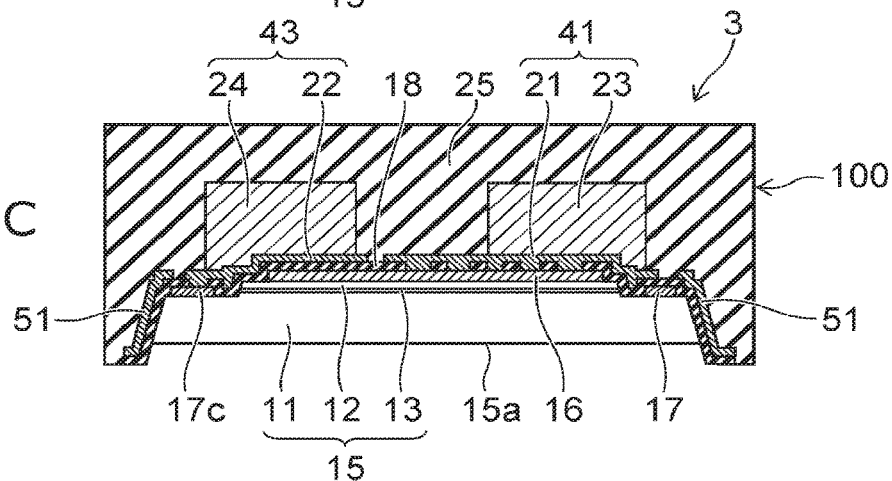

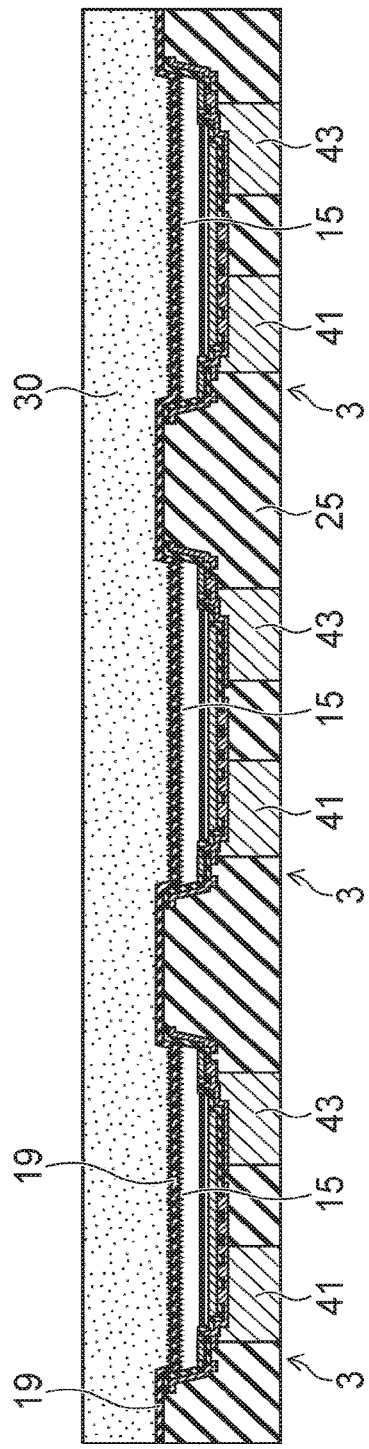
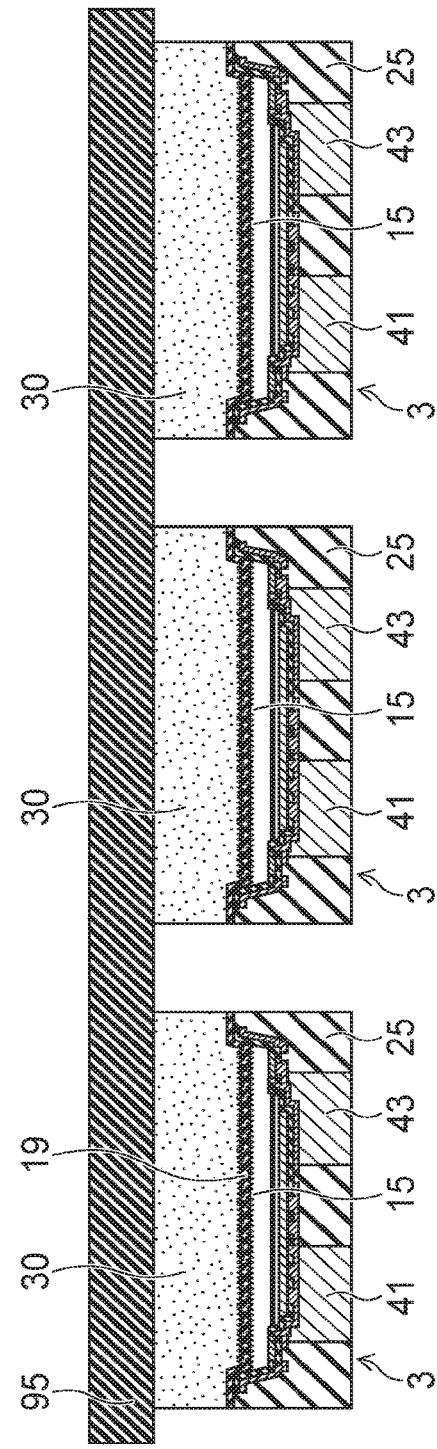
FIG. 7A
FIG. 7B

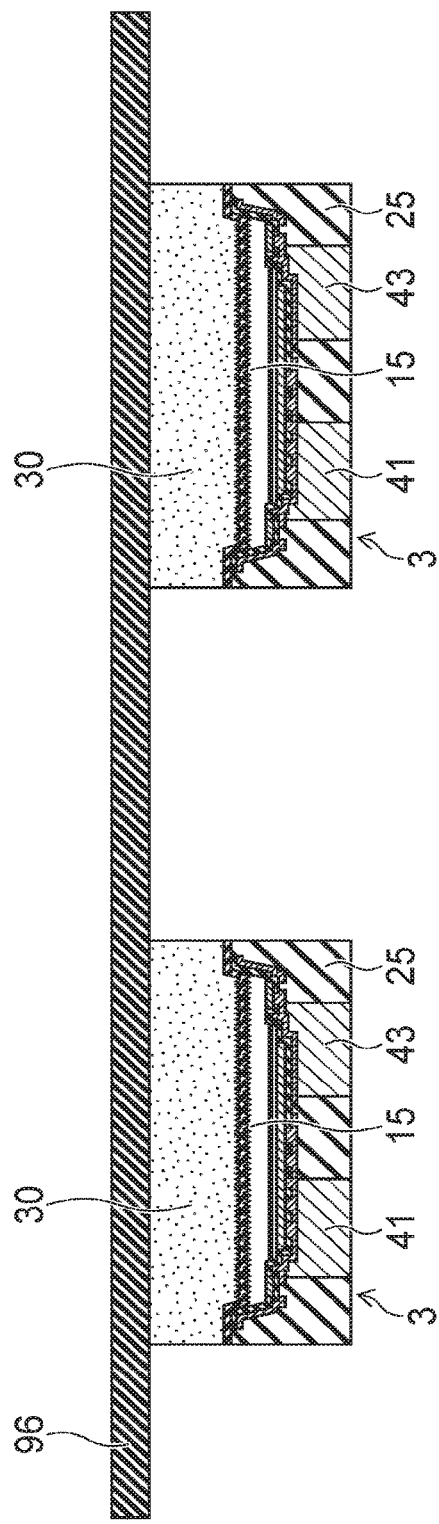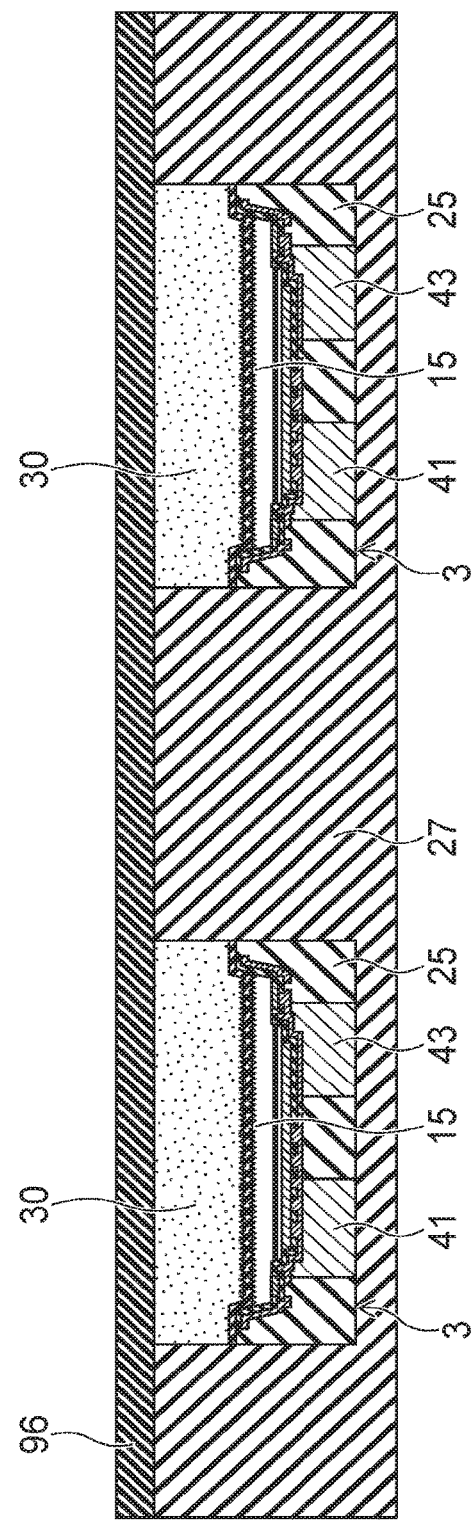

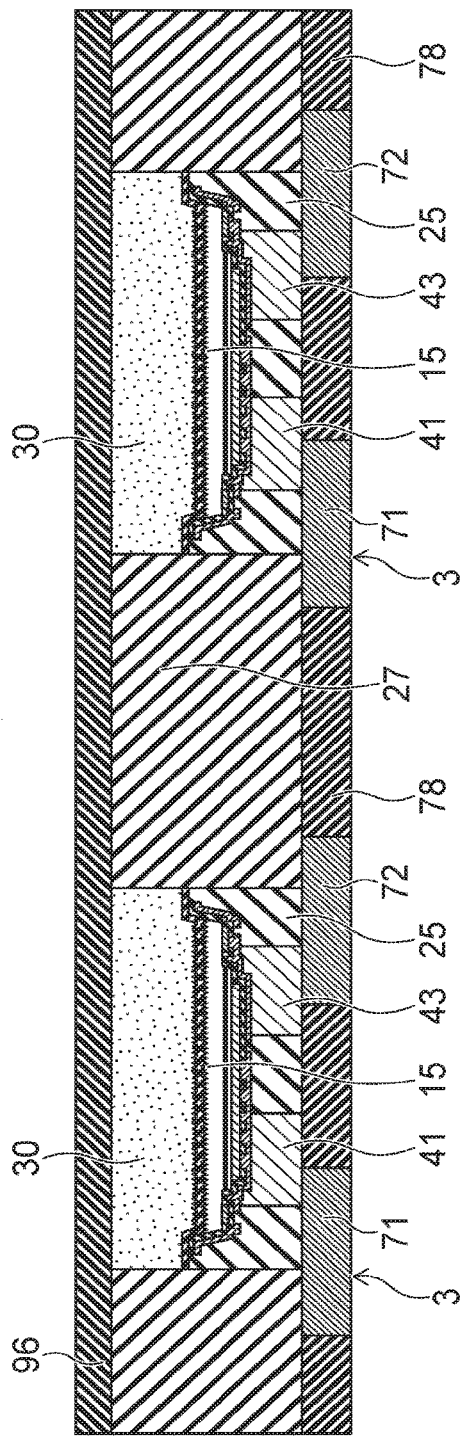
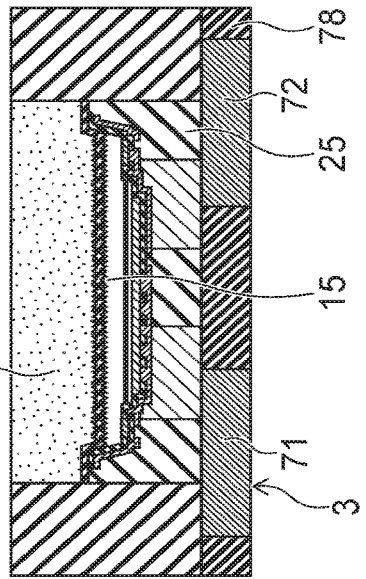
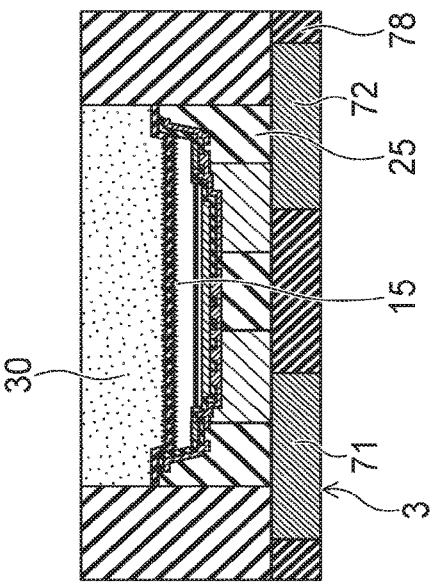
FIG. 9A
FIG. 9B

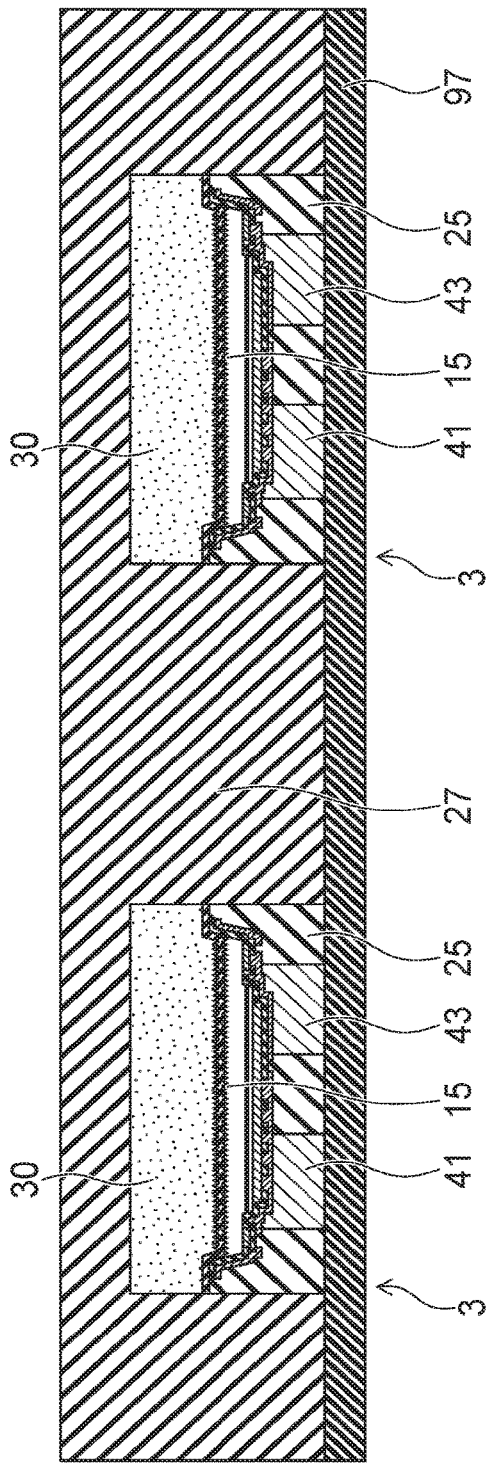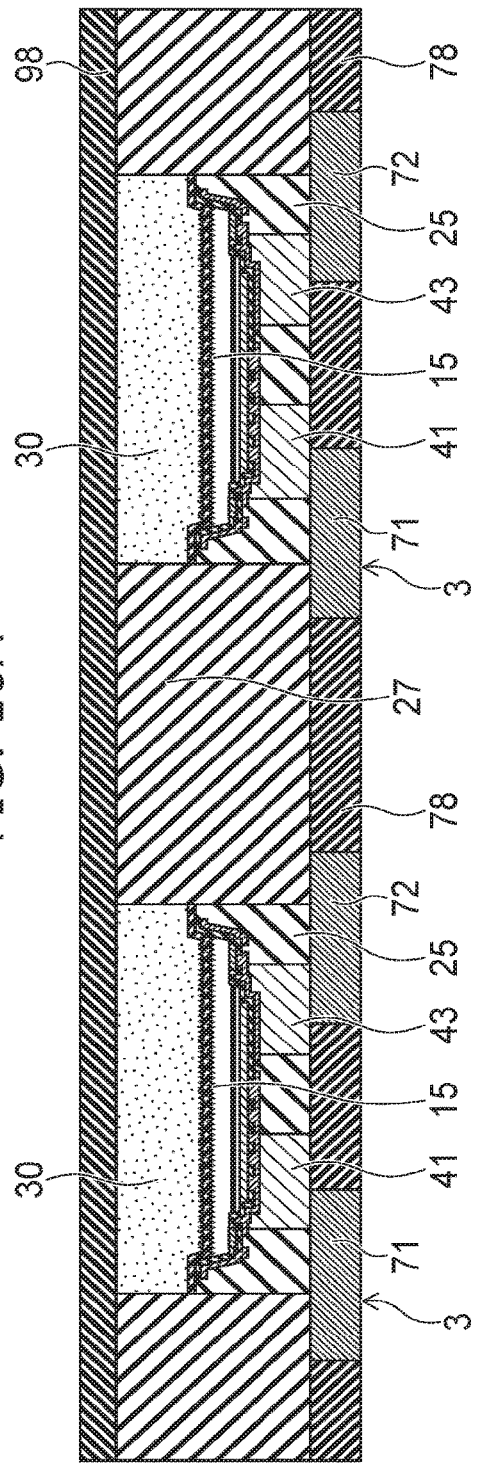

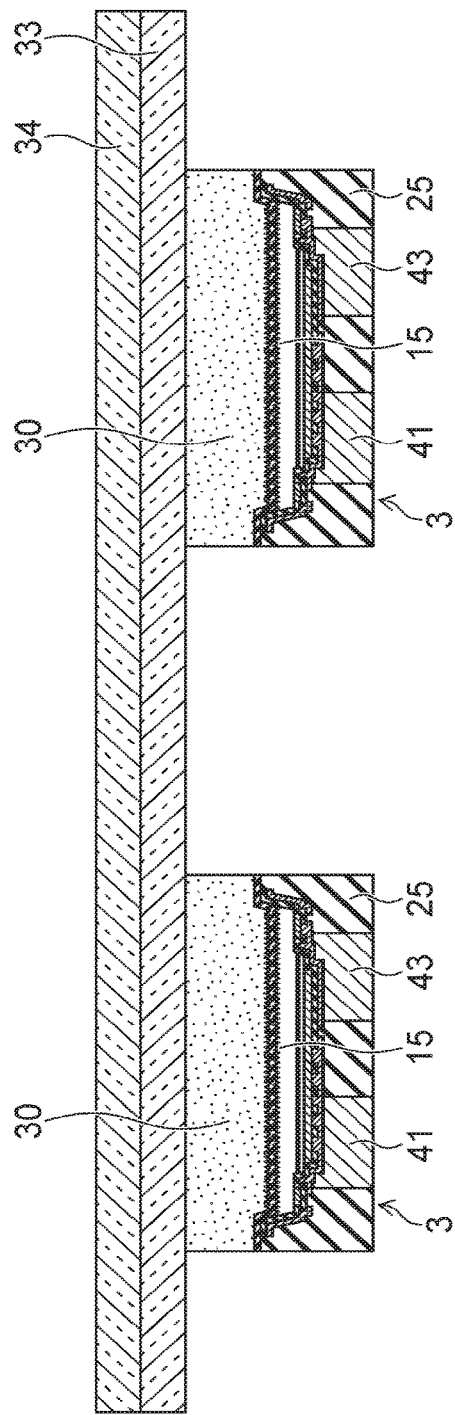
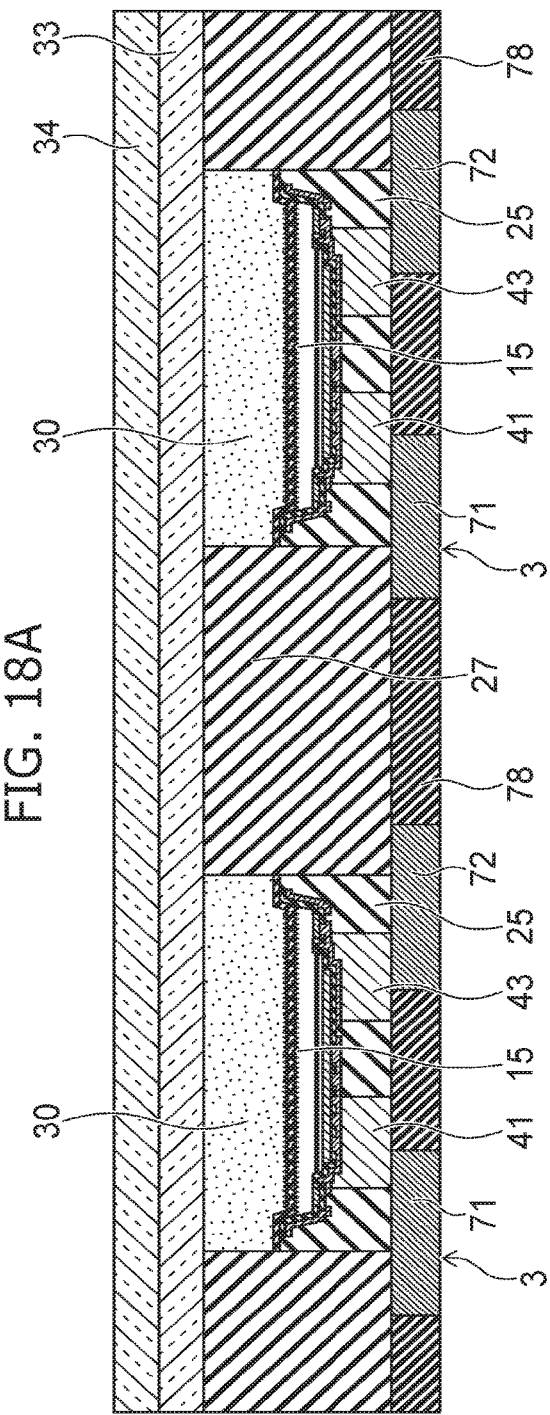
FIG. 18A
FIG. 18B

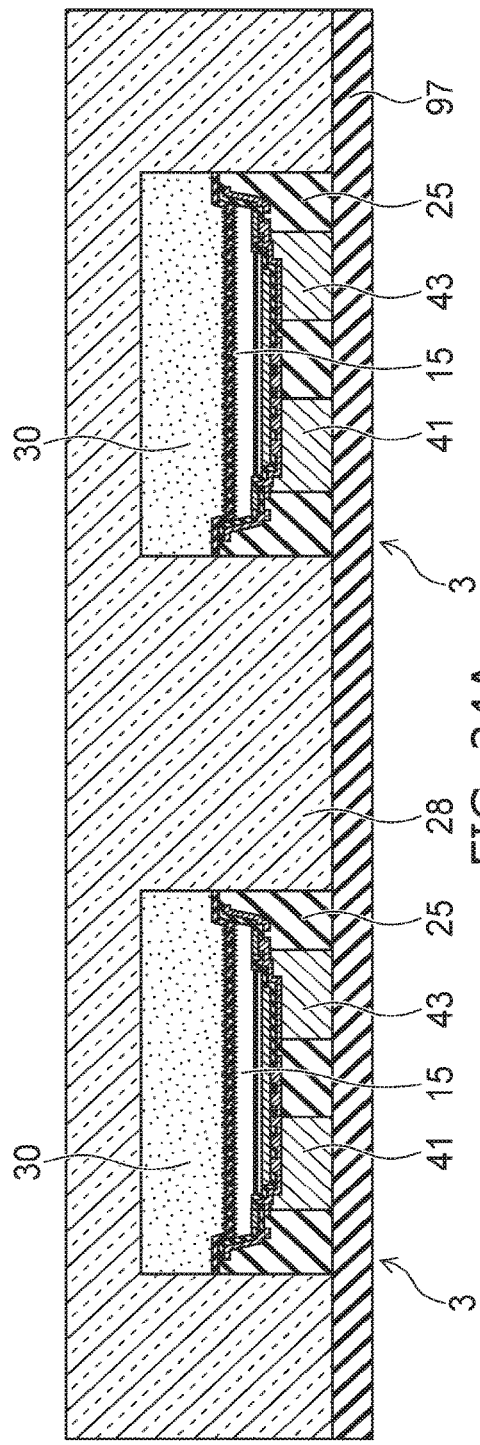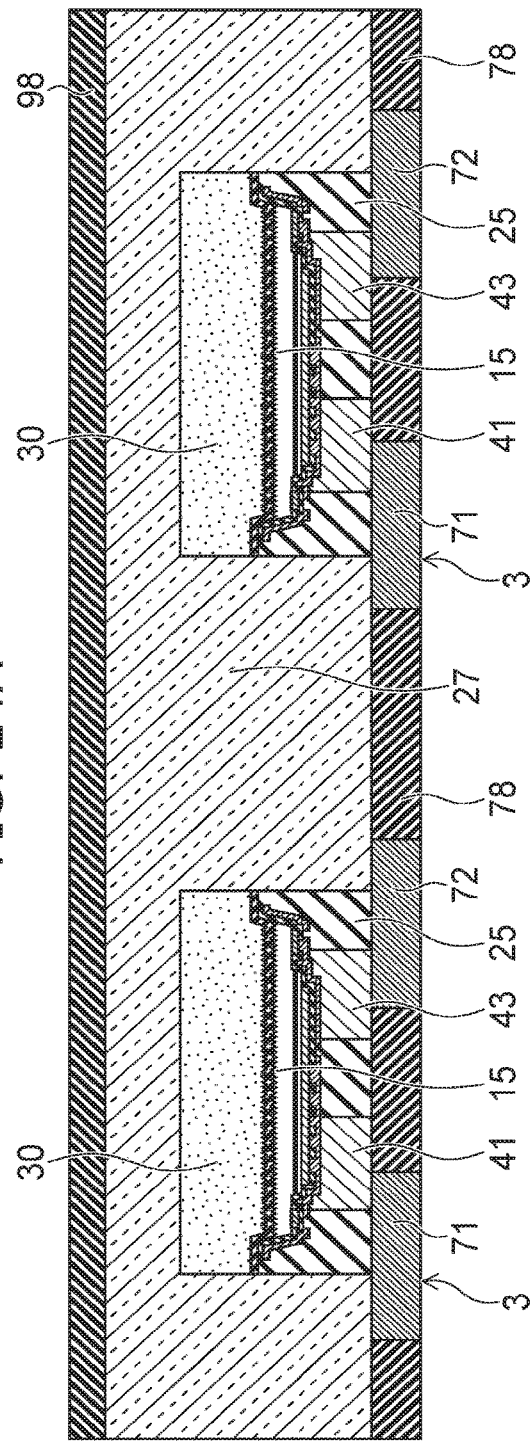

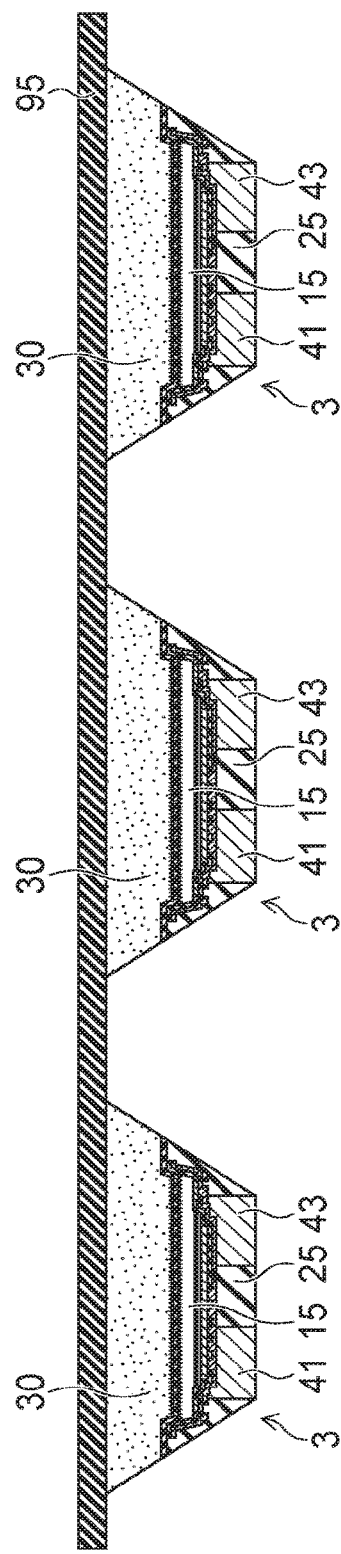
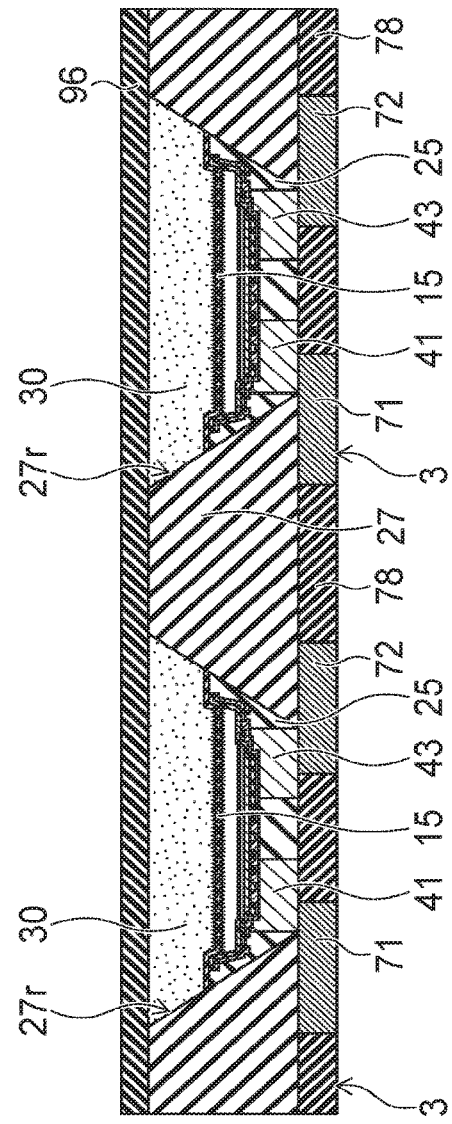
FIG. 27A
FIG. 27B

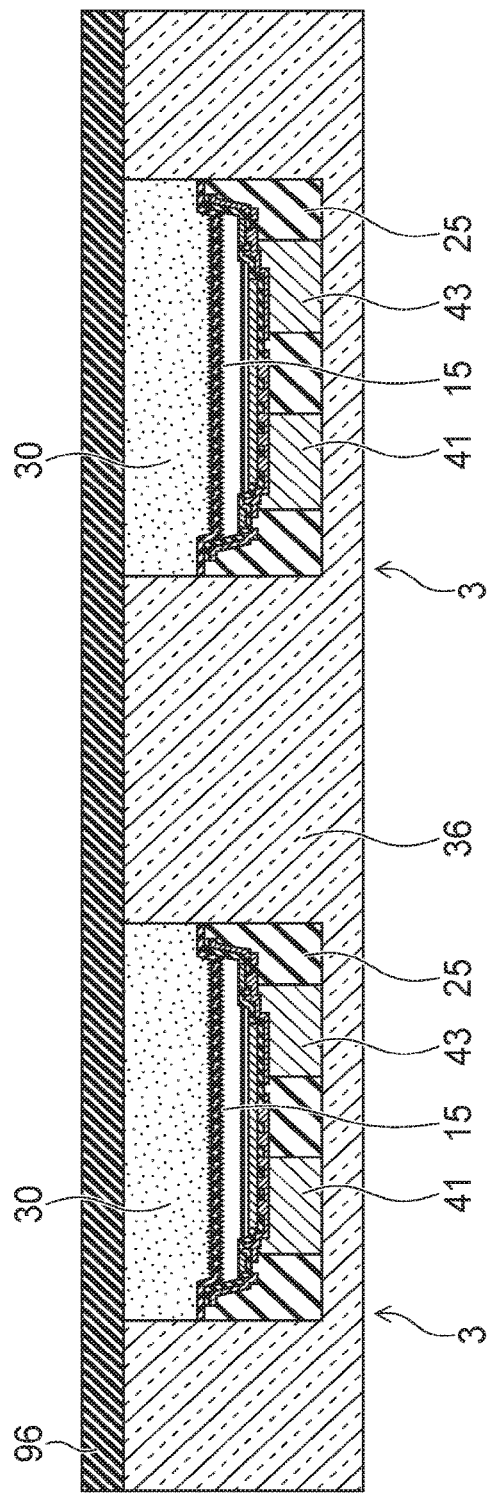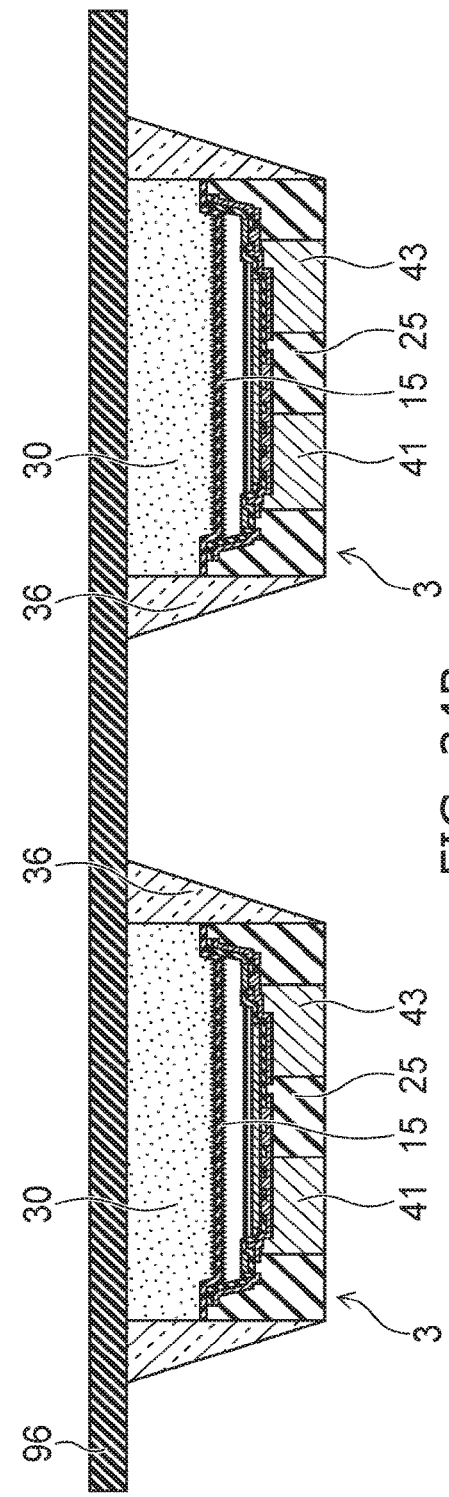

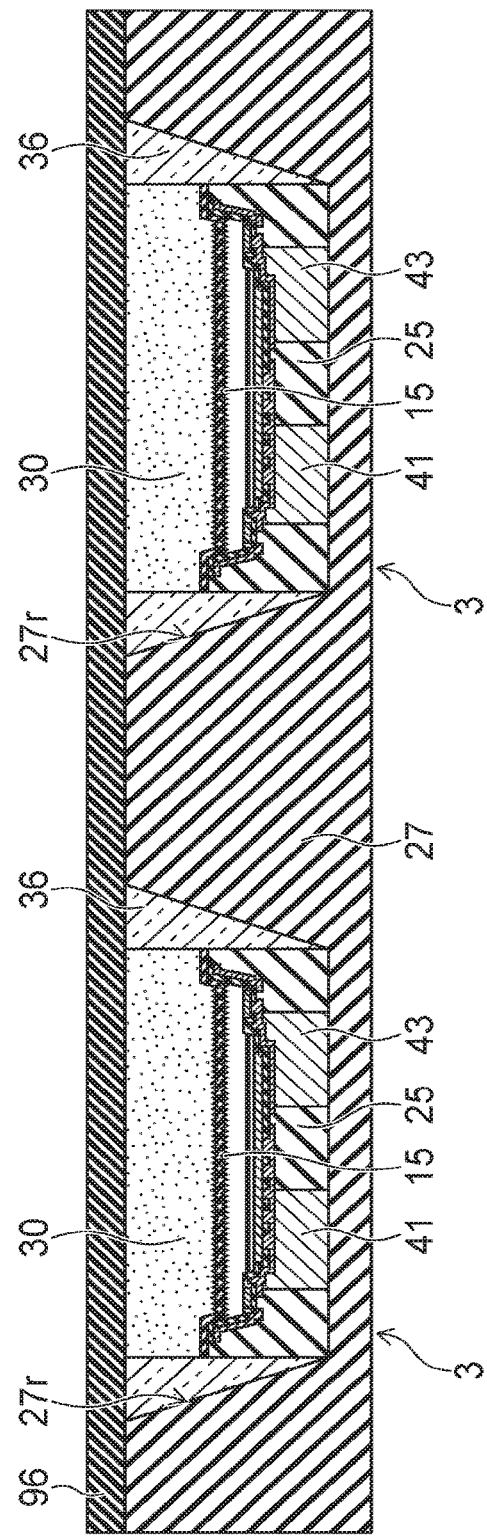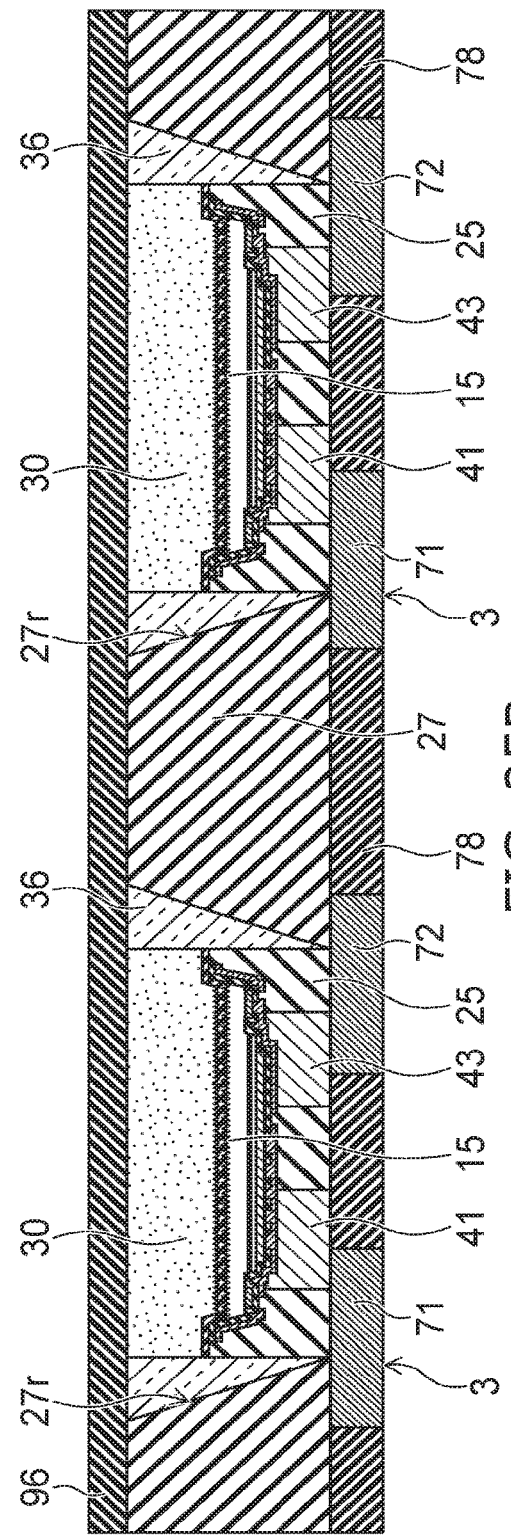

SEMICONDUCTOR LIGHT EMITTING DEVICE AND METHOD FOR MANUFACTURING SAME

CROSS-REFERENCE TO RELATED APPLICATION

This application is based upon and claims the benefit of priority from Japanese Patent Application No. 2015-179422, filed on Sep. 11, 2015; the entire contents of which are incorporated herein by reference.

FIELD

Embodiments described herein relate generally to a semiconductor light emitting device and a method for manufacturing same.

BACKGROUND

A semiconductor light emitting device that has a chip size package structure has been proposed in which a fluorescer layer and multiple fluorescers are provided on one surface side of a semiconductor layer including a light emitting layer; and interconnect layers, external terminals, and a resin layer are provided on one other surface (mounting surface) side.

Improvement of the optical characteristics may be problematic for the structure of the semiconductor light emitting device.

BRIEF DESCRIPTION OF THE DRAWINGS

FIG. 3A to FIG. 10B are schematic cross-sectional views showing a method for manufacturing the semiconductor light emitting device of the first embodiment;

FIG. 18A and FIG. 18B are schematic cross-sectional views showing a method for manufacturing the semiconductor light emitting device of the fifth embodiment;

FIG. 24A and FIG. 24B are schematic cross-sectional views showing a method for manufacturing the semiconductor light emitting device of the seventh embodiment;

FIG. 27A and FIG. 27B are schematic cross-sectional views showing a method for manufacturing the semiconductor light emitting device of the eighth embodiment;

FIG. 34A and FIG. 34B are schematic cross-sectional views showing a method for manufacturing the semiconductor light emitting device of the twelfth embodiment;

FIG. 35A and FIG. 35B are schematic cross-sectional views showing a method for manufacturing the semiconductor light emitting device of the twelfth embodiment;

DETAILED DESCRIPTION

Figure 1A:
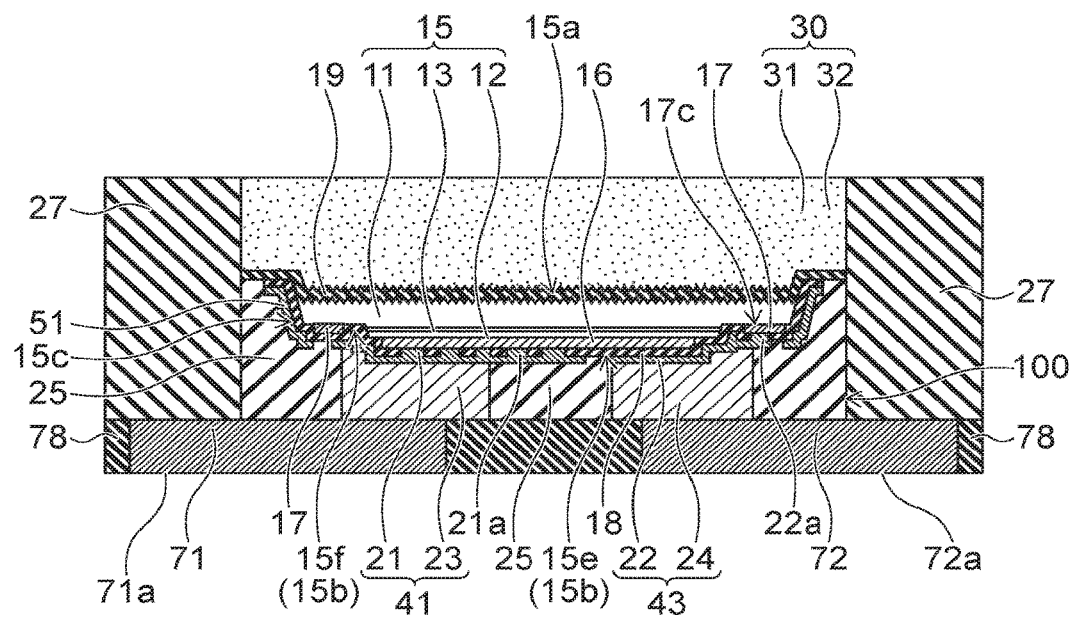
FIG. 1A is a schematic cross-sectional view of the semiconductor light emitting device of a first embodiment.

According to one embodiment, a semiconductor light-emitting device includes a semiconductor layer including a first semiconductor layer, a second semiconductor layer, a light emitting layer, a first surface, and a second surface; a p-side electrode; an n-side electrode; a first p-side pillar; a first n-side pillar; a first insulating layer; a fluorescer layer; a second insulating layer; a p-side interconnect; and an n-side interconnect. The light emitting layer is provided between the first semiconductor layer and the second semiconductor layer. The second surface opposes the first surface. The p-side electrode is electrically connected to the second semiconductor layer. The n-side electrode is electrically connected to the first semiconductor layer. The first p-side pillar is provided on the second surface side and electrically connected to the p-side electrode. The first n-side pillar is provided on the second surface side and electrically connected to the n-side electrode. The first insulating layer is provided between the first p-side pillar and the first n-side pillar, on an outer side of a side surface of the first p-side pillar, on an outer side of a side surface of the first n-side pillar, and on an outer side of a side surface of the semiconductor layer. The fluorescer layer is provided on the first surface of the first semiconductor layer and on the first insulating layer. The fluorescer layer includes a fluorescer. The second insulating layer is provided as one body in at least a portion of an outer side of a side surface of the first insulating layer and at least a portion of an outer side of a side surface of the fluorescer layer. The second insulating layer is made of a material different from the first insulating layer. The p-side interconnect is electrically connected to the first p-side pillar. The p-side interconnect extends across the first insulating layer and the second insulating layer onto the second insulating layer. The n-side interconnect is electrically connected to the first n-side pillar. The n-side interconnect extends across the first insulating layer and the second insulating layer onto the second insulating layer.

Embodiments are described below with reference to the drawings. Note that in the drawings, the same components are denoted by the same reference numerals and signs.

First Embodiment

An example of the configuration of a semiconductor light emitting device of an embodiment will now be described with reference to FIG. 1A to FIG. 2B.

Figure 1B:
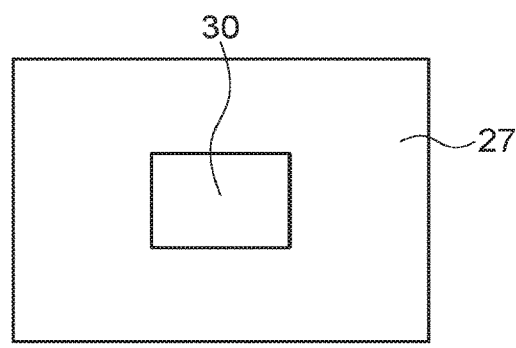
FIGS. 1B and 1C are schematic plan views of the semiconductor light emitting device of the first embodiment.

FIG. 1A is a schematic cross-sectional view of the semiconductor light emitting device of the embodiment; and FIG. 1B schematically shows the configuration as viewed from the upper surface of the semiconductor light emitting device.

Figure 2A:
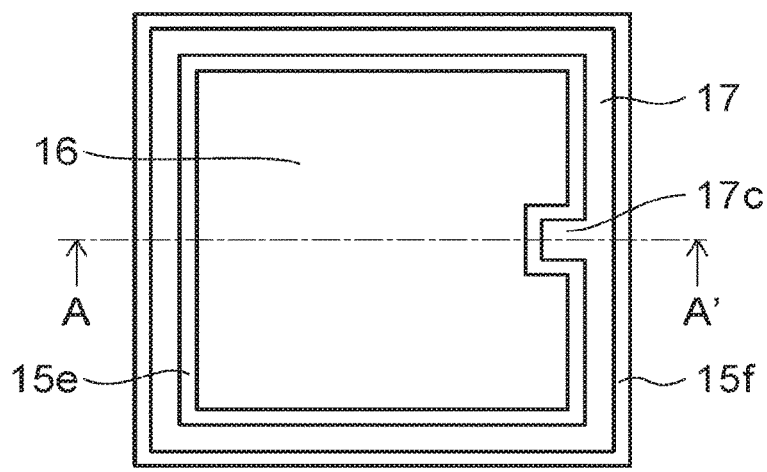
FIG. 2A is a schematic plan view showing an example of the planar layout of the semiconductor light emitting device of the first embodiment.

FIG. 2A is a schematic plan view showing an example of the planar layout of a p-side electrode 16 and an n-side electrode 17 of the semiconductor layer of the semiconductor light emitting device of the embodiment. The central portion of FIG. 1A corresponds to an A-A' cross section of FIG. 2A. FIG. 2A corresponds to a drawing as viewed from a second surface 15b side of a semiconductor layer 15 without first interconnect units 41 and 43, a resin layer 25, an insulating film 18, a reflective film 51, etc., of the semiconductor layer 15 periphery of FIG. 1A.

Figure 2B:
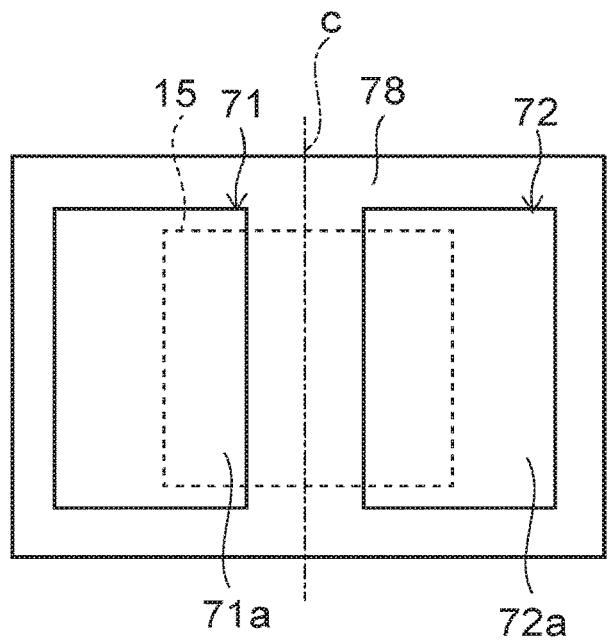
FIGS. 2B and 2C are schematic plan views showing an example of a mounting surface of the semiconductor light emitting device of the first embodiment.

FIG. 2B is a schematic plan view showing an example of a mounting surface of the semiconductor light emitting device of the embodiment (the lower surface of the semiconductor light emitting device of FIG. 1A).

As shown in FIG. 1A, the semiconductor light emitting device of the embodiment includes the semiconductor layer 15 that includes a light emitting layer 13. The semiconductor layer 15 has a first surface 15a, and the second surface 15b opposing the first surface 15a.

The second surface 15b of the semiconductor layer 15 includes a portion 15e (a light emitting region) that includes the light emitting layer 13, and a portion 15f (a non-light emitting region) that does not include the light emitting layer 13. The portion 15e that includes the light emitting layer 13 is the portion of the semiconductor layer 15 where the light emitting layer 13 is stacked. The portion 15f that does not include the light emitting layer 13 is the portion of the semiconductor layer 15 where the light emitting layer 13 is removed by etching, etc. The portion 15e that includes the light emitting layer 13 has a structure in which the light emitted by the light emitting layer 13 is extractable to the first surface 15a side.

On the second surface 15b, the p-side electrode 16 is provided as a first electrode on the portion 15e including the light emitting layer 13 and a p-type semiconductor layer (a second semiconductor layer) 12; and the n-side electrode 17 is provided as a second electrode on the portion 15f not including the light emitting layer 13 where an n-type semiconductor layer (a first semiconductor layer) 11 is exposed. It is desirable for the p-side electrode 16 and the n-side electrode 17 to be made of a metal that can reflect the light emitted by the light emitting layer 13; and it is desirable to be made of, for example, a metal having Ag, Al, or the like as a major component or a compound of such a metal.

In the example shown in FIG. 2A, the portion 15f that does not include the light emitting layer 13 surrounds the portion 15e including the light emitting layer 13; and the n-side electrode 17 surrounds the p-side electrode 16.

A current is supplied to the light emitting layer 13 via the p-side electrode 16 and the n-side electrode 17. Thereby, the light emitting layer 13 emits light. Then, the light that is radiated from the light emitting layer 13 is emitted outside the semiconductor light emitting device from the first surface 15a.

A support body 100 is provided on the second surface 15b of the semiconductor layer 15 as shown in FIG. 1A. The light emitting element that includes the semiconductor layer 15, the p-side electrode 16, and the n-side electrode 17 is supported by the support body 100 provided on the second surface 15b.

A fluorescer layer 30 (a wavelength conversion layer) that provides the desired optical characteristics to the light emitted by the semiconductor light emitting device is provided on the first surface 15a of the semiconductor layer 15. The fluorescer layer 30 includes multiple fluorescers 31 that have particle configurations and a binder 32. The fluorescers 31 are excited by the light emitted by the light emitting layer 13 and emit light of a wavelength different from the light emitted by the light emitting layer 13. In the description hereinbelow, "radiated light" refers to light including the light emitted from the light emitting layer 13 and the light emitted from the fluorescers 31.

The multiple fluorescers 31 are formed as one body with the binder 32. The binder 32 is light-transmissive. Here, "light-transmissive" refers to being transmissive to light including the light emitted from the light emitting layer 13 and the light emitted from the fluorescers 31. "Transmitting" is not limited to the transmittance being 100% and includes the case where a portion of the light is absorbed.

For example, an insulating layer 19 that is adhesive is provided between the fluorescer layer 30 and the semiconductor layer 15. The insulating layer 19 is light-transmissive.

The first surface 15a of the semiconductor layer 15 includes, for example, an unevenness; and the insulating layer 19 is provided along the unevenness of the first surface 15a. Therefore, the insulating layer 19 may include an unevenness. For example, the insulating layer 19 may not be provided. In such a case, the fluorescer layer 30 may contact the semiconductor layer 15.

The semiconductor layer 15 includes the first semiconductor layer 11, the second semiconductor layer 12, and the light emitting layer 13. The light emitting layer 13 is provided between the first semiconductor layer 11 and the second semiconductor layer 12. The first semiconductor layer 11 and the second semiconductor layer 12 include, for example, gallium nitride.

The first semiconductor layer 11 is an n-type semiconductor and includes, for example, a foundation buffer layer and an n-type GaN layer. The second semiconductor layer 12 is a p-type semiconductor and includes, for example, a p-type GaN layer. The light emitting layer 13 includes a material that emits blue light, violet light, bluish-violet light, ultraviolet light, etc. The light emission peak wavelength of the light emitting layer 13 is, for example, 360 to 480 nm.

The second surface 15b of the semiconductor layer 15 is patterned into an uneven configuration. The protrusion is the portion 15e that includes the light emitting layer 13; and the recess is the portion 15f that does not include the light emitting layer 13. The surface of the portion 15e including the light emitting layer 13 is the surface of the second semiconductor layer 12; and the p-side electrode 16 is provided on the surface of the second semiconductor layer 12.

The p-side electrode 16 contacts the second semiconductor layer 12. In other words, the p-side electrode 16 is electrically connected to the second semiconductor layer 12. The surface of the portion 15f not including the light emitting layer 13 is the surface of the first semiconductor layer 11; and the n-side electrode 17 is provided on the surface of the first semiconductor layer 11. The n-side electrode 17 contacts the first semiconductor layer 11. In other words, the n-side electrode 17 is electrically connected to the first semiconductor layer 11.

At the second surface 15b of the semiconductor layer 15, the surface area of the portion 15e including the light emitting layer 13 is greater than the surface area of the portion 15f not including the light emitting layer 13. Also, the surface area of the p-side electrode 16 provided on the surface of the portion 15e including the light emitting layer 13 is greater than the surface area of the n-side electrode 17 provided on the surface of the portion 15f not including the light emitting layer 13. Thereby, a wide light emitting surface is obtained; and the light output can be high.

As shown in FIG. 2A, the n-side electrode 17 includes, for example, four straight portions; and a contact portion 17c that protrudes in the width direction of the straight portion is provided in one straight portion of the four straight portions. A via 22a of a first n-side interconnect layer 22 is connected to the surface of the contact portion 17c as shown in FIG. 1A.

As shown in FIG. 1A, the second surface 15b of the semiconductor layer 15, the p-side electrode 16, and the n-side electrode 17 are covered with the insulating film 18. The insulating film 18 is, for example, an inorganic insulating film such as a silicon oxide film, etc. The insulating film 18 is provided also on the side surface of the light emitting layer 13 and the side surface of the second semiconductor layer 12 and covers the side surface of the light emitting layer 13 and the side surface of the semiconductor layer 12.

For example, the insulating film 18 is provided also on a side surface 15c of the semiconductor layer 15 continuing from the first surface 15a; and the insulating film 18 covers the side surface 15c.

The insulating film 18 is further provided in the chip outer circumferential portion adjacent to the side surface 15c of the semiconductor layer 15. The insulating film 18 that is provided in the chip outer circumferential portion extends in a direction away from the side surface 15c on the first surface 15a side.

A first p-side interconnect layer 21 (an intermediate interconnect layer) and a first n-side interconnect layer 22 (an intermediate interconnect layer) are provided to be separated from each other on the insulating film 18 of the second surface 15b side. The multiple first openings that communicate with the p-side electrode 16 and a second opening that communicates with the contact portion 17c of the n-side electrode 17 are made in the insulating film 18. The first openings may be one large opening.

The first p-side interconnect layer 21 is provided in the interiors of the first openings and on the insulating film 18. The first p-side interconnect layer 21 is electrically connected to the p-side electrode 16 by vias 21a provided inside the first openings.

The first n-side interconnect layer 22 is provided in the interior of the second opening and on the insulating film 18. The first n-side interconnect layer 22 is electrically connected to the n-side electrode 17 by the via 22a provided inside the second opening.

The first p-side interconnect layer 21 and the first n-side interconnect layer 22 spread over the insulating film 18 and occupy the greater part of the region of the second surface 15b. The first p-side interconnect layer 21 is connected to the p-side electrode 16 by the multiple vias 21a.

For example, a reflective film 51 (a metal film) is provided on the side surface 15c of the semiconductor layer 15 with the insulating film 18 interposed. The reflective film 51 covers the side surface 15c of the semiconductor layer 15. The reflective film 51 does not contact the side surface 15c and is separated from the semiconductor layer 15. The reflective film 51 is light-reflective. Here, "light-reflective" refers to being reflective to light including the light emitted from the light emitting layer 13 and the light emitted from the fluorescers 31, e.g., the reflectance to the light including the light emitted from the light emitting layer 13 and the light emitted from the fluorescers 31 being 50% or more.

The reflective film 51, the first p-side interconnect layer 21, and the first n-side interconnect layer 22 are formed simultaneously by, for example, plating and are formed as one body as, for example, a copper film. For example, the reflective film 51 is separated from the first p-side interconnect layer 21 and the first n-side interconnect layer 22. For example, the reflective film 51 may be provided as one body with at least one of the first p-side interconnect layer 21 or the first n-side interconnect layer 22.

The reflective film 51 may be formed of a metal film at the chip outer circumferential portion adjacent to the side surface 15c of the semiconductor layer 15 without forming the plating film (the copper film) on the metal film. The reflective film 51 has a high reflectance for the light radiated by the light emitting layer 13 and the light radiated by the fluorescers 31 by at least including an aluminum film on the surface on the semiconductor layer 15 side.

For example, the foundation metal film (the aluminum film) may remain under the first p-side interconnect layer 21 and the first n-side interconnect layer 22. In other words, the aluminum film is provided in the region of the greater part of the second surface 15b. Thereby, it is possible to increase the amount of light traveling toward the fluorescer layer 30 side.

A p-side pillar 23 (a first p-side pillar) is provided on the surface of the first p-side interconnect layer 21 on the side opposite to the surface contacting the p-side electrode 16. The first p-side interconnect unit 41 is formed of the first p-side interconnect layer 21 and the p-side pillar 23. The p-side pillar 23 is electrically connected to the p-side electrode 16 and the first p-side interconnect layer 21. The first p-side interconnect layer 21 is provided between the p-side electrode 16 and the p-side pillar 23 and is connected to the p-side electrode 16 and the p-side pillar 23.

An n-side pillar 24 (a first n-side pillar) is provided on the surface of the first n-side interconnect layer 22 on the side opposite to the surface contacting the n-side electrode 17. The first n-side interconnect unit 43 is formed of the first n-side interconnect layer 22 and the n-side pillar 24. The n-side pillar 24 is electrically connected to the n-side electrode 17 and the first n-side interconnect layer 22. The first n-side interconnect layer 22 is provided between the n-side electrode 17 and the n-side pillar 24 and is connected to the n-side electrode 17 and the n-side pillar 24.

The resin layer 25 (the first insulating layer) is provided between the first p-side interconnect unit 41 and the first n-side interconnect unit 43. The resin layer 25 contacts the side surface of the p-side pillar 23 and the side surface of the n-side pillar 24 and is provided between the p-side pillar 23 and the n-side pillar 24. In other words, the p-side pillar 23 is separated from the n-side pillar 24 with the resin layer 25 interposed. The resin layer 25 is filled between the p-side pillar 23 and the n-side pillar 24.

Also, the resin layer 25 is provided between the first p-side interconnect layer 21 and the first n-side interconnect layer 22, between the first p-side interconnect layer 21 and the reflective film 51, and between the first n-side interconnect layer 22 and the reflective film 51.

The resin layer 25 is provided on the outer side of the side surface of the p-side electrode 16 and the outer side of the side surface of the n-side electrode 17. The resin layer 25 is provided on the outer side of the side surface 15c of the semiconductor layer 15. Between the resin layer 25 and the side surface of the p-side electrode 16, between the resin layer 25 and the side surface of the n-side electrode 17, and between the resin layer 25 and the side surface 15c of the semiconductor layer 15, the insulating film 18 is provided; and, for example, the insulating film 18 and the reflective film 51 may be provided.

The resin layer 25 is provided at the periphery of the p-side pillar 23 and the periphery of the n-side pillar 24 and covers the side surface of the p-side pillar 23 and the side surface of the n-side pillar 24. The resin layer 25 also is provided in the chip outer circumferential portion adjacent to the side surface 15c of the semiconductor layer 15 and covers the reflective film 51. The resin layer 25 is provided as one body on the side surface of the p-side pillar 23, the side surface of the n-side pillar 24, and the outer side of the side surface 15c of the semiconductor layer 15.

The resin layer 25 includes, for example, a material that is light-shielding. Here, "light-shielding" refers to being light-shielding to light including the light emitted from the light emitting layer 13 and the light emitted from the fluorescers 31.

The fluorescer layer 30 is provided on the resin layer 25 provided in the chip outer circumferential portion. In other words, the fluorescer layer 30 is provided as one body on the first surface 15a of the semiconductor layer 15 and on the resin layer 25. The fluorescer layer 30 is separated, with the semiconductor layer 15 interposed, from the p-side electrode 16 and the n-side electrode 17.

The lower surface of the p-side pillar 23 and the lower surface of the n-side pillar 24 are arranged to be separated from each other in the same plane as the lower surface of the resin layer 25. The spacing between the p-side pillar 23 and the n-side pillar 24 is wider than the spacing between the first p-side interconnect layer 21 and the first n-side interconnect layer 22 on the insulating film 18.

The spacing between the first p-side interconnect layer 21 and the first n-side interconnect layer 22 can be set to be narrow to the limit of the process. Therefore, the surface area of the first p-side interconnect layer 21 and the contact surface area between the first p-side interconnect layer 21 and the p-side pillar 23 can be enlarged. Thereby, the dissipation of the heat of the light emitting layer 13 can be promoted.

The surface area of the first p-side interconnect layer 21 contacting the p-side electrode 16 by the multiple vias 21a is greater than the surface area of the first n-side interconnect layer 22 contacting the n-side electrode 17 by the via 22a. Thereby, the distribution of the current flowing in the light emitting layer 13 can be uniform.

The surface area of the first n-side interconnect layer 22 spreading on the insulating film 18 is greater than the surface area of the n-side electrode 17. Also, the surface area of the lower surface of the n-side pillar 24 provided on the first n-side interconnect layer 22 can be wider than the n-side electrode 17.

Thereby, it is possible to set the surface area of the n-side electrode 17 to be small while ensuring a surface area of the lower surface of the n-side pillar 24 that is sufficient for forming an n-side interconnect 72 described below. In other words, it is possible to improve the light output by reducing the surface area of the portion 15f of the semiconductor layer 15 not including the light emitting layer 13 and by increasing the surface area of the portion 15e including the light emitting layer 13.

The first semiconductor layer 11 is electrically connected to the n-side pillar 24 via the n-side electrode 17 and the first n-side interconnect layer 22. The second semiconductor layer 12 is electrically connected to the p-side pillar 23 via the p-side electrode 16 and the first p-side interconnect layer 21.

The thickness of the p-side pillar 23 is thicker than the thickness of the first p-side interconnect layer 21. The thickness of the n-side pillar 24 is thicker than the thickness of the first n-side interconnect layer 22. The thicknesses of the p-side pillar 23, the n-side pillar 24, and the resin layer 25 are thicker than the semiconductor layer 15. Here, "thickness" refers to the direction from the semiconductor layer 15 toward the p-side pillar 23 and the n-side pillar 24.

The aspect ratios (the ratios of the thicknesses to the planar sizes) of the p-side pillar 23 and the n-side pillar 24 (the metal pillars) may be equal to, greater than, or less than 1. In other words, the metal pillars 23 and 24 may be thicker or thinner than their planar sizes.

The thickness of the support body 100 including the first p-side interconnect layer 21, the first n-side interconnect layer 22, the p-side pillar 23, the n-side pillar 24, and the resin layer 25 is thicker than the thickness of the light emitting element (the LED chip) including the semiconductor layer 15, the p-side electrode 16, and the n-side electrode 17.

An insulating member 27 (a second insulating layer) is provided in the region outside the chip further outward than the side surface of the resin layer 25 surrounding the p-side pillar 23 and the n-side pillar 24. The insulating member 27 is provided as one body on the outer side of the side surface of the resin layer 25 and the outer side of the side surface of the fluorescer layer 30. The insulating member 27 covers the side surface of the resin layer 25 and the side surface of the fluorescer layer 30 as shown in FIG. 1B. The upper surface of the insulating member 27 is in substantially the same plane as the upper surface of the fluorescer layer 30. The insulating member 27 is made of a material that is different from the resin layer 25 and is provided as a separate body from the resin layer 25.

Figure 1C:
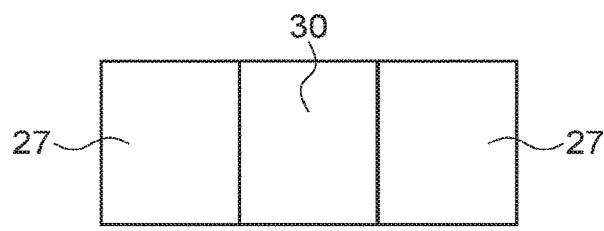

The insulating member 27 may cover the entire side surface of the resin layer 25 and the entire side surface of the fluorescer layer 30 or may partially cover only two opposing sides as shown in FIG. 1C.

At least a portion of the insulating member 27 contacts the side surface of the resin layer 25 and the side surface of the fluorescer layer 30; and the insulating member 27 includes a reflective material to reduce absorption of the light emitted by the light emitting layer 13 and the light emitted by the fluorescers 31. For example, fine particles of $TiO_2$, ZnO, etc., may be used as the reflective material. The resin layer 25 is separated from the side surface of the fluorescer layer 30. The obstruction of the light extraction by the insulating member 27 can be minimized by providing the upper surface of the fluorescer layer 30 so that at least the end portion is equal to or higher than the upper surface of the insulating member 27 in a direction (a first direction) from the second surface 15b (the lower surface) of the semiconductor layer 15 toward the first surface 15a (the upper surface). The upper surface of the resin layer 25 is lower than the upper surface of the fluorescer layer 30 in the first direction.

A p-side interconnect 71 and the n-side interconnect 72 are provided on the second surface 15b side of the semiconductor layer 15. The p-side interconnect 71 is electrically connected to the p-side pillar 23; the n-side interconnect 72 is electrically connected to the n-side pillar 24; and the p-side interconnect 71 and the n-side interconnect 72 extend across the boundary between the resin layer 25 and the insulating member 27 to a region overlapping the insulating member 27 (a region where there is no semiconductor layer 15).

In other words, the p-side interconnect 71 is provided as one body under the resin layer 25, under the insulating member 27, and under the p-side pillar 23. The n-side interconnect 72 is provided as one body under the resin layer 25, under the insulating member 27, and under the n-side pillar 24. Here, "overlapping" refers to being provided so that configurations overlap as viewed from the first direction; and it is arbitrary whether or not the configurations are separated or in contact.

The p-side interconnect 71 is provided on the end portion (the surface) of the p-side pillar 23 on the side opposite to the surface contacting the first p-side interconnect layer 21. The portion of the p-side interconnect 71 extending into the region outside the chip is supported by the insulating member 27.

The n-side interconnect 72 is provided on the end portion (the surface) of the n-side pillar 24 on the side opposite to the surface contacting the first n-side interconnect layer 22. The portion of the n-side interconnect 72 extending into the region outside the chip is supported by the insulating member 27.

An insulating film 78 is provided on the side surface of the p-side interconnect 71 and the side surface of the n-side interconnect 72. The insulating film 78 is, for example, an inorganic film such as a silicon oxide film, etc., or an organic film such as an epoxy resin, a polyimide resin, etc.

The insulating film 78 contacts the side surface of the p-side interconnect 71 and the side surface of the n-side interconnect 72 and is filled between the p-side interconnect 71 and the n-side interconnect 72.

The insulating film 78 strengthens the mechanical strength of the p-side interconnect 71 and the n-side interconnect 72. Also, the insulating film 78 functions as a solder resist that prevents spreading of the solder by wetting when mounting.

The lower surface of the p-side interconnect 71 is exposed from the insulating film 78 and functions as a p-side mounting surface 71a (a p-side external terminal) that is connectable to an external circuit such as a mounting substrate, etc. The lower surface of the n-side interconnect 72 is exposed from the insulating film 78 and functions as an n-side mounting surface 72a (an n-side external terminal) that is connectable to an external circuit such as a mounting substrate, etc. For example, the p-side mounting surface 71a and the n-side mounting surface 72a are bonded to a land pattern of a mounting substrate via solder or an electrically conductive bonding agent.

Here, it is desirable for the p-side mounting surface 71a and the n-side mounting surface 72a to protrude from the surface of the insulating film 78. Thereby, the configuration of the solder when mounting is stabilized; and the reliability of the mounting can be increased.

Figure 2C:
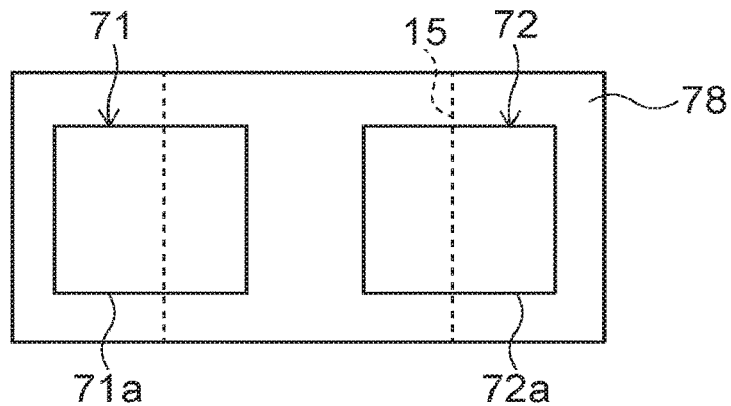

FIG. 2B and FIG. 2C show examples of the planar layouts of the p-side mounting surface 71a and the n-side mounting surface 72a; FIG. 2B is the case where the insulating member 27 covers the entire side surface of the resin layer 25 and the entire side surface of the fluorescer layer 30; and FIG. 1C is the case where the insulating member 27 covers only the two sides opposing the side surface of the resin layer 25 and the side surface of the fluorescer layer 30.

The p-side mounting surface 71a and the n-side mounting surface 72a of FIG. 2B are arranged symmetrically with respect to a center line c that divides the planar region of the semiconductor layer 15 into, for example, two equal parts; and the surface area of the p-side mounting surface 71a is about the same as the surface area of the n-side mounting surface 72a. The configuration may be asymmetric to increase the share of the thermal conduction characteristics and the stress relief of one of the mounting surfaces.

The spacing between the p-side mounting surface 71a and the n-side mounting surface 72a is set to a spacing such that the solder does not bridge between the p-side mounting surface 71a and the n-side mounting surface 72a when mounting and is, for example, 200 μm or more. Thereby, the reliability of the mounting can be increased.

The semiconductor layer 15 is formed on the substrate using epitaxial growth. The substrate is removed in the manufacturing process; and the semiconductor layer 15 does not include the substrate on the first surface 15a. Therefore, the semiconductor light emitting device is thinner due to the removal of the substrate.

Here, in the case where there is a transparent substrate of sapphire, etc., on the first surface 15a, light leaks to the outside from the side surface of the substrate without the light being incident on the fluorescer layer 30. In other words, the light of the light emitting layer 13 that has a strong tint leaks from the side surface of the substrate which may cause color breakup and uneven color such as a phenomenon in which a ring of blue light is viewed at the outer edge side when the fluorescer layer 30 is viewed from the upper surface, etc.

Conversely, according to the embodiment, there is no substrate between the first surface 15a and the fluorescer layer 30; therefore, color breakup and uneven color due to the light of the light emitting layer 13 that has a strong tint leaking from the substrate side surface can be prevented.

Further, a micro unevenness can be formed in the first surface 15a of the semiconductor layer 15 by removing the substrate. For example, the micro unevenness is formed by performing wet etching of the first surface 15a using an alkaline solution. Thereby, the total internal reflection component at the first surface 15a is reduced; and the light extraction efficiency can be increased.

After the substrate is removed, for example, the fluorescer layer 30 is formed on the first surface 15a with the insulating layer 19 interposed. The insulating layer 19 functions as an adhesion layer that increases the adhesion between the semiconductor layer 15 and the fluorescer layer 30 and is, for example, a silicon oxide film or a silicon nitride film.

The fluorescer layer 30 has a structure in which the multiple fluorescers 31 having particle configurations are dispersed in the binder 32. The binder 32 may include, for example, a silicone resin.

The fluorescer layer 30 is formed also on the chip outer circumferential portion on the outer side of the side surface 15c of the semiconductor layer 15. Accordingly, the planar size of the fluorescer layer 30 is larger than the planar size of the semiconductor layer 15. At the chip outer circumferential portion, the fluorescer layer 30 is provided on the insulating film 18 (e.g., the silicon oxide film) and on the resin layer 25. The "planar size" described above refers to the planar surface area when viewed from the first direction.

The semiconductor layer 15 is supported, with the support body 100 interposed, by the compound body of the p-side interconnect 71, the n-side interconnect 72, and the insulating film 78.

For example, copper, gold, nickel, silver, etc., may be used as the materials of the first p-side interconnect unit 41, the first n-side interconnect unit 43, the p-side interconnect 71, and the n-side interconnect 72. Among these, good thermal conductivity, high migration resistance, and adhesion with insulating materials can be improved when copper is used.

According to the embodiment, the reflective film 51 is provided on the side surface 15c of the semiconductor layer 15 with the insulating film 18 interposed. The light that travels from the light emitting layer 13 toward the side surface 15c of the semiconductor layer 15 is reflected by the reflective film 51 and does not leak to the outside. Therefore, color breakup and uneven color due to the light leakage from the side surface side of the semiconductor light emitting device can be prevented in addition to the feature of having no substrate on the first surface 15a.

For example, the reflective film 51 is separated from the first p-side interconnect unit 41 and the first n-side interconnect unit 43. In such a case, the stress that is applied to the p-side pillar 23 and the n-side pillar 24 when mounting is not transmitted to the reflective film 51. Accordingly, peeling of the reflective film 51 can be suppressed. Also, the stress that is applied to the side surface 15c side of the semiconductor layer 15 can be suppressed.

For example, the reflective film 51 may be provided as one body with the first p-side interconnect unit 41 and the first n-side interconnect unit 43. Thereby, a heat dissipation path is formed; and the heat dissipation of the semiconductor layer 15 improves. For example, a portion of the reflective film 51 is formed as one body with the first p-side interconnect unit 41; the remainder of the reflective film 51 is formed as one body with the first n-side interconnect unit 43; and these portions are insulated from each other.

For example, the reflective film 51 may be provided as one body with either one of the first p-side interconnect unit 41 or the first n-side interconnect unit 43. In such a case, the reflective film 51 may be formed to cover the entire circumference of the side surface of the semiconductor layer 15 in a ring configuration (an O-shape). Thereby, it is possible to suppress the light leakage further.

For example, the reflective film 51 may be separated from the first p-side interconnect unit 41 and the first n-side interconnect unit 43. In such a case, the reflective film 51 may be formed to cover the entire circumference of the side surface of the semiconductor layer 15 in a ring configuration (an O-shape). Thereby, it is possible to suppress the light leakage further.

The side surface 15c of the semiconductor layer 15 where the reflective film 51 is provided is tilted with respect to the first surface 15a (the flat portion of the first surface 15a). Also, the side surface 15c is tilted with respect to the second surface 15b. Accordingly, the reflective surface that is provided on the side surface is tilted with respect to the first surface 15a and the second surface 15b. The extension line of the side surface 15c is tilted to form an obtuse angle with the interface between the fluorescer layer 30 and the insulating layer 19.

The insulating film 18 that is provided between the reflective film 51 and the side surface 15c of the semiconductor layer 15 prevents the diffusion of the metal included in the reflective film 51 into the semiconductor layer 15. Thereby, for example, metal contamination of the GaN of the semiconductor layer 15 can be prevented; and degradation of the semiconductor layer 15 can be prevented.

The insulating film 18 that is provided between the reflective film 51 and the fluorescer layer 30 and between the resin layer 25 and the fluorescer layer 30 increases the adhesion between the reflective film 51 and the fluorescer layer 30 and the adhesion between the resin layer 25 and the fluorescer layer 30.

The insulating film 18 is, for example, an inorganic insulating film such as a silicon oxide film, a silicon nitride film, etc. In other words, the first surface 15a and the second surface 15b of the semiconductor layer 15, the side surface 15c of the first semiconductor layer 11, the side surface of the second semiconductor layer 12, and the side surface of the light emitting layer 13 are covered with an inorganic insulating film. The inorganic insulating film surrounds the semiconductor layer and shields the semiconductor layer 15 from metals, moisture, etc.

For example, in the thermal cycle when mounting the semiconductor light emitting device, the p-side mounting surface 71a and the n-side mounting surface 72a are bonded to the lands of the mounting substrate; and stress caused by the solder, etc., is applied to the semiconductor layer 15. The p-side interconnect 71, the n-side interconnect 72, and the insulating film 78 can absorb and relax the stress recited above by forming the p-side interconnect 71, the n-side interconnect 72, and the insulating film 78 to have appropriate thicknesses (heights). In particular, the stress relieving effect can be increased by using the insulating film 78 that is more flexible than the semiconductor layer 15 as a portion of the support body on the mounting surface side.

The interconnect units 41 and 43 and the interconnects 71 and 72 include, for example, copper which has a high thermal conductivity as major components; and high thermal conductivity bodies are spread over a wide surface area in regions overlapping the light emitting layer 13. The heat that is generated by the light emitting layer 13 is dissipated to the mounting substrate by a short path formed below the chip via the interconnect units 41 and 43 and the interconnects 71 and 72.

According to the embodiment, the mounting surfaces 71a and 72a are extended to the region outside the chip as well. Accordingly, the planar size of the solder bonded to the mounting surfaces 71*a* and 72*a* can be large; and the heat dissipation to the mounting substrate via the solder can be improved.

The light that is radiated from the light emitting layer 13 on the first surface 15*a* is incident on the fluorescer layer 30; a portion of the light excites the fluorescers 31; and, for example, white light is obtained as a mixed light of the light of the light emitting layer 13 and the light of the fluorescers 31.

The light that is radiated from the light emitting layer 13 to the mounting surface side is reflected by the p-side electrode 16 and the n-side electrode 17 toward the fluorescer layer 30 side above the p-side electrode 16 and the n-side electrode 17.

The fluorescer layer 30 is formed on the first surface 15*a* of the semiconductor layer 15 by a wafer level process; and the planar size of the fluorescer layer 30 is substantially the same as the planar size of the semiconductor layer 15 or slightly larger than the planar size of the semiconductor layer 15.

The fluorescer layer 30 is not formed to extend around to the side surface of the semiconductor layer 15 and the mounting surface side. In other words, the fluorescer layer 30 is not formed unnecessarily on the chip side surface side and the mounting surface side where the light is not extracted to the outside; and the cost is reduced.

For a general flip chip mount, a fluorescer layer is formed to cover the entire chip after the LED chip is mounted to the mounting substrate with bumps, etc., interposed. Or, a resin is under-filled between the bumps.

Conversely, according to the semiconductor light emitting device of the embodiment, the insulating film 78 that is different from the fluorescer layer 30 is provided at the periphery of the p-side interconnect 71 and the periphery of the n-side interconnect 72 in a state prior to the mounting shown in FIG. 1A. Thereby, characteristics suited to stress relief can be provided to the mounting surface side. Because the insulating film 78 is provided on the mounting surface side, the under-fill after the mounting is unnecessary.

Optical layers designed with priority on light extraction efficiency, color conversion efficiency, light distribution characteristics, etc., are provided on the first surface 15*a* of the semiconductor layer 15; and layers that have priority on stress relief when mounting and characteristics of the support body used instead of the substrate are provided on the mounting surface side. For example, the insulating film 78 has a structure in which a filler such as silica particles or the like is filled at high density into the resin used as the base; and the insulating film 78 is adjusted to have the appropriate hardness as the support body.

According to the embodiment described above, an inexpensive chip size device can be realized by collectively forming the semiconductor layer 15, the electrodes 16 and 17, the interconnect layers 21 and 22, and the optical layer at the wafer level; and the heat dissipation can be improved by extending the external terminals (the mounting surfaces) 71*a* and 72*a* into the region outside the chip. Accordingly, an inexpensive semiconductor light emitting device having high reliability can be provided.

In addition to the description recited above, according to the embodiment, the insulating member 27 includes a material that is different from the resin layer 25. Here, "different material" includes the case where the same multiple elements have different composition ratios. In such a case, for example, the insulating member 27 is provided as a separate body from the resin layer 25 and has an interface between the insulating member 27 and the resin layer 25.

The resin layer 25 includes a material that has stress relief superior to that of the insulating member 27 and includes, for example, a stress reliever (a rubber-based material, etc.). Thereby, the resin layer 25 can absorb the stress due to temperature fluctuation, etc., as a structure body, can support and reinforce the pillars 23 and 24, and can suppress the damage or degradation of the semiconductor layer 15 due to the stress due to the thermal stress and the external force due to the temperature fluctuation.

The resin layer 25 may include a material that absorbs the radiated light and includes, for example, carbon black which is carbon fine particles. Thereby, it is possible to suppress the light irradiation degradation of the resin layer 25 by suppressing light irradiation to the interior of the resin layer 25 by intense light from the light emitting layer 13 being absorbed at the surface vicinity of the resin layer 25.

Conversely, the insulating member 27 includes a material that is light-reflective; and the lower light extraction efficiency as a light emitting device is suppressed by reflecting the light emitted by the light emitting layer 13 and the light emitted by the fluorescers 31. For the insulating member 27, a limited amount of additives can be added to the material having low light absorption to prevent the absorption loss of the light; and it is not always possible to use a material configuration directed to stress relief as in the resin layer 25.

In other words, in the case where an insulating film of the same material is formed as one body as the resin layer 25 and the insulating member 27, there is a possibility that the suppression of the stress relief on the mounting surface side when mounting and the suppression of the absorption loss on the side surface side of the fluorescer layer 30 cannot be performed simultaneously.

Conversely, according to the embodiment, the resin layer 25 and the insulating member 27 of mutually-different materials are provided. Thereby, the improvement of the stress relieving effect on the mounting surface side and the suppression of the absorption loss on the side surface side of the fluorescer layer 30 can be performed simultaneously. In other words, it is possible to provide a semiconductor light emitting device having excellent optical characteristics.

Examples of the materials of the resin layer 25 and the insulating member 27 include, for example, a resin including mainly an epoxy resin, a resin including mainly a silicone resin, and a resin including mainly a fluorocarbon resin; and the desired characteristics can be obtained by adding materials to the resins recited above. For example, a sintered body (a ceramic) in which an inorganic substance is sintered may be used as the resin layer 25 and the insulating member 27. Thereby, the resin layer 25 includes a material that provides excellent light-shielding properties and excellent reinforcement of the device; and the insulating member 27 may include a material that has excellent light reflectance.

Therefore, the characteristics that are necessary for the mounting surface side and the characteristics that are necessary for the side surface side of the fluorescer layer 30 can be provided simultaneously. In other words, the suppression of the light leakage on the mounting surface side, the reinforcement of the device, and the suppression of the absorption loss on the side surface side of the fluorescer layer 30 can be performed simultaneously.

By the description recited above, the characteristics can be improved without increasing the constituent materials of the device. In other words, it is possible to provide a semiconductor light emitting device having excellent optical characteristics without enlarging the size of the device and without increasing the manufacturing processes of the device.

In addition to the description recited above, for example, the resin layer 25 is light-reflective similarly to the insulating member 27. In such a case, for example, the coefficient of thermal expansion of the resin layer 25 has a value that is smaller than the coefficient of thermal expansion of the insulating member 27 and equal to or near the coefficient of thermal expansion of the mounting substrate. The composition of the material included in the insulating member 27 is different from the composition of the material included in the resin layer 25.

Therefore, the resin layer 25 has characteristics that are excellent for light reflection and stress relief; and the insulating member 27 has characteristics that are superior to those of the resin layer 25 for light reflection. Thereby, the resin layer 25 and the insulating member 27 that have the necessary features can be provided in a minimum area. In other words, it is possible to provide a semiconductor light emitting device having excellent optical characteristics without enlarging the size of the device and without increasing the manufacturing processes of the device.

A method for manufacturing the semiconductor light emitting device of the embodiment will now be described with reference to FIG. 3A to FIG. 10B.

Figure 3A:
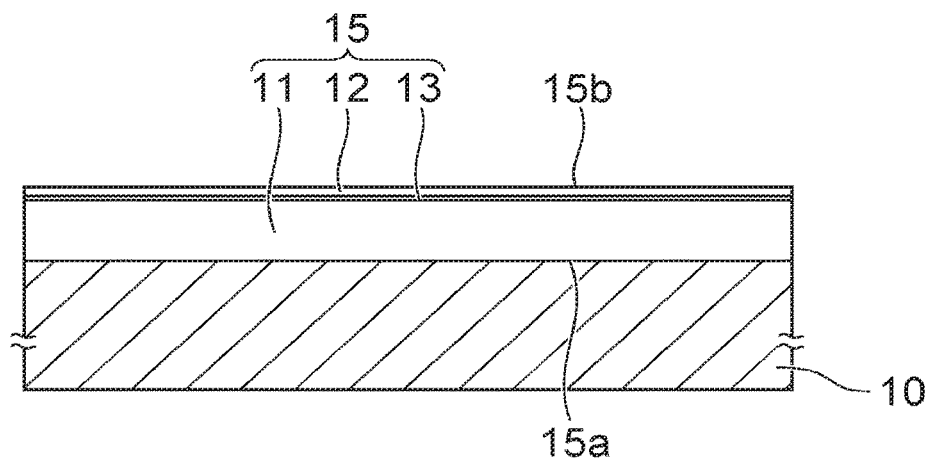

As shown in FIG. 3A, for example, the first semiconductor layer 11, the light emitting layer 13, and the second semiconductor layer 12 are epitaxially grown in order on a major surface side of a substrate 10 by MOCVD (metal organic chemical vapor deposition).

In the semiconductor layer 15, the surface that contacts the substrate 10 is the first surface 15a; and the surface that opposes the first surface 15a and does not contact the substrate 10 is the second surface 15b.

The substrate 10 is, for example, a silicon substrate. Or, the substrate 10 may be a sapphire substrate. The semiconductor layer 15 is, for example, a nitride semiconductor layer including gallium nitride (GaN).

The first semiconductor layer 11 includes, for example, a buffer layer that is provided on the major surface side of the substrate 10, and an n-type GaN layer that is provided on the buffer layer. The second semiconductor layer 12 includes, for example, a p-type AlGaN layer that is provided on the light emitting layer 13, and a p-type GaN layer that is provided on the p-type AlGaN layer. The light emitting layer 13 has, for example, a MQW (Multiple Quantum well) structure.

Figure 3B:
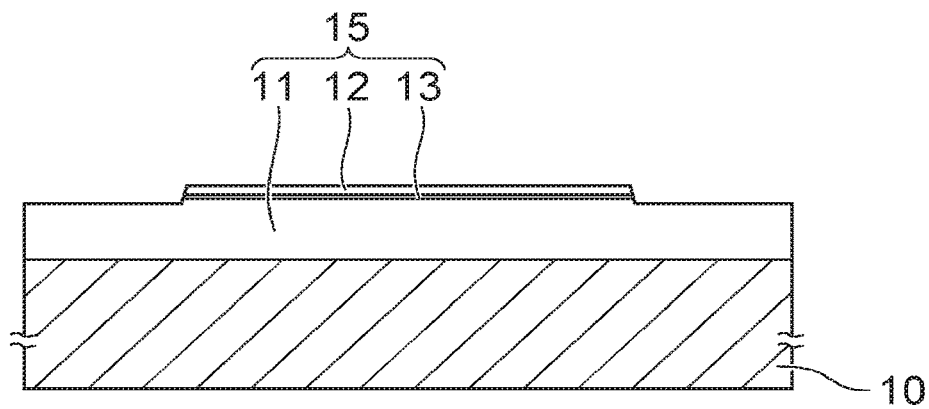

FIG. 3B shows the state in which the second semiconductor layer 12 and the light emitting layer 13 are selectively removed. For example, the first semiconductor layer 11 is exposed by selectively etching the second semiconductor layer 12 and the light emitting layer 13 by RIE (Reactive Ion Etching). At this time, the second surface 15b is the exposed surface of the first semiconductor layer 11 and the exposed surface of the second semiconductor layer 12.

Figure 3C:
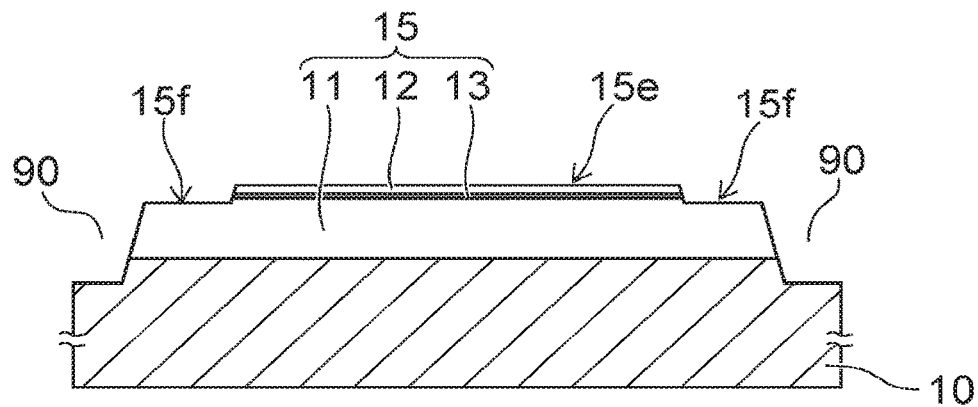

Then, as shown in FIG. 3C, a trench 90 is made by selectively removing the first semiconductor layer 11. The semiconductor layer 15 is divided into a plurality by the trench 90 on the major surface side of the substrate 10. For example, the trench 90 is made in a lattice pattern on the substrate 10 having a wafer configuration.

The trench 90 pierces the semiconductor layer 15 and reaches the substrate 10. By controlling the etching conditions such as the etching time, etc., at this time, the major surface of the substrate 10 also is etched slightly; and the bottom surface of the trench 90 is caused to recede to be lower than the interface between the substrate 10 and the semiconductor layer 15. The trench 90 may be made after the p-side electrode 16 and the n-side electrode 17 are formed.

Figure 4A:
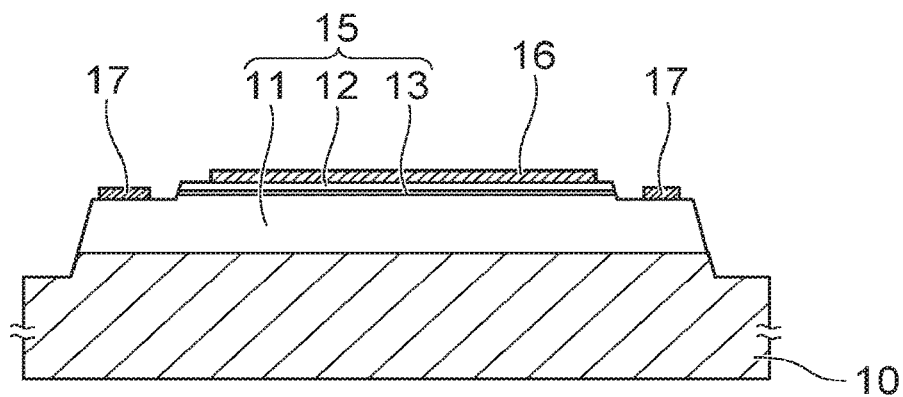

Then, as shown in FIG. 4A, the p-side electrode 16 is formed on the surface of the second semiconductor layer 12. The n-side electrode 17 is formed on the surface of the first semiconductor layer 11 in the region where the second semiconductor layer 12 and the light emitting layer 13 are selectively removed.

The p-side electrode 16 that is formed in the region where the light emitting layer 13 is stacked includes a reflective film that reflects the light radiated by the light emitting layer 13. For example, the p-side electrode 16 includes silver, a silver alloy, aluminum, an aluminum alloy, etc. Also, the p-side electrode 16 includes a metal protective film (a barrier metal) to prevent sulfidization and oxidization of the reflective film.

Figure 4B:
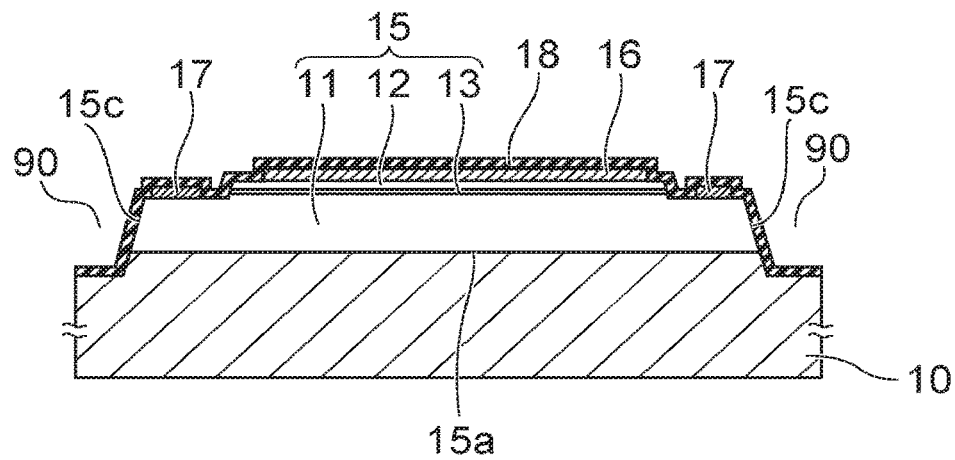

Then, as shown in FIG. 4B, the insulating film 18 is formed to cover the stacked body provided on the substrate 10. The insulating film 18 covers the second surface 15b of the semiconductor layer 15, the p-side electrode 16, and the n-side electrode 17. Also, the insulating film 18 covers the side surface 15c continuing from the first surface 15a of the semiconductor layer 15. The insulating film 18 is further formed on the surface of the substrate 10 at the bottom surface of the trench 90.

Figure 4C:
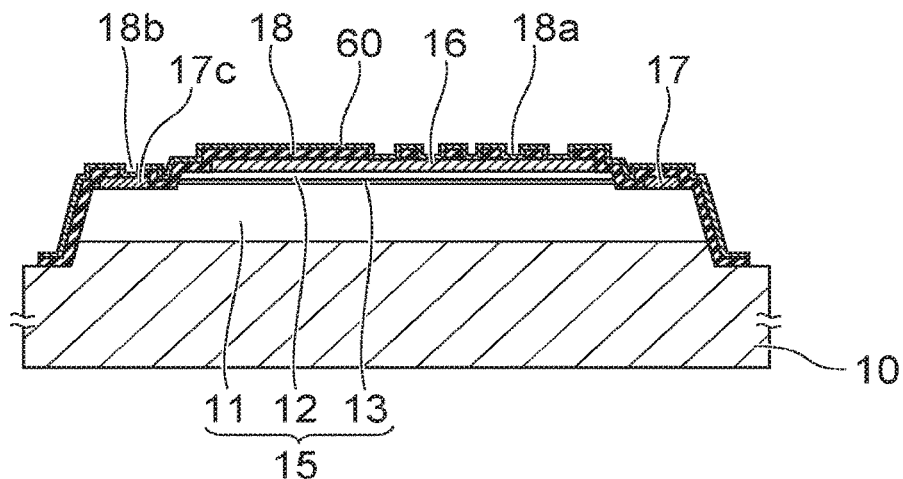

The insulating film 18 is, for example, a silicon oxide film or a silicon nitride film formed by CVD (Chemical Vapor Deposition). As shown in FIG. 4C, first openings 18a and a second opening 18b are made in the insulating film 18 by, for example, wet etching using a resist mask. The first openings 18a reach the p-side electrode 16; and the second opening 18b reaches the contact portion 17c of the n-side electrode 17. At this time, a portion of the insulating film 18 that is formed on the substrate 10 also is removed simultaneously.

Figure 5A:
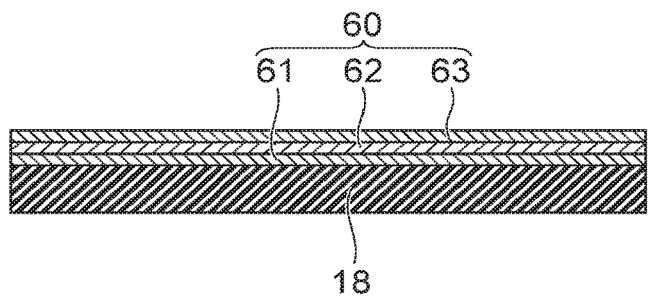

Then, a metal film 60 is formed on the surface of the insulating film 18, the inner walls (the side walls and the bottom surfaces) of the first openings 18a, and the inner walls (the side wall and the bottom surface) of the second opening 18b. As shown in FIG. 5A, the metal film 60 includes, for example, an aluminum film 61, a titanium film 62, and a copper film 63. For example, the metal film 60 is formed by sputtering.

Figure 5B:
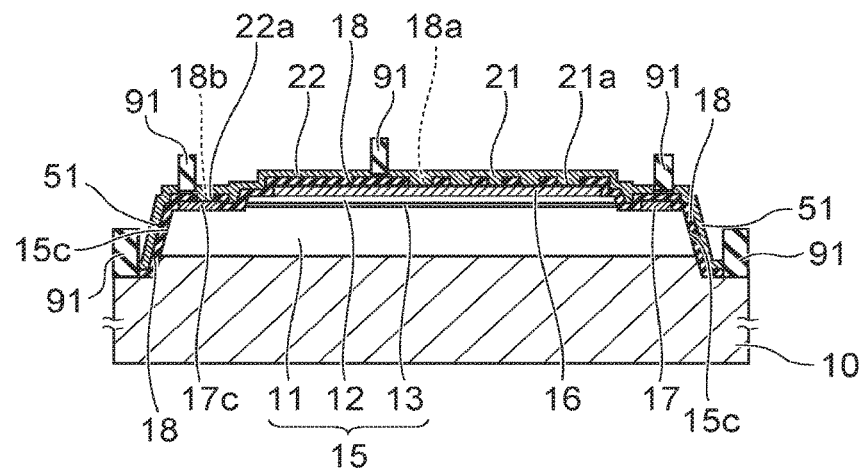

Continuing, after selectively forming a resist mask 91 shown in FIG. 5B on the metal film 60, the first p-side interconnect layer 21, the first n-side interconnect layer 22, and the reflective film 51 are formed by copper electroplating using the copper film 63 of the metal film 60 as a seed layer.

The first p-side interconnect layer 21 is formed also inside the first openings 18a and is electrically connected to the p-side electrode 16. The first n-side interconnect layer 22 is formed also inside the second opening 18b and is electrically connected to the contact portion 17c of the n-side electrode 17.

Figure 5C:
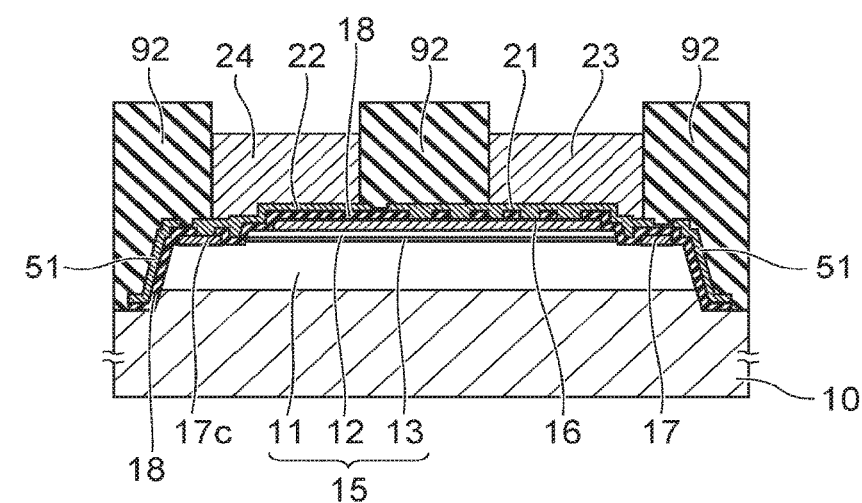

Then, after removing the resist mask 91 using, for example, a solvent or oxygen plasma, a resist mask 92 shown in FIG. 5C is formed selectively. Or, the resist mask 92 may be formed without removing the resist mask 91.

After forming the resist mask 92, the p-side pillar 23 and the n-side pillar 24 are formed to be separated from each other by copper electroplating using the first p-side interconnect layer 21 and the first n-side interconnect layer 22 as a seed layer.

The p-side pillar 23 is formed on the first p-side interconnect layer 21. The first p-side interconnect layer 21 and the p-side pillar 23 are formed as one body made of the same copper material. The n-side pillar 24 is formed on the first n-side interconnect layer 22. For example, the first n-side interconnect layer 22 and the n-side pillar 24 are formed as one body made of the same copper material.

The resist mask 92 is removed using, for example, a solvent or oxygen plasma. At this point in time, the first p-side interconnect layer 21 and the first n-side interconnect layer 22 are linked to each other via the metal film 60. Also, the first p-side interconnect layer 21 and the reflective film 51 are linked to each other via the metal film 60; and the first n-side interconnect layer 22 and the reflective film 51 are linked to each other via the metal film 60.

Therefore, the metal film 60 that is between the first p-side interconnect layer 21 and the first n-side interconnect layer 22, the metal film 60 that is between the first p-side interconnect layer 21 and the reflective film 51, and the metal film 60 that is between the first n-side interconnect layer 22 and the reflective film 51 are removed by etching.

Thereby, the electrical connection via the metal film 60 between the first p-side interconnect layer 21 and the first n-side interconnect layer 22, the electrical connection via the metal film 60 between the first p-side interconnect layer 21 and the reflective film 51, and the electrical connection via the metal film 60 between the first n-side interconnect layer 22 and the reflective film 51 are broken (FIG. 6A).

Then, the resin layer 25 shown in FIG. 6B is formed on the structure body shown in FIG. 6A. The resin layer 25 is formed on the outer side of the side surface of the p-side pillar 23, the outer side of the side surface of the n-side pillar 24, the outer side of the side surface of the p-side electrode 16, the outer side of the side surface of the first p-side interconnect unit 41, the outer side of the side surface of the n-side electrode 17, the outer side of the side surface of the first n-side interconnect unit 43, and the outer side of the side surface of the semiconductor layer 15.

The resin layer 25 covers the first p-side interconnect unit 41 and the first n-side interconnect unit 43. The resin layer 25 also covers the reflective film 51.

The resin layer 25 is included in the support body 100 with the first p-side interconnect unit 41 and the first n-side interconnect unit 43. The substrate 10 is removed in the state in which the semiconductor layer 15 (a semiconductor chip 3) that is supported by the support body 100 is multiply formed. At this time, the multiple semiconductor chips 3 are formed as one body with the resin layer 25 interposed.

As shown in FIG. 6C, for example, the substrate 10 which is a silicon substrate is removed by dry etching such as RIE, etc. Or, the substrate 10 may be removed by wet etching. Or, in the case where the substrate 10 is a sapphire substrate, the substrate 10 can be removed by laser lift-off.

There are cases where the semiconductor layer 15 that is epitaxially grown on the substrate 10 has a large internal stress. The p-side pillar 23, the n-side pillar 24, and the resin layer 25 are materials that are more flexible than the semiconductor layer 15 that is made of, for example, a GaN-based material. Accordingly, even in the case where the internal stress in the epitaxial growth is released all at once when peeling the substrate 10, the stress is absorbed by the p-side pillar 23, the n-side pillar 24, and the resin layer 25. Therefore, damage of the semiconductor layer 15 in the process of removing the substrate 10 can be avoided.

The first surface 15a of the semiconductor layer 15 is exposed by the removal of the substrate 10. A micro unevenness is formed in the first surface 15a that is exposed by performing surface roughening (frosting). For example, wet etching of the first surface 15a is performed using a KOH (potassium hydroxide) aqueous solution, TMAH (tetramethyl ammonium hydroxide), etc. Different etching rates that are dependent on the crystal plane orientation occur in the etching. Therefore, the unevenness can be formed in the first surface 15a. The radiated light extraction efficiency of the light emitting layer 13 can be increased by forming the micro unevenness in the first surface 15a.

As shown in FIG. 7A, the fluorescer layer 30 is formed, with the insulating layer 19 interposed, as one body on the first surface 15a for the multiple semiconductor chips 3. The fluorescer layer 30 is formed on the semiconductor layer 15 and on the resin layer 25. For example, the fluorescer layer 30 is formed by a method such as printing, potting, molding, compression molding, etc. The insulating layer 19 increases the adhesion between the semiconductor layer 15 and the fluorescer layer 30. As the fluorescer layer 30, a cured fluorescer in which the fluorescers 31 are dispersed in the binder 32 and cured may be used.

The fluorescer layer 30 also is formed on the resin layer 25 provided in the region around the side surface 15c of the semiconductor layer 15. The fluorescer layer 30 is formed on the resin layer 25 with the insulating layer 19 interposed.

After forming the fluorescer layer 30, a portion of the surface of the resin layer 25 is caused to recede. Thereby, the lower surface of the p-side pillar 23 and the lower surface of the n-side pillar 24 are exposed from the resin layer 25.

As shown in FIG. 7B, the multiple semiconductor chips 3 are supported by a support body 95. Subsequently, the multiple semiconductor layers 15 are divided by cutting (dicing) the resin layer 25, the insulating layer 19, and the fluorescer layer 30 in the region (the dicing region) where the trench 90 described above is made. At this time, the semiconductor layer 15 is not damaged by the dicing because the semiconductor layer 15 does not exist in the dicing region. Thereby, the multiple semiconductor chips 3 are singulated in the state of contacting the support body 95. The insulating layer 19 and the fluorescer layer 30 are singulated as portions of the multiple semiconductor chips 3.

The processes prior to the singulation of the multiple semiconductor chips 3 are performed in the wafer state. The wafer is singulated into semiconductor light emitting devices including at least one semiconductor chip each. The semiconductor light emitting device may have a single-chip structure including one semiconductor chip 3; or a multi-chip structure including multiple semiconductor chips 3 may be used.

As shown in FIG. 8A, the singulated multiple semiconductor chips 3 are rearranged on a support body 96. The fluorescer layer 30 contacts the support body 96. For example, the pitch of the rearranged multiple semiconductor chips 3 is larger than the pitch of the multiple semiconductor chips 3 prior to the rearrangement.

As shown in FIG. 8B, the insulating member 27 is formed as one body on the surfaces of the multiple semiconductor chips 3. The insulating member 27 is formed as one body between the multiple semiconductor chips 3. The insulating member 27 contacts the side surface of the fluorescer layer 30, the side surface and lower surface of the resin layer 25, and the lower surfaces of the interconnects 71 and 72. Thereby, it is possible to suppress the load on the fluorescer layer 30 due to the formation of the insulating member 27. In other words, in the case where the multiple semiconductor chips 3 are rearranged with the fluorescer layer 30 oriented toward the side opposite to the support body 96 and the insulating member 27 is formed, damage such as thermal denaturation, etc., may occur due to reactions between the fluorescer layer 30 and the insulating member 27 due to the heating when forming the insulating member 27, etc.; and it is desirable to form the insulating member 27 with the fluorescer layer 30 oriented toward the support body side as described above to suppress such damage.

Because the multiple semiconductor chips 3 are rearranged on the support body 96, for example, a bonding layer such as an acrylic resin, etc., is provided on the rearranging surface of the support body 96. Therefore, the fluorescer layer 30 that is oriented toward the support body 96 side is pressed into the bonding layer by the pressure when the semiconductor chip 3 is rearranged on the support body 96; and it is often that the obtained configuration is such that the fluorescer layer 30 after the insulating member 27 is formed juts slightly from the surface of the insulating member 27. However, when thermal expansion of the fluorescer layer 30 occurs due to the heat when forming the insulating member 27, only the end portion of the fluorescer layer 30 may jut from the insulating member 27 and the central portion of the fluorescer layer 30 may be lower than the end portion of the fluorescer layer 30 due to the contraction of the fluorescer layer 30 in the state of being cooled to room temperature. Thereby, an acute angle protrusion is formed at the end portion of the fluorescer layer 30; it is easy to extract light at even a wide angle; and it is possible to increase the light extraction efficiency. By utilizing this configuration, it is also possible to control the orientation of the light emitted from the fluorescer layer 30.

In the first direction, at least the end portion of the upper surface of the fluorescer layer 30 is formed at a height that is equal to or higher than the upper surface of the insulating member 27. Thereby, the obstruction of the light extraction by the insulating member 27 can be minimized. For example, the fluorescer layer 30 and the insulating member 27 that are formed by the process recited above have configurations such as those shown in FIG. 39 and FIG. 40. The configurations can be formed similarly in the embodiments described below as well; and a description is omitted below.

A portion of the insulating member 27 is caused to recede as shown in FIG. 9A. Thereby, the exposed surfaces of the resin layer 25 and the first interconnect units 41 and 43 are formed in the same plane as the surface of the receded insulating member 27. Here, "exposed surface" refers to the surface provided on the page surface lower side of FIG. 10A.

Then, the p-side interconnect 71 and the n-side interconnect 72 are formed. The p-side interconnect 71 is formed on the exposed surface of the first p-side interconnect unit 41 (the p-side pillar 23), the exposed surface of the resin layer 25, and the exposed surface of the insulating member 27. The p-side interconnect 71 is connected to the first p-side interconnect unit 41 and extends across the resin layer 25 and the insulating member 27 onto the insulating member 27. The p-side interconnect 71 is formed as one body overlapping the first p-side interconnect unit 41, the resin layer 25, the semiconductor layer 15, and the insulating member 27.

The n-side interconnect 72 is formed on the exposed surface of the first n-side interconnect unit 43 (the n-side pillar 24), the exposed surface of the resin layer 25, and the exposed surface of the insulating member 27. The n-side interconnect 72 is connected to the first n-side interconnect unit 43 and extends across the resin layer 25 and the insulating member 27 onto the insulating member 27. The n-side interconnect 72 is formed as one body overlapping the first n-side interconnect unit 43, the resin layer 25, the semiconductor layer 15, and the insulating member 27. The exposed surface of the first n-side interconnect unit 43 is formed to have a surface area that is wider than the n-side electrode 17. Therefore, even in the case where the formation position of the n-side interconnect 72 is shifted somewhat with respect to the chip, the n-side interconnect 72 can overlap and be connected to the first n-side interconnect unit 43 reliably.

The insulating film 78 is formed between the p-side interconnect 71 and the n-side interconnect 72, at the periphery of the p-side interconnect 71, and at the periphery of the n-side interconnect 72.

As shown in FIG. 9B, the insulating member 27 and the insulating film 78 that are formed between the multiple semiconductor chips 3 are cut (diced). At this time, the semiconductor layer 15 is not damaged by the dicing because the semiconductor layer 15 does not exist in the dicing region. Thereby, the singulated multiple semiconductor chips 3 are formed. The singulated multiple semiconductor chips 3 include the interconnects 71 and 72.

Subsequently, the multiple semiconductor chips 3 are separated from the support body 96. Thereby, the semiconductor light emitting device of the embodiment shown in FIG. 1A is formed.

Other than the method in which the fluorescer layer 30 shown in FIG. 8A contacts the support body 96 when the multiple semiconductor chips 3 are rearranged, a method may be used in which the resin layer 25 and the first interconnect units 41 and 43 contact a support body 97 as shown in FIG. 10A. In such a case, the insulating member 27 is formed as one body on the surfaces of the multiple semiconductor chips 3. The insulating member 27 is formed as one body between the multiple semiconductor chips 3. The insulating member 27 contacts the upper surface and side surface of the fluorescer layer 30 and the side surface of the resin layer 25. The process recited above is desirable in that it is unnecessary to perform the process of exposing the pillars by causing the insulating member 27 to recede because the first interconnect units 41 and 43 and the resin layer 25 are provided on the support body 96 side.

As shown in FIG. 10B, a portion of the surface of the insulating member 27 is caused to recede. Thereby, the upper surface of the fluorescer layer 30 is formed in the same plane as the surface of the receded insulating member 27. Then, the multiple semiconductor chips 3 are transferred from the support body 97 to a support body 98.

Subsequently, similarly to the manufacturing method described above, the interconnects 71 and 72, etc., are formed; and the semiconductor light emitting device of the embodiment is formed.

According to the embodiment, the insulating member 27 includes a material that is different from the resin layer 25; and the resin layer 25 is formed as a separate body. The insulating member 27 is, for example, light-reflective. The resin layer 25 includes, for example, a material that has stress relief that is superior to that of the semiconductor layer 15. Thereby, the damage of the semiconductor layer can be avoided simultaneously with increasing the light extraction efficiency to the outside.

The resin layer 25 may include a material that is light-shielding. Thereby, the suppression of the light leakage on the mounting surface side and the suppression of the absorption loss on the side surface side of the fluorescer layer 30 can be performed simultaneously. In other words, it is possible to provide a semiconductor light emitting device having excellent optical characteristics.

In addition to the description recited above, according to the embodiment, because the processes described above prior to the singulation can be performed collectively in the wafer state, it is unnecessary to perform the formation of the interconnect layers, the formation of the pillars, the packaging with the resin layer, and the formation of the fluorescer layer for every singulated individual device; and a drastic cost reduction is possible.

Because the support body 100 and the fluorescer layer 30 are cut after being formed in the wafer state, the side surface of the fluorescer layer 30 is aligned with the side surface of the support body 100 (the side surface of the resin layer 25); therefore, the insulating member 27 can be formed easily. Also, because the lower surfaces of the metal pillars 23 and 24 are aligned with the lower surface of the resin layer 25, the interconnects 71 and 72 can be formed easily.

The semiconductor chip 3 is supported by the insulating member 27 and the resin layer 25 which are made of different materials. Thereby, the suppression of the light leakage on the mounting surface side, the reinforcement of the device, and the suppression of the absorption loss on the side surface side of the fluorescer layer 30 can be performed simultaneously without increasing the number of manufacturing processes.

The fluorescer layer 30 contacts the support body 96 when the semiconductor chip 3 is rearranged on the support body 96. Thereby, it is possible to suppress the load on the fluorescer layer 30 in the formation of the insulating member 27.

Second Embodiment

Examples of the configurations of semiconductor light emitting devices of the embodiment will now be described with reference to FIG. 11 and FIG. 12.

The main difference between the embodiment and the embodiment described above is the configuration of the interconnect periphery. Therefore, a description is partially omitted for portions similar to those of the embodiment described above.

Figure 11:
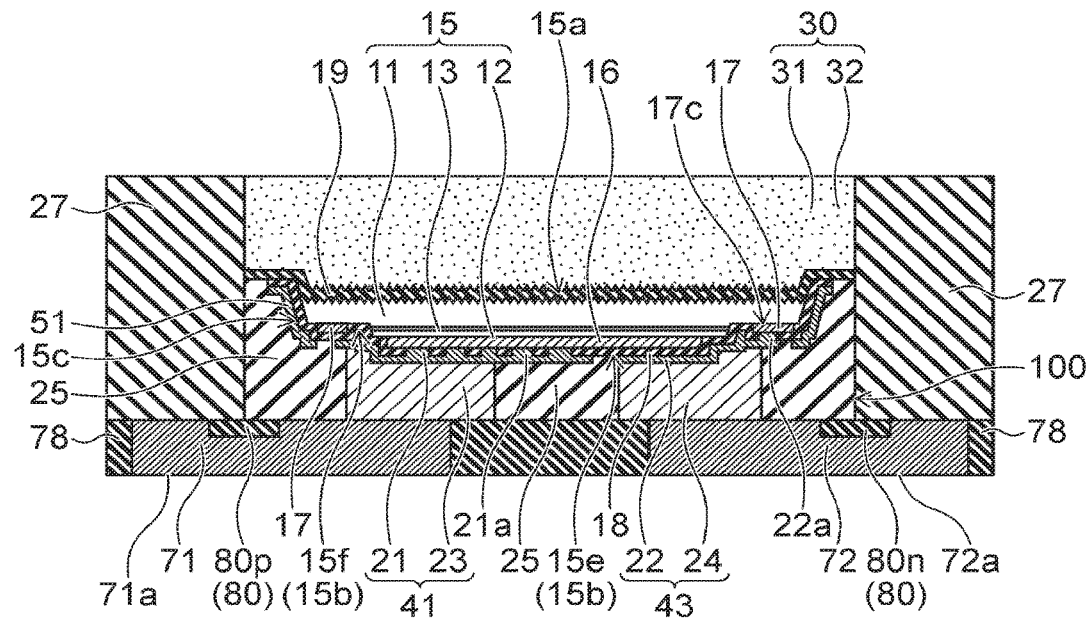
FIG. 11 is a schematic cross-sectional view of the semiconductor light emitting device of a second embodiment.

As shown in FIG. 11, an insulating material 80 (a buffering insulating material) is provided under the support body 100. The insulating material 80 is provided in a region overlapping the resin layer 25 on the second surface 15*b* side. The insulating material 80 is provided across the region between the resin layer 25 and the insulating member 27 and extends to a region overlapping the insulating member 27. The insulating material 80 is provided between the p-side interconnect 71 and the resin layer 25 or between the p-side interconnect 71 and the insulating member 27, and between the n-side interconnect 72 and the resin layer 25 or between the n-side interconnect 72 and the insulating member 27. For convenience, the former is called a p-side insulating material 80*p*; and the latter is called an n-side insulating material 80*n*. The insulating material 80 includes, for example, a material that is different from the resin layer 25 and the insulating member 27.

The p-side insulating material 80*p* is provided between the resin layer 25 and the p-side interconnect 71 and between the insulating member 27 and the p-side interconnect 71. The n-side insulating material 80*n* is provided between the resin layer 25 and the n-side interconnect 72 and between the insulating member 27 and the n-side interconnect 72. Each of the insulating materials 80 functions as a buffer material that suppresses damage to the interconnects 71 and 72 due to the stress and the mechanical shape deformation generated due to the difference between the thermal characteristics (the coefficient of thermal expansion, etc.) and the mechanical characteristics (the elasticity modulus, etc.) of the resin layer 25 and the insulating member 27. In other words, partial deformation and/or electrical disconnection of the interconnects 71 and 72 due to the deformation (cracks, interface shifting, etc.) occurring at the boundary between the resin layer 25 and the insulating member 27 due to the external stress, the temperature fluctuation, etc., is prevented.

Figure 12:
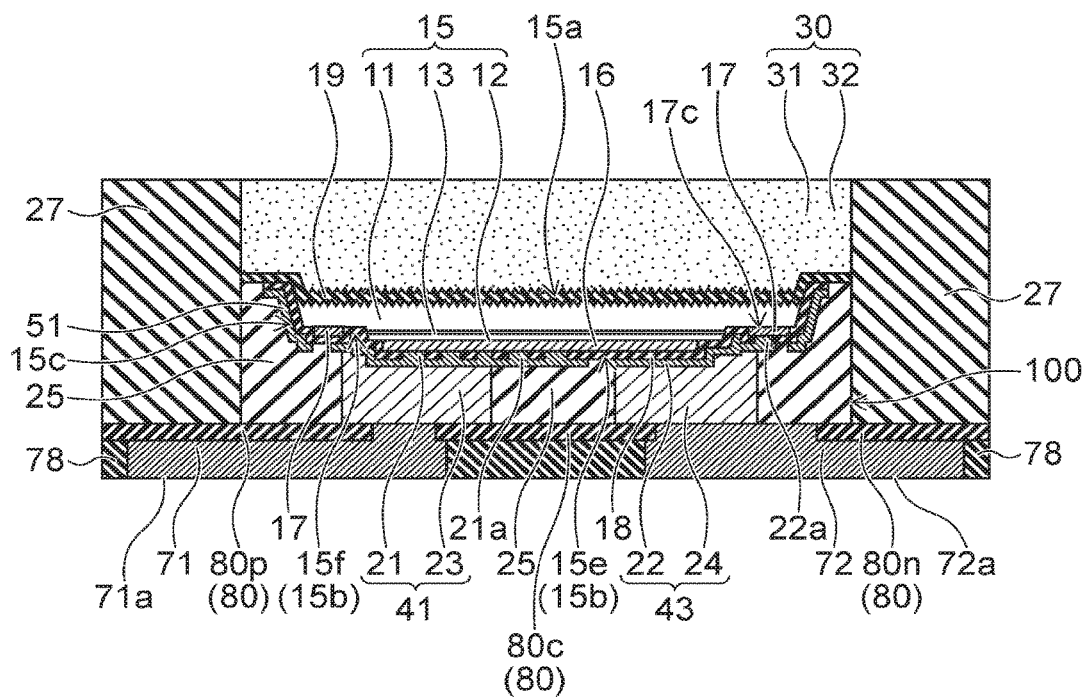
FIG. 12 is a schematic cross-sectional view of the semiconductor light emitting device of the second embodiment.

As shown in FIG. 12, for example, the p-side interconnect 71 is separated from the insulating member 27 with the p-side insulating material 80*p* interposed. The n-side interconnect 72 is separated from the insulating member 27 with the n-side insulating material 80*n* interposed.

For example, the insulating material 80 may include an intermediate unit 80*c*. The intermediate unit 80*c* is provided between the resin layer 25 and the insulating film 78, between the p-side pillar 23 and the insulating film 78, and between the n-side pillar 24 and the insulating film 78. The insulating film 78 is separated from the resin layer 25 with the intermediate unit 80*c* interposed.

According to the embodiment, similarly to the embodiment described above, the insulating member 27 includes a material that is different from the resin layer 25. Thereby, the characteristics that are necessary for the mounting surface side and the characteristics that are necessary for the side surface side of the fluorescer layer 30 can be provided simultaneously; and it is possible to provide a semiconductor light emitting device having excellent optical characteristics.

In addition to the description recited above, according to the embodiment, the insulating material 80 is provided in the region overlapping the resin layer 25 on the second surface 15*b* side. The insulating material 80 is provided across the region between the resin layer 25 and the insulating member 27. The insulating material 80 is provided between the p-side interconnect 71 and the resin layer 25, between the p-side interconnect 71 and the insulating member 27, between the n-side interconnect 72 and the resin layer 25, and between the n-side interconnect 72 and the insulating member 27. Thereby, partial deformation and/or electrical disconnection of the interconnects 71 and 72 due to the deformation occurring at the boundary between the resin layer 25 and the insulating member 27 can be prevented. Also, the interconnects 71 and 72 that are provided at the vicinity of the interface between the resin layer 25 and the insulating member 27 can be protected.

For example, the interconnects 71 and 72 are separated, with the insulating material 80 interposed, from the insulating member 27. Thereby, the buffering effect between the insulating member 27 and the interconnects 71 and 72 is obtained. In the embodiment as well, the fluorescer layer 30 and the insulating member 27 may have the configurations shown in FIG. 39 and FIG. 40. Thereby, a protrusion that has an acute angle is formed at the end portion of the fluorescer layer 30; it is easy to extract light even at wide angles; and it is possible to improve the light extraction effect. By utilizing this configuration, it is also possible to control the orientation of the light emitted from the fluorescer layer 30.

In the first direction, at least the end portion of the upper surface of the fluorescer layer 30 may be provided at a height that is equal to or higher than the upper surface of the insulating member 27. Thereby, the obstruction of the light extraction by the insulating member 27 can be minimized.

Third Embodiment

Examples of the configurations of semiconductor light emitting devices of the embodiment will now be described with reference to FIG. 13 and FIG. 14.

The main difference between the embodiment and the embodiment described above is the configuration of the interconnect periphery. Therefore, a description is partially omitted for portions similar to those of the embodiment described above.

Figure 13:
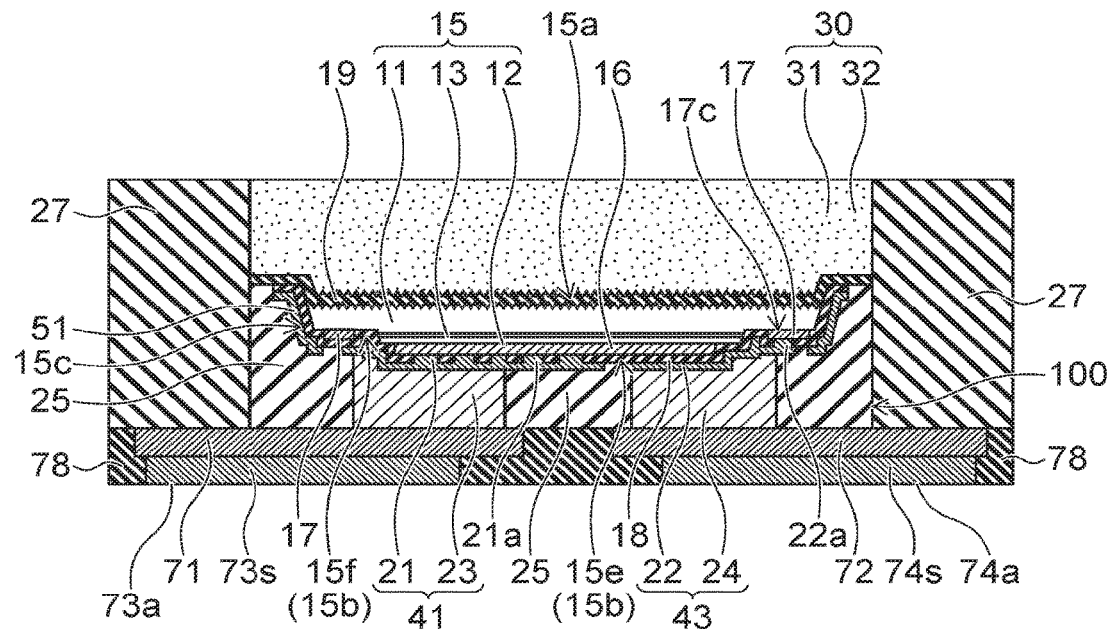
FIG. 13 is a schematic cross-sectional view of the semiconductor light emitting device of a third embodiment.

As shown in FIG. 13, a second p-side pillar 73s is electrically connected to the p-side interconnect 71. A second n-side pillar 74s is electrically connected to the n-side interconnect 72. The planar sizes of the second pillars 73s and 74s are respectively smaller than the planar sizes of the interconnects 71 and 72.

The insulating film 78 contacts the side surface of the second p-side pillar 73s and the side surface of the second n-side pillar 74s and is filled between the second p-side pillar 73s and the second n-side pillar 74s. The insulating film 78 is provided also at the periphery of the second p-side pillar 73s and the periphery of the second n-side pillar 74s.

The lower surfaces of the second pillars 73s and 74s are exposed from the insulating film 78 and function respectively as a p-side mounting surface 73a and an n-side mounting surface 74a that are connectable to an external circuit such as a mounting substrate, etc. For example, the mounting surfaces 73a and 74a are bonded to the land pattern of the mounting substrate by solder or an electrically conductive bonding agent. The surface areas of the mounting surfaces 73a and 74a are respectively less than the surface areas of the mounting surfaces 71a and 72a of the interconnects 71 and 72 described above. The spacing between the p-side mounting surface 73a and the n-side mounting surface 74a is set to a spacing such that the solder does not bridge between the mounting surfaces 73a and 74a when mounting.

Figure 14:
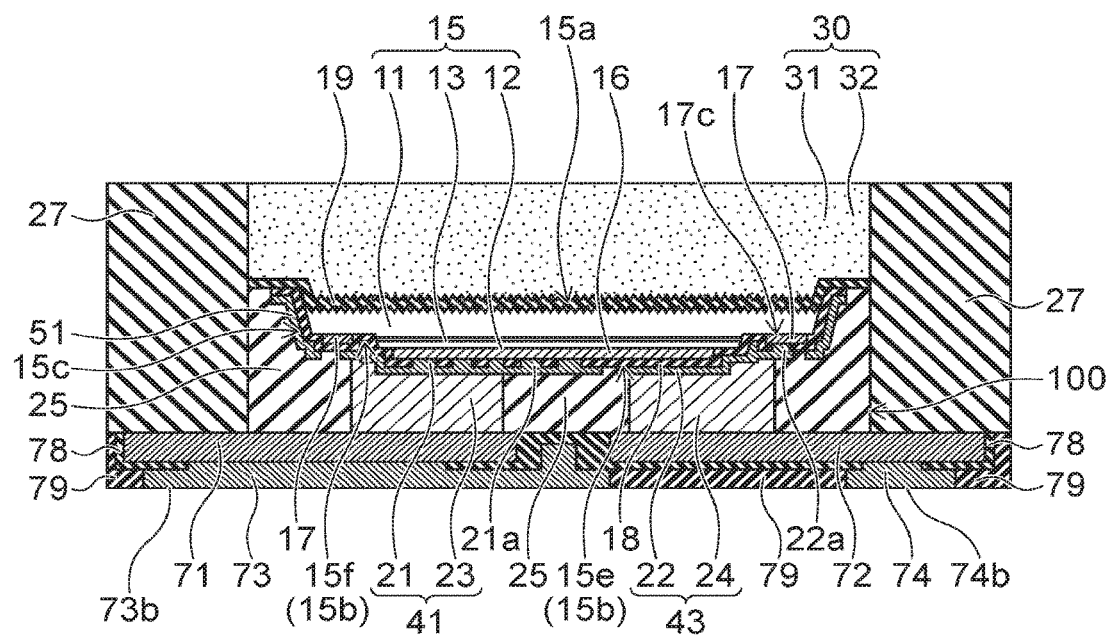
FIG. 14 is a schematic cross-sectional view of the semiconductor light emitting device of the third embodiment.

As shown in FIG. 14, a p-side external connection electrode 73 is connected to the p-side interconnect 71. An n-side external connection electrode 74 is connected to the n-side interconnect 72. The planar size of the p-side external connection electrode 73 is larger than the planar size of the p-side interconnect 71. The planar size of the n-side external connection electrode 74 is smaller than the planar size of the n-side interconnect 72 and smaller than the planar size of the p-side external connection electrode 73.

A resin layer 79 is provided between the p-side external connection electrode 73 and the n-side external connection electrode 74. The resin layer 79 contacts the side surface of the p-side external connection electrode 73 and the side surface of the n-side external connection electrode 74 and is filled between the p-side external connection electrode 73 and the n-side external connection electrode 74. The resin layer 79 is provided also at the periphery of the p-side external connection electrode 73 and the periphery of the n-side external connection electrode 74.

The lower surfaces of the external connection electrodes 73 and 74 are exposed from the resin layer 79 and function respectively as a p-side mounting surface 73b and an n-side mounting surface 74b that are connectable to an external circuit such as a mounting substrate, etc. For example, the mounting surfaces 73b and 74b are bonded to the land pattern of the mounting substrate by solder or an electrically conductive bonding agent. The surface area of the p-side mounting surface 73b is greater than the surface area of the mounting surface 71a of the p-side interconnect 71. The surface area of the n-side mounting surface 74b is less than the surface area of the mounting surface 72a of the n-side interconnect 72 and less than the surface area of the p-side mounting surface 73b. The spacing between the p-side mounting surface 73b and the n-side mounting surface 74b is set to a spacing such that the solder does not bridge between the mounting surfaces 73b and 74b when mounting.

According to the embodiment, similarly to the embodiment described above, the insulating member 27 includes a material that is different from the resin layer 25. Thereby, the characteristics that are necessary for the mounting surface side and the characteristics that are necessary for the side surface side of the fluorescer layer 30 can be provided simultaneously; and it is possible to provide a semiconductor light emitting device having excellent optical characteristics.

In addition to the description recited above, according to the embodiment, the second pillars 73s and 74s are connected respectively to the interconnects 71 and 72. For example, the external connection electrodes 73 and 74 may be connected respectively to the interconnects 71 and 72. Thereby, it is possible to arbitrarily set the planar layout for mounting. In the embodiment as well, the fluorescer layer 30 and the insulating member 27 may have the configurations shown in FIG. 39 and FIG. 40. Thereby, a protrusion that has an acute angle is formed at the end portion of the fluorescer layer 30; it is easy to extract light even at wide angles; and it is possible to improve the light extraction effect. By utilizing this configuration, it is also possible to control the orientation of the light emitted from the fluorescer layer 30.

In the first direction, at least the end portion of the upper surface of the fluorescer layer 30 may be provided at a height that is equal to or higher than the upper surface of the insulating member 27. Thereby, the obstruction of the light extraction by the insulating member 27 can be minimized.

Fourth Embodiment

An example of the configuration of a semiconductor light emitting device of the embodiment will now be described with reference to FIG. 15.

The main difference between the embodiment and the embodiment described above is the configuration of the periphery of the semiconductor layer. Therefore, a description is partially omitted for portions similar to those of the embodiment described above.

Figure 15:
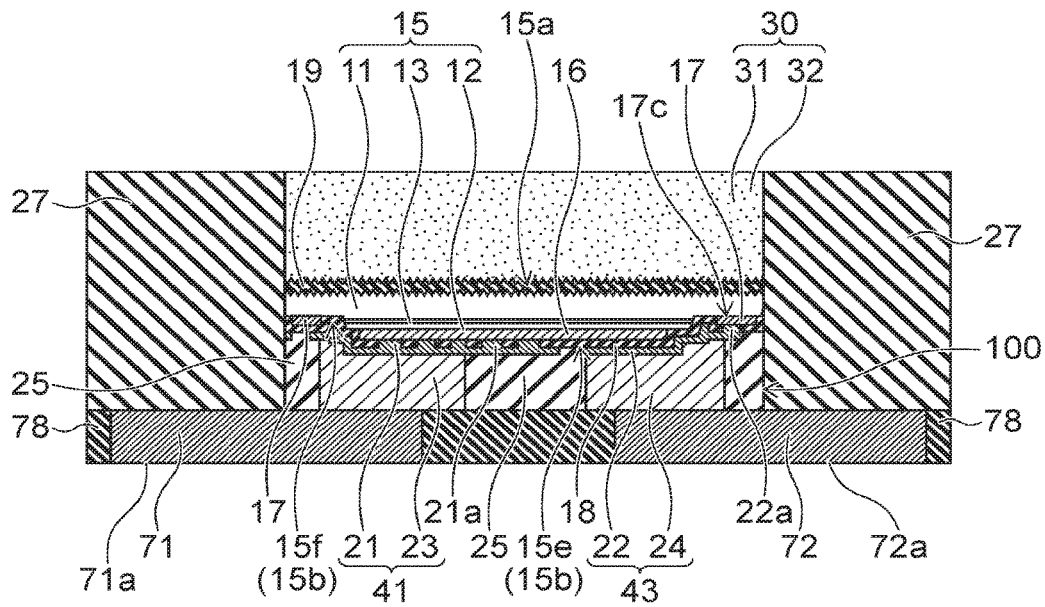
FIG. 15 is a schematic cross-sectional view of the semiconductor light emitting device of a fourth embodiment.

As shown in FIG. 15, the side surface of the resin layer 25 is in the same plane as the side surface of the first semiconductor layer 11. In other words, the resin layer 25 is not provided on the outer side of the side surface of the first semiconductor layer 11. For example, the side surface of the first semiconductor layer 11 contacts the insulating member 27.

The fluorescer layer 30 is provided on the semiconductor layer 15 and is separated from the resin layer 25 with the semiconductor layer 15 interposed.

For example, in the method for manufacturing the semiconductor light emitting device described above, the first semiconductor layer 11 also is cut simultaneously when cutting the resin layer 25, the insulating layer 19, and the fluorescer layer 30. Subsequently, similarly to the embodiment described above, the semiconductor light emitting device of the embodiment is formed by forming the insulating member 27, etc.

According to the embodiment, similarly to the embodiment described above, the insulating member 27 includes a material that is different from the resin layer 25. Thereby, the characteristics that are necessary for the mounting surface side and the characteristics that are necessary for the side surface side of the fluorescer layer 30 can be provided simultaneously; and it is possible to provide a semiconductor light emitting device having excellent optical characteristics.

In addition to the description recited above, according to the embodiment, the side surface of the resin layer 25 is in the same plane as the side surface of the first semiconductor layer 11. Thereby, the insulating member 27 that is light-reflective is provided at the side surface of the first semiconductor layer 11. Therefore, the light reflectivity is maintained without providing the reflective film 51, etc., at the side surface of the first semiconductor layer 11; and it is possible to reduce the semiconductor light emitting device.

Fifth Embodiment

Examples of the configurations of semiconductor light emitting devices of the embodiment will now be described with reference to FIG. 16 and FIG. 17.

The main difference between the embodiment and the embodiment described above is the configuration on the fluorescer layer. Therefore, a description is partially omitted for portions similar to those of the embodiment described above.

Figure 16:
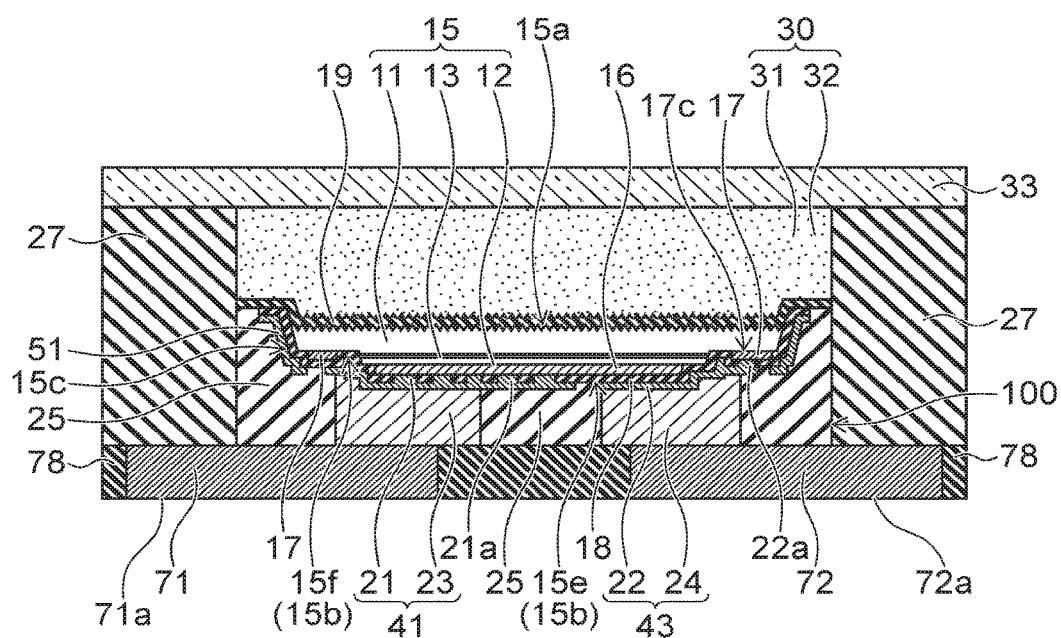
FIG. 16 is a schematic cross-sectional view of the semiconductor light emitting device of a fifth embodiment.
Figure 39:
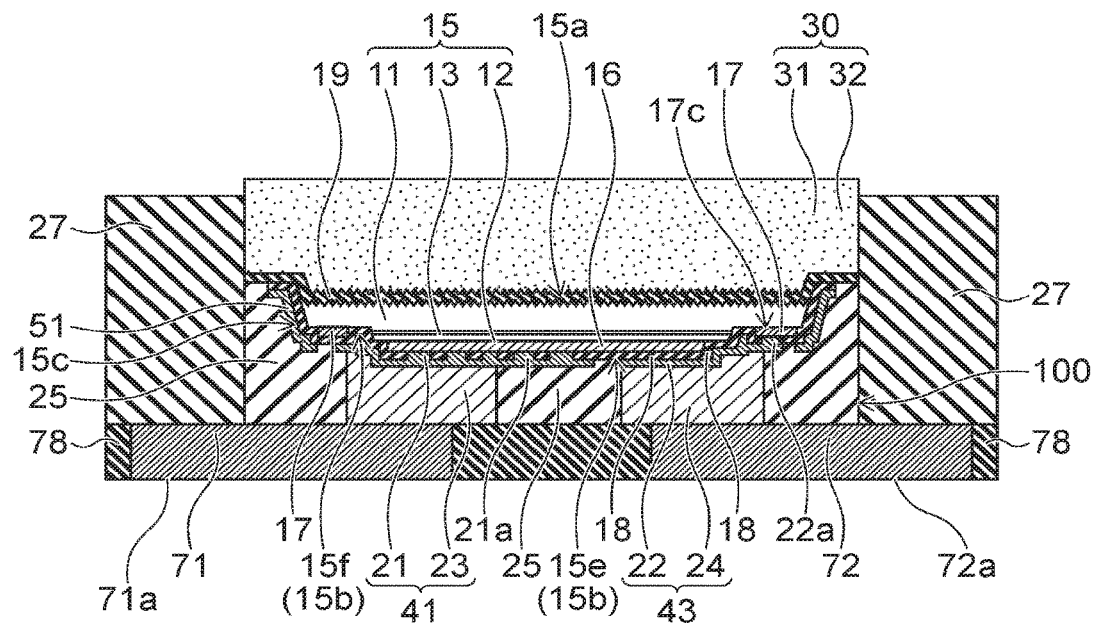
FIG. 39 is a schematic cross-sectional view of the semiconductor light emitting device of the first embodiment.
Figure 40:
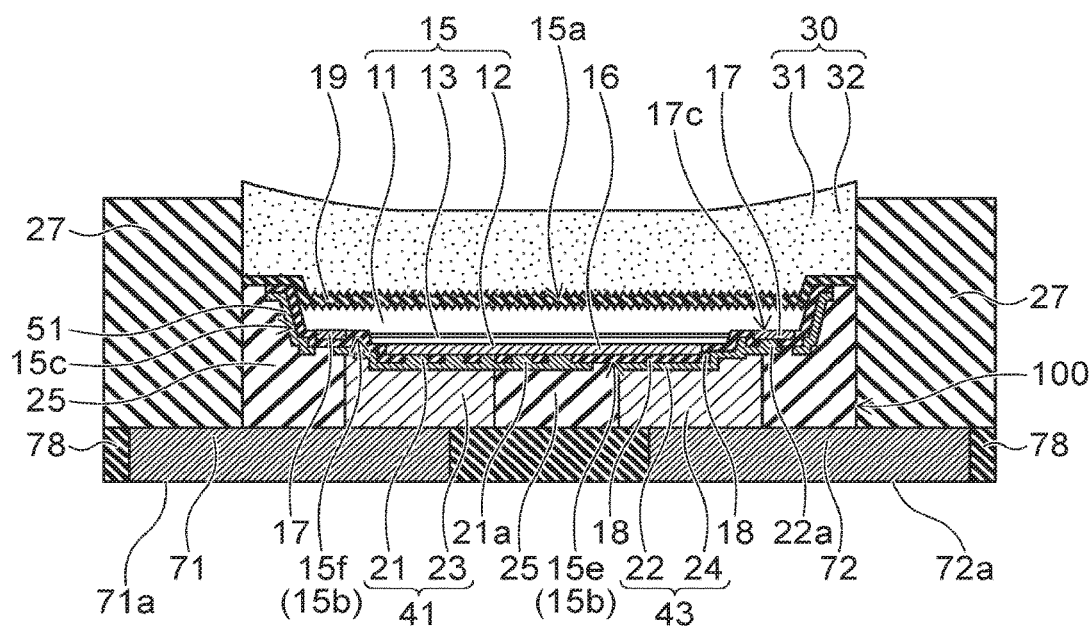
FIG. 40 is a schematic cross-sectional view of the semiconductor light emitting device of the first embodiment.

As shown in FIG. 16, a transparent layer 33 (a first layer) is provided as one body on the insulating member 27 and on the fluorescer layer 30. The transparent layer 33 is provided across a region between the insulating member 27 and the fluorescer layer 30. The insulating member 27 upper surface and the fluorescer layer 30 upper surface contact the transparent layer 33 in substantially the same plane. Here, "substantially the same plane" includes the case where a slight stepped portion, etc., occurs in the manufacturing processes as shown in FIG. 39 and FIG. 40 and refers to the conditions where the transparent layer 33 can be formed to be substantially flat due to the partial deformation of the transparent layer 33. Of course, the transparent layer 33 may be formed after planarizing the insulating member 27 upper surface and the fluorescer layer 30 upper surface simultaneously by performing a smoothing process. Also, processing in which the insulating member 27 upper surface and the fluorescer layer 30 upper surface are planarized by burying with another transparent material may be included.

The transparent layer 33 is light-transmissive. The refractive index of the transparent layer 33 is, for example, equal to or less than the refractive index of the fluorescer layer 30 and is 1 or more.

Thereby, reflections occurring at the surface of the fluorescer layer 30 due to the difference between the refractive index of the fluorescer layer 30 and the refractive index of the outside (air having a refractive index of 1) can be suppressed; and the loss that is due to the light that is reflected by the fluorescer layer 30 surface, travels toward the inner side of the fluorescer layer 30, contacts the fluorescers 31, and is partially absorbed can be reduced. In other words, it is possible for the light extraction efficiency to be higher than direct light emission from the fluorescer layer 30 by enlarging the light emitting surface area by causing the light traveling from the fluorescer layer 30 toward the outside to proceed into the transparent layer 33 and by emitting the light from the transparent layer surface and side surface.

Figure 41:
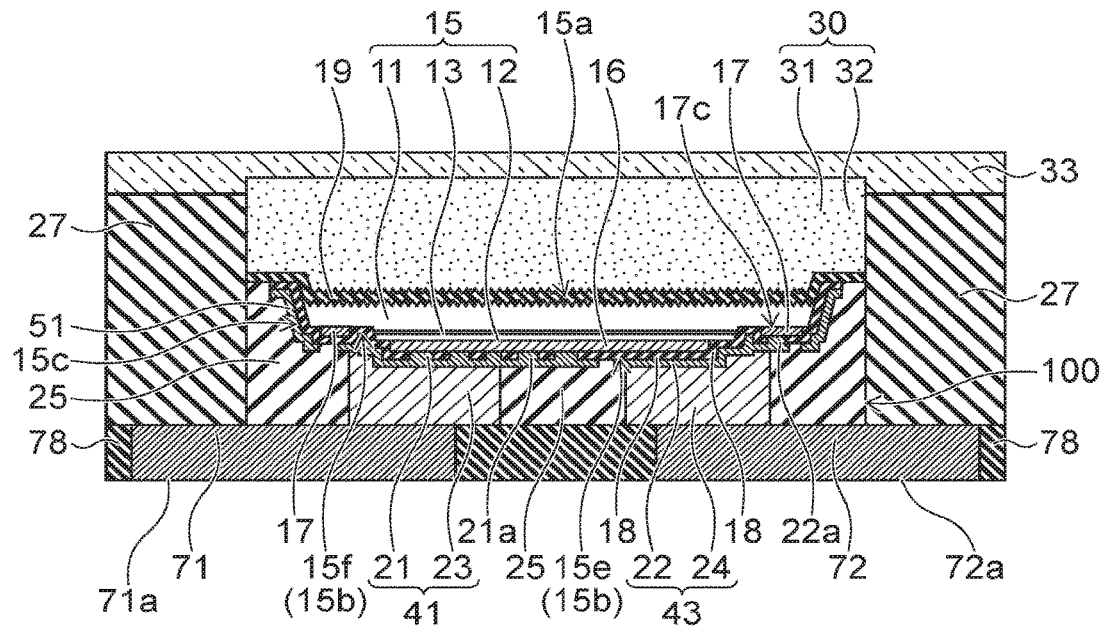
FIG. 41 is a schematic cross-sectional view of the semiconductor light emitting device of the fifth embodiment.
Figure 42:
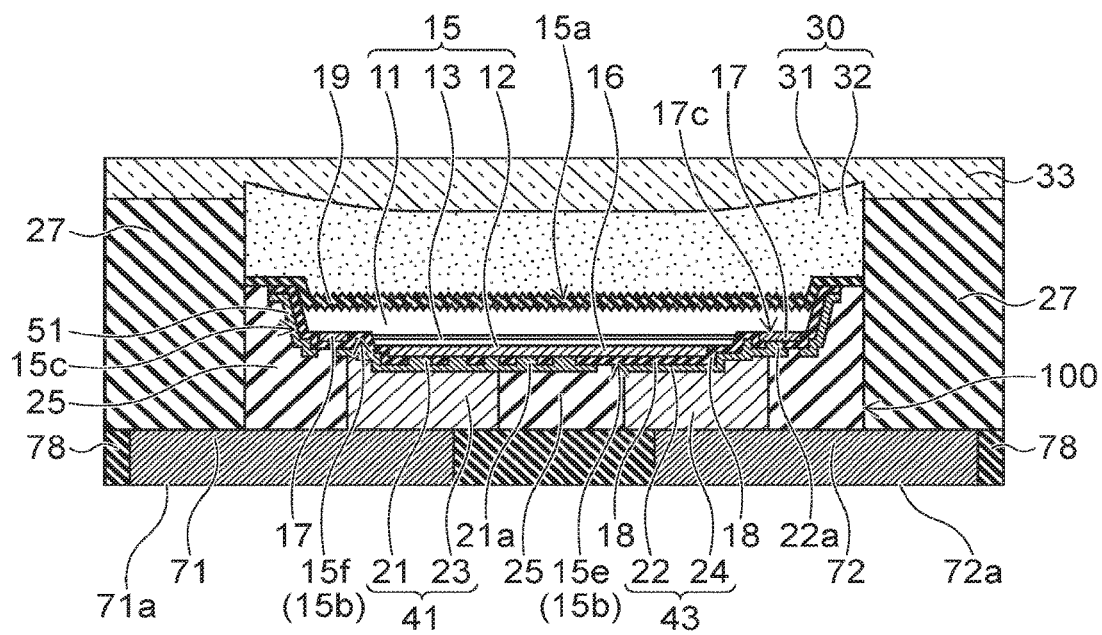
FIG. 42 is a schematic cross-sectional view of the semiconductor light emitting device of the fifth embodiment.

For example, similarly to FIG. 39 and FIG. 40 described above, the upper surface of the fluorescer layer 30 may have the configurations shown in FIG. 41 and FIG. 42. Thereby, a protrusion that has an acute angle is formed at the end portion of the fluorescer layer 30; it is easy to extract light even at wide angles; and it is possible to increase the light extraction efficiency. Because the corner of the fluorescer layer 30 is pressed into the transparent layer 33, the bonding strength is higher for both. Thereby, it is possible to suppress peeling of the transparent layer 33. By utilizing this configuration, it is also possible to control the orientation of the light emitted from the fluorescer layer 30.

In the first direction, at least the end portion of the upper surface of the fluorescer layer 30 may be provided at a height that is equal to or higher than the upper surface of the insulating member 27. Thereby, the obstruction of the light extraction by the insulating member 27 can be minimized. In the embodiment described below as well, there are cases where the transparent layer 33 is provided on the fluorescer layer 30. In such a case as well, the fluorescer layer 30 can have the configurations shown in FIG. 41 and FIG. 42; and it is possible to obtain the effects described above.

Figure 17:
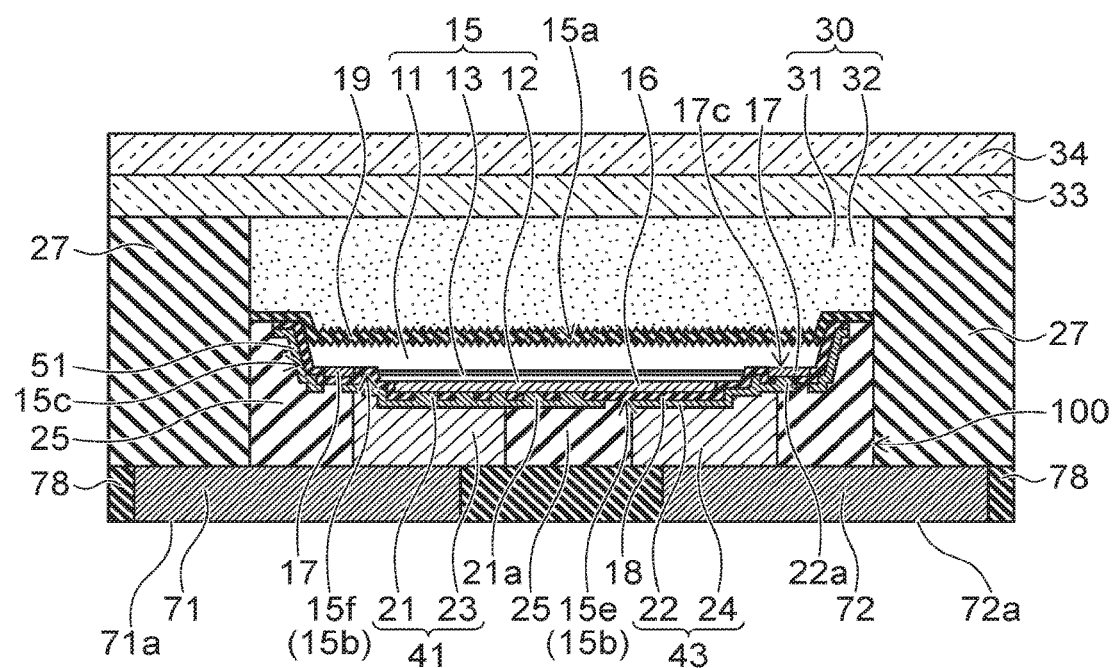
FIG. 17 is a schematic cross-sectional view of the semiconductor light emitting device of the fifth embodiment.

As shown in FIG. 17, for example, a substrate 34 that is light-transmissive may be provided on the transparent layer 33. The substrate 34 may include, for example, glass and may include soda glass, borosilicate glass, quartz glass, etc. Thereby, the rigidity of the entire semiconductor light emitting device is increased; and damage due to temperature fluctuation, external stress, etc., can be suppressed. In other words, the reliability of the semiconductor light emitting device can be increased.

It goes without saying that a configuration may be added in which the surface reflections are reduced by performing unevenness processing, low-refractive index transparent layer coating, etc., of the surface of the substrate 34.

For example, a not-shown transparent resin may be stacked on the substrate 34. The refractive index of the transparent resin is equal to or less than the refractive index of the substrate 34 and is 1 or more. Thereby, it is possible to increase the light extraction efficiency. The transparent resin may be a stack of different materials; and the number of stacks of the transparent resin is arbitrary.

Figure 43:
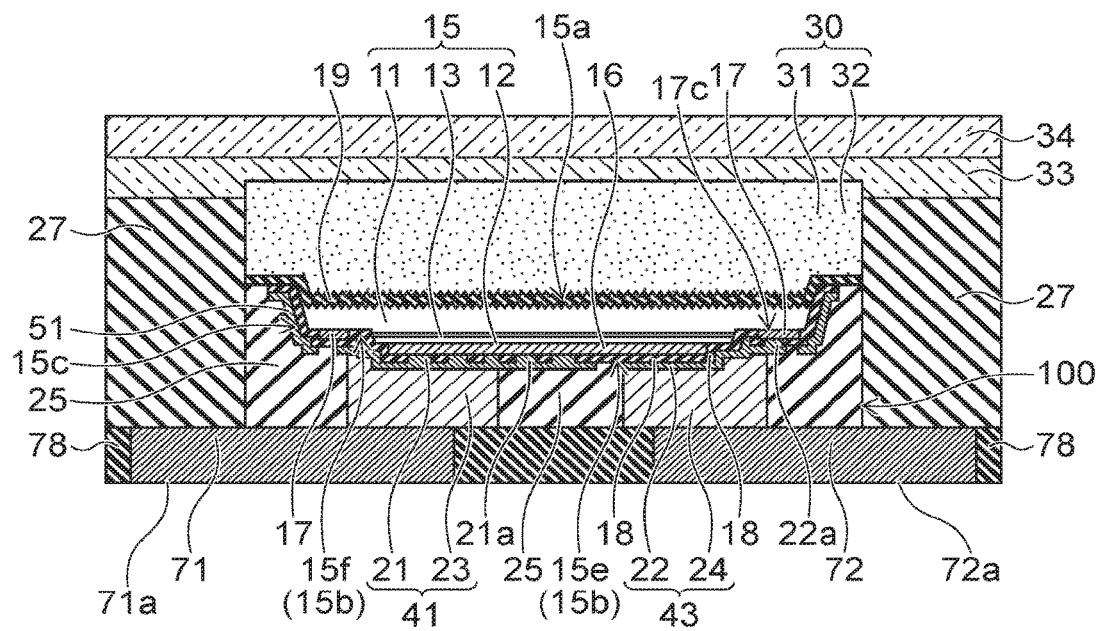
FIG. 43 is a schematic cross-sectional view of the semiconductor light emitting device of the fifth embodiment.
Figure 44:
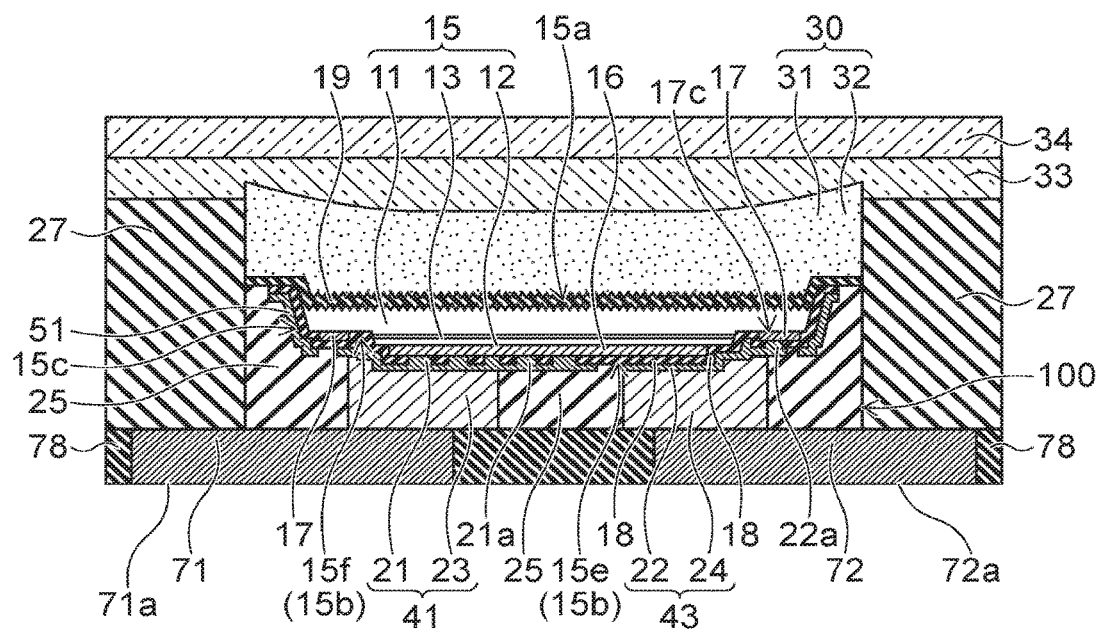
FIG. 44 is a schematic cross-sectional view of the semiconductor light emitting device of the fifth embodiment.

For example, similarly to FIG. 39 and FIG. 40 described above, the upper surface of the fluorescer layer 30 may have the configurations shown in FIG. 43 and FIG. 44. Thereby, a protrusion that has an acute angle is formed at the end portion of the fluorescer layer 30; it is easy to extract light even at wide angles; and it is possible to increase the light extraction efficiency. Because the corner of the fluorescer layer 30 is pressed into the transparent layer 33, the bonding strength is higher for both. Thereby, it is possible to suppress the peeling of the transparent layer 33. By utilizing this configuration, it is also possible to control the orientation of the light emitted from the fluorescer layer 30.

In the first direction, at least the end portion of the upper surface of the fluorescer layer 30 may be provided at a height that is equal to or higher than the upper surface of the insulating member 27. Thereby, the obstruction of the light extraction by the insulating member 27 can be minimized. In the embodiment described below as well, there are cases where the transparent layer 33 and the substrate 34 are provided on the fluorescer layer 30. In such a case as well, the fluorescer layer 30 may have the configurations shown in FIG. 43 and FIG. 44; and it is possible to obtain the effects described above.

A method for manufacturing the semiconductor light emitting device of the embodiment will now be described with reference to FIG. 18A and FIG. 18B.

In the method for manufacturing the semiconductor light emitting device of the embodiment, the processes up to the singulation of the multiple semiconductor chips 3 are similar to the processes shown in FIG. 3A to FIG. 7B; and a description is therefore omitted.

As shown in FIG. 18A, the singulated multiple semiconductor chips 3 are rearranged on the transparent layer 33 formed on the substrate 34. The fluorescer layer 30 contacts the transparent layer 33.

As shown in FIG. 18B, the insulating member 27 is formed as one body on the surfaces of the multiple semiconductor chips 3. The insulating member 27 is formed as one body between the multiple semiconductor chips 3. The insulating member 27 contacts the side surface of the fluorescer layer 30, the side surface and lower surface of the resin layer 25, and the lower surfaces of the first interconnect units 41 and 43.

Then, a portion of the insulating member 27 is caused to recede. Thereby, the exposed surfaces of the resin layer 25 and the first interconnect units 41 and 43 are formed in the same plane as the surface of the receded insulating member 27.

Subsequently, similarly to the manufacturing method described above, the interconnects 71 and 72, etc., are formed; and the singulated multiple semiconductor chips 3 are formed. Thereby, the semiconductor light emitting device of the embodiment is formed. A support body that is not light-transmissive may be used instead of the substrate 34. In such a case, the semiconductor light emitting device shown in FIG. 16 is formed by removing the support body.

According to the embodiment, similarly to the embodiment described above, the insulating member 27 includes a material that is different from the resin layer 25. Thereby, the characteristics that are necessary for the mounting surface side and the characteristics that are necessary for the side surface side of the fluorescer layer 30 can be provided simultaneously; and it is possible to provide a semiconductor light emitting device having excellent optical characteristics.

In addition to the description recited above, according to the embodiment, the transparent layer 33 is provided on the insulating member 27 and on the fluorescer layer 30. Thereby, the light that is emitted from the fluorescer layer 30 to the outside travels via a substance in which the refractive index decreases in steps. Therefore, the light extraction efficiency of the radiated light can be increased.

According to the embodiment, the substrate 34 is provided on the transparent layer 33. Thereby, the light extraction efficiency of the radiated light can be increased further. In the case where a thick film of glass is used as the substrate 34, the strength of the device can be increased. In other words, it is possible to provide a semiconductor light emitting device that has excellent optical characteristics and physical strength.

Sixth Embodiment

Examples of the configurations of semiconductor light emitting devices of the embodiment will now be described with reference to FIG. 19 to FIG. 22.

The main difference between the embodiment and the embodiment described above is the material of the insulating member. Therefore, a description is partially omitted for portions similar to those of the embodiment described above.

Figure 19:
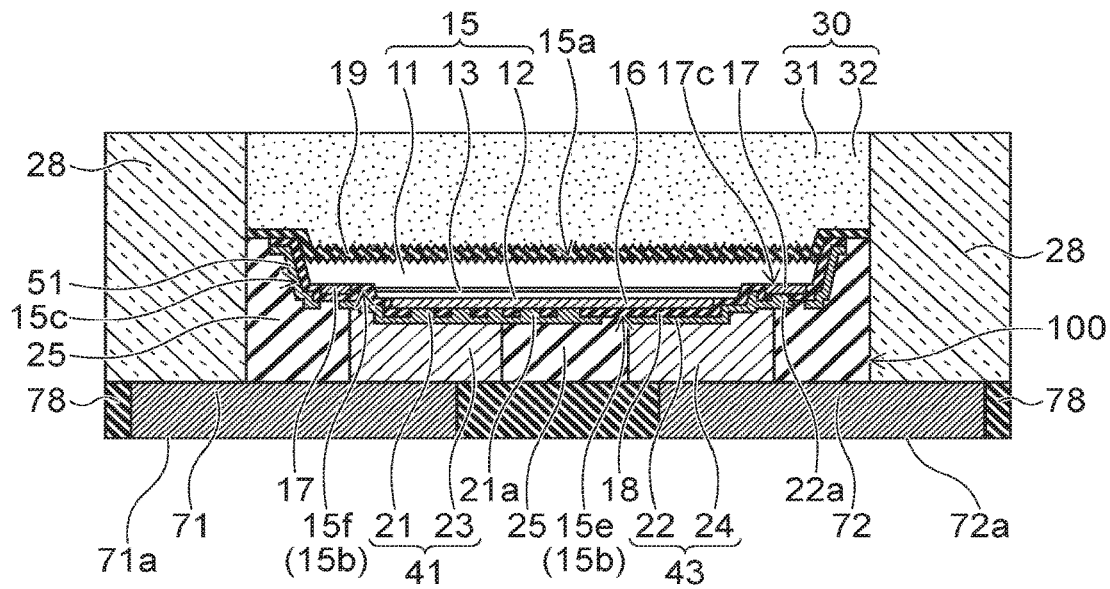
FIG. 19 is a schematic cross-sectional view of the semiconductor light emitting device of a sixth embodiment.

As shown in FIG. 19, an insulating member 28 is provided in the region outside the chip on the outer side of the side surface of the resin layer 25. A material that is light-transmissive is used as the insulating member 28. The material of the insulating member 28 may include, for example, various resin materials such as a silicone resin, an epoxy resin, a polycarbonate resin, etc. Thereby, the absorption loss of the radiated light at the side surface of the fluorescer layer 30 and the side surface of the support body 100 is suppressed; and the light extraction efficiency of the radiated light increases.

For example, there are cases where an insulating member that is light-reflective is used at the side surface of the fluorescer layer 30 and the side surface of the support body 100. In such a case, there is a possibility that the reflectance may be about 90% and the light absorption may be about 10%. Also, optical confinement may occur due to the configuration of the material. Therefore, the light amount that is extracted to the outside may be 90% of the radiated light or less. In other words, the total luminous flux may decrease due to the insulating member. There may be a risk of an increase of the amount of heat generated due to the light absorption and degradation of the material.

Conversely, according to the embodiment, the insulating member 28 that is light-transmissive is used. For example, in the case where the material that is light-transmissive has a thickness of 100 μm, the transmittance for light of a visible light region 380 nm to 780 nm is 95% or more. Therefore, the absorption loss can be suppressed; and it is possible to increase the light extraction efficiency of the radiated light.

By using the insulating member 28 that is light-transmissive at the side surface of the fluorescer layer 30, it is possible to widen the light distribution angle of the device. It is possible to suppress the decrease of the amount of heat generated and the degradation of the material as the light absorption decreases.

For example, instead of being light-shielding, the resin layer 25 is light-reflective. Thereby, the absorption loss of the radiated light by the resin layer 25 is suppressed; and the light extraction efficiency of the radiated light increases further. In other words, by using the insulating member 28 that is light-transmissive, it is possible to reduce the loss of the luminous flux at the emission surface of the radiated light.

Figure 20:
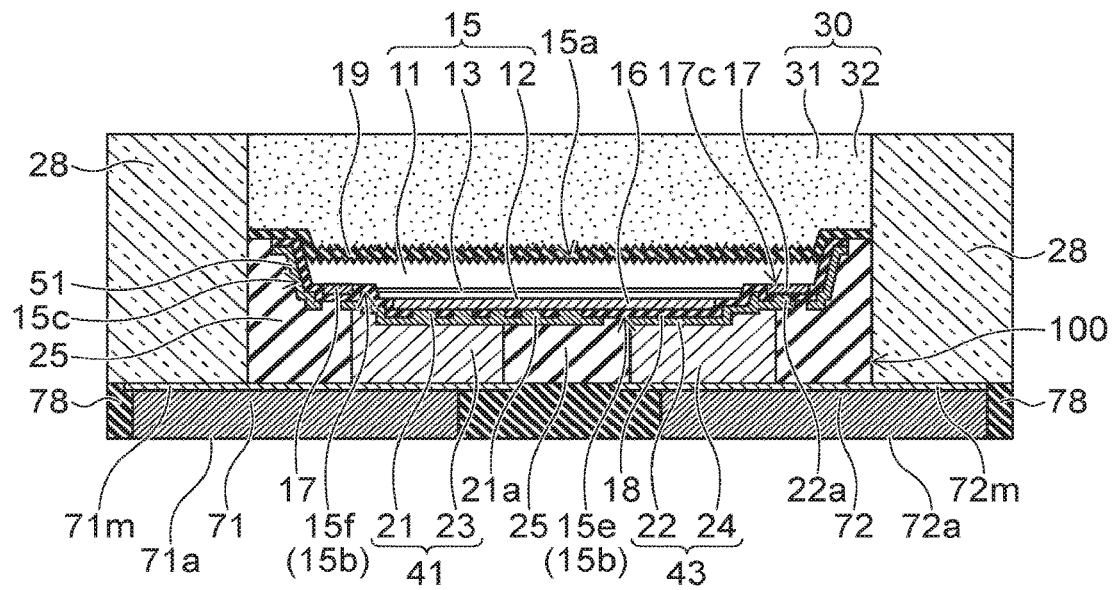
FIG. 20 is a schematic cross-sectional view of the semiconductor light emitting device of the sixth embodiment.

In addition to the description recited above, as shown in FIG. 20, a p-side metal layer 71m (a first p-side metal layer) is provided as one body between the resin layer 25 and the p-side interconnect 71, between the insulating member 28 and the p-side interconnect 71, and between the p-side pillar 23 and the p-side interconnect 71. An n-side metal layer 72m (a first n-side metal layer) is provided as one body between the resin layer 25 and the n-side interconnect 72, between the insulating member 28 and the n-side interconnect 72, and between the n-side pillar 24 and the n-side interconnect 72. The metal layers 71m and 72m are light-reflective.

Thereby, the reflectance on the mounting surface side can be increased; and it is possible to further increase the light extraction efficiency. The first metal layers 71m and 72m are provided as one body on a portion of at least one of a portion of the first interconnect units 41 and 43 or a portion of the interconnects 71 and 72.

Figure 21:
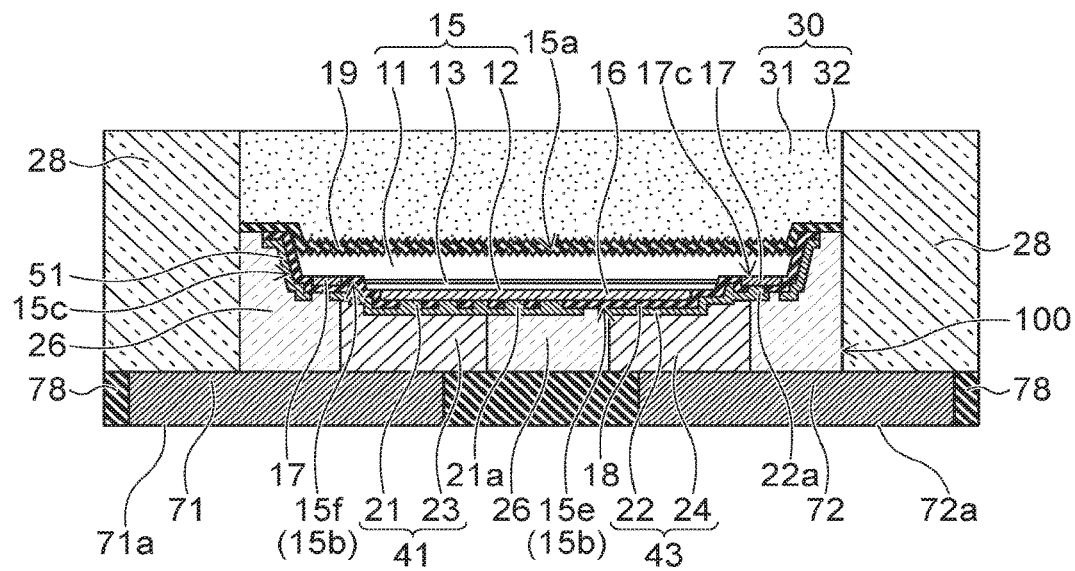
FIG. 21 is a schematic cross-sectional view of the semiconductor light emitting device of the sixth embodiment.

As shown in FIG. 21, similarly to the insulating member 28, a resin layer 26 is light-transmissive. In such a case, for example, the same multiple elements as the insulating member 28 that have different composition ratios are used as the material of the resin layer 26. Thereby, the absorption loss on the mounting surface side can be suppressed; and it is possible to further increase the light extraction efficiency of the radiated light.

Figure 22:
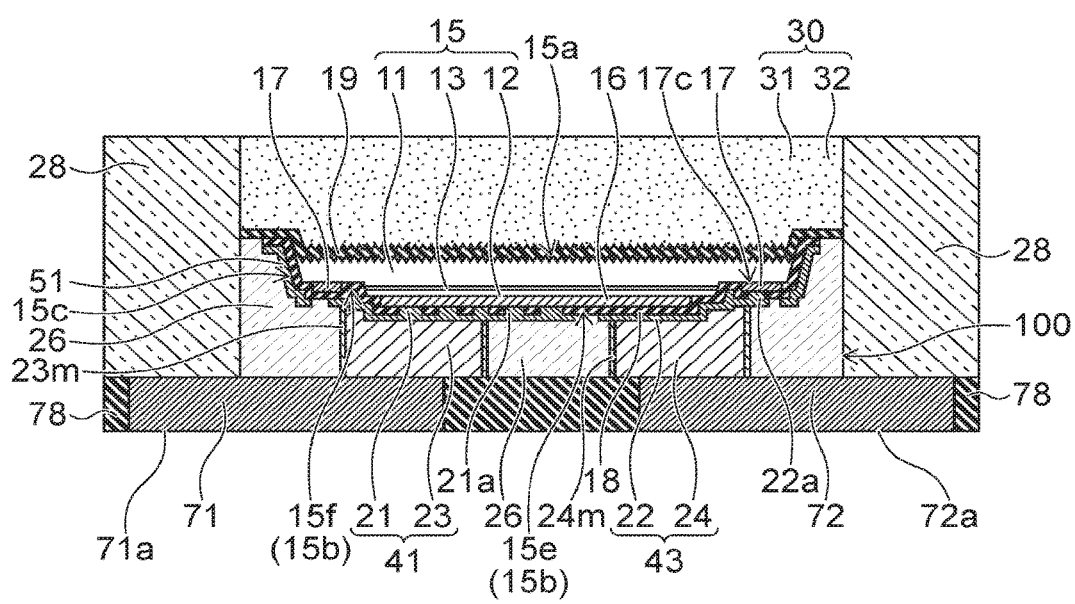
FIG. 22 is a schematic cross-sectional view of the semiconductor light emitting device of the sixth embodiment.

As shown in FIG. 22, a p-side metal layer 23m (a p-side second metal layer) is provided between the p-side pillar 23 and the resin layer 26. An n-side metal layer 24m (an n-side second metal layer) is provided between the n-side pillar 24 and the resin layer 26. The metal layers 23m and 24m are light-reflective.

Thereby, the reflectance on the mounting surface side can be increased; and it is possible to further increase the light extraction efficiency of the radiated light.

According to the embodiment, similarly to the embodiment described above, the insulating member 28 includes a material that is different from the resin layer 25. Thereby, the characteristics that are necessary for the mounting surface side and the characteristics that are necessary for the side surface side of the fluorescer layer 30 can be provided simultaneously; and it is possible to provide a semiconductor light emitting device having excellent optical characteristics.

In addition to the description recited above, according to the embodiment, the insulating member 28 that is light-transmissive is used. Thereby, the absorption loss can be suppressed; and the light extraction efficiency of the radiated light can be increased. In other words, it is possible to provide a semiconductor light emitting device having excellent optical characteristics.

Seventh Embodiment

An example of a configuration of a semiconductor light emitting device of the embodiment will now be described with reference to FIG. 23.

The main difference between the embodiment and the embodiment described above is the material and configuration of the insulating member. Therefore, a description is partially omitted for portions similar to those of the embodiment described above.

Figure 23:
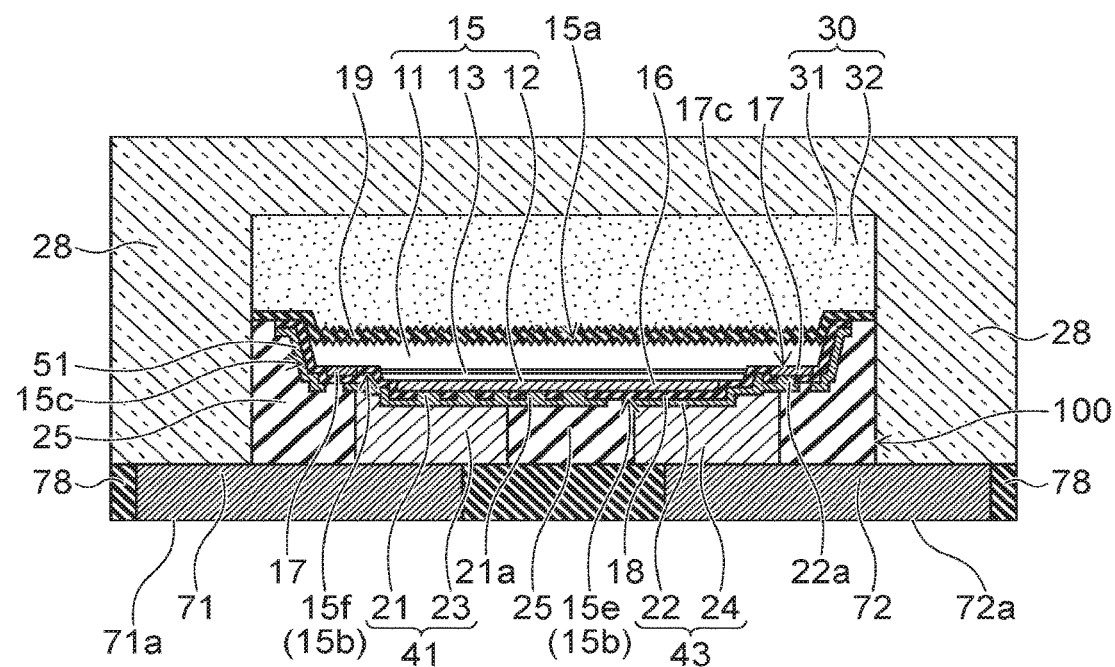
FIG. 23 is a schematic cross-sectional view of the semiconductor light emitting device of a seventh embodiment.

As shown in FIG. 23, the insulating member 28 is provided as one body from the outer side of the side surface of the fluorescer layer 30 to the upper surface of the fluorescer layer 30. The refractive index of the insulating member 28 is, for example, lower than the refractive index of the fluorescer layer 30 and is 1 or more. Thereby, the light that is emitted from the fluorescer layer 30 to the outside travels via a substance in which the refractive index decreases in steps. Therefore, the light extraction efficiency of the radiated light can be increased.

A method for manufacturing the semiconductor light emitting device of the embodiment will now be described with reference to FIG. 24A and FIG. 24B.

In the method for manufacturing the semiconductor light emitting device of the embodiment, the processes up to the singulation of the multiple semiconductor chips 3 are similar to the processes shown in FIG. 3A to FIG. 7B; and a description is therefore omitted.

As shown in FIG. 24A, the singulated multiple semiconductor chips 3 are rearranged on the support body 97. The first interconnect units 41 and 43 and the resin layer 25 contact the support body 97. Subsequently, the insulating member 28 is formed as one body on the surfaces of the multiple semiconductor chips 3. The insulating member 28 is formed as one body between the multiple semiconductor chips 3. The insulating member 28 contacts the side surface and upper surface of the fluorescer layer 30 and the side surface of the resin layer 25. Because the first interconnect units 41 and 43 and the resin layer 25 are provided on the support body 97 side, the process recited above is desirable in that it is unnecessary to perform the process of causing the insulating member 28 to recede to expose the pillars.

As shown in FIG. 24B, the multiple semiconductor chips 3 are transferred from the support body 97 to the support body 98. At this time, the insulating member 28 contacts the support body 98.

Subsequently, similarly to the manufacturing method described above, the interconnects 71 and 72, etc., are formed; and the singulated multiple semiconductor chips 3 are formed. Thereby, the semiconductor light emitting device of the embodiment is formed.

According to the embodiment, similarly to the embodiment described above, the insulating member 28 includes a material that is different from the resin layer 25. Thereby, the characteristics that are necessary for the mounting surface side and the characteristics that are necessary for the side surface side of the fluorescer layer 30 can be provided simultaneously; and it is possible to provide a semiconductor light emitting device having excellent optical characteristics.

In addition to the description recited above, according to the embodiment, the insulating member 28 that is light-transmissive is used. Thereby, the absorption loss can be suppressed; and the light extraction efficiency of the radiated light can be increased. In other words, it is possible to provide a semiconductor light emitting device having excellent optical characteristics.

The insulating member 28 is provided as one body from the outer side of the side surface of the fluorescer layer 30 to the upper surface of the fluorescer layer 30. Thereby, the light extraction efficiency of the radiated light can be increased further. In other words, it is possible to provide a semiconductor light emitting device having excellent optical characteristics.

Eighth Embodiment

Examples of the configurations of semiconductor light emitting devices of the embodiment will now be described with reference to FIG. 25 and FIG. 26.

The main difference between the embodiment and the embodiment described above is the configuration of the insulating member. Therefore, a description is partially omitted for portions similar to those of the embodiment described above.

Figure 25:
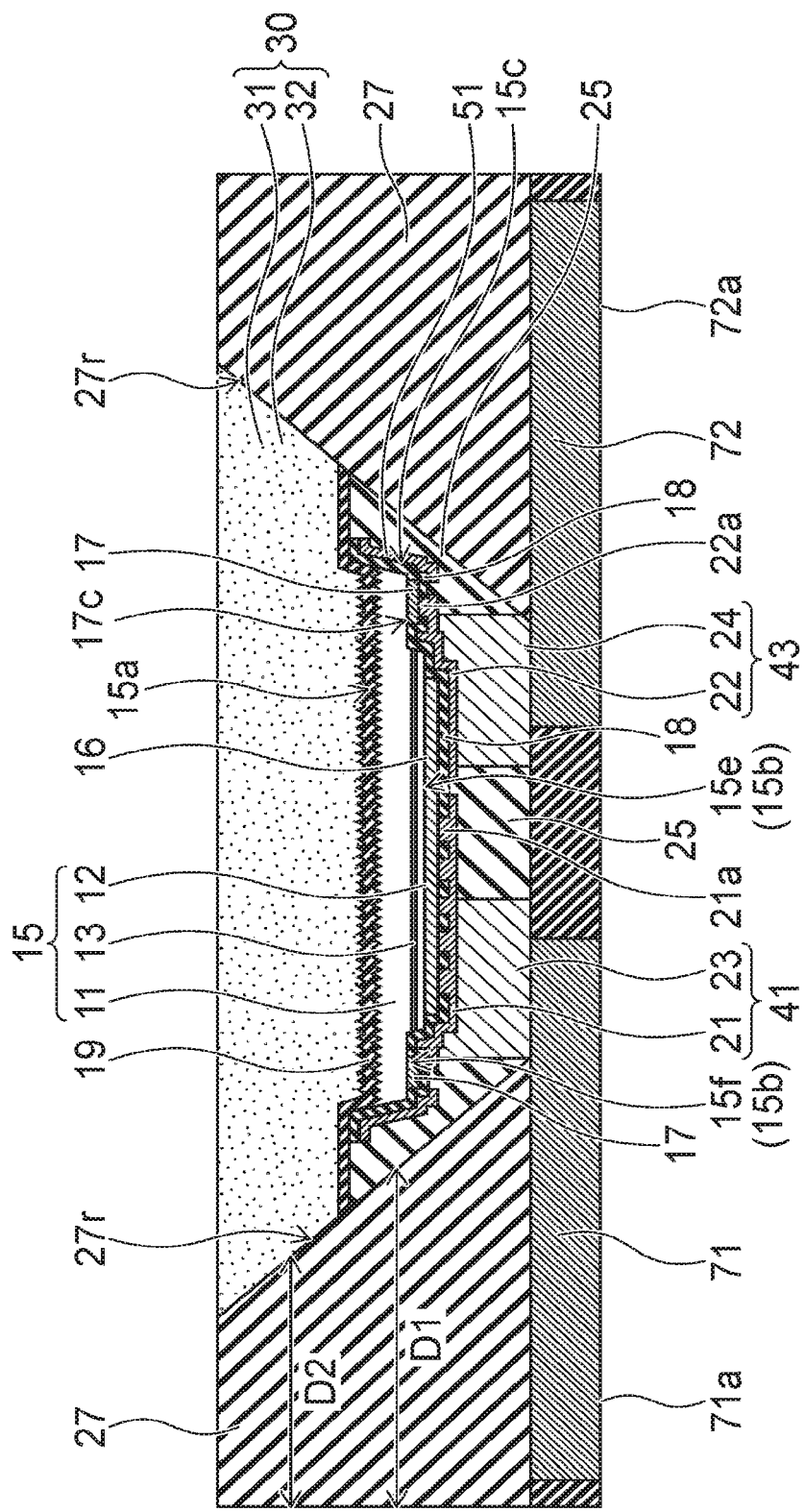
FIG. 25 is a schematic cross-sectional view of the semiconductor light emitting device of an eighth embodiment.

As shown in FIG. 25, the insulating member 27 includes a tilted portion 27r. The tilted portion 27r contacts the side surface of the resin layer 25 and the side surface of the fluorescer layer 30.

The tilted portion 27r is tilted with respect to the first surface 15a of the semiconductor layer 15. In a second direction that intersects the first direction, a first width D1 of the insulating member 27 contacting the side surface of the resin layer 25 is wider than a second width D2 of the insulating member 27 contacting the side surface of the fluorescer layer 30.

In other words, the region that is surrounded with the insulating member 27 enlarges from the first interconnect units 41 and 43 toward the fluorescer layer 30 and has a tapered configuration. Thereby, it is possible to increase the light extraction efficiency.

For example, in the case where the side surface of the insulating member 27 is perpendicular to the lower surface of the insulating member 27, there is a possibility that the radiated light may be incident on the side surface of the insulating member 27; and optical confinement may occur. Also, there is a possibility that the radiated light that is reflected on the insulating member 27 may be incident on the semiconductor layer 15 side and may be absorbed as returning light. Thereby, the light extraction efficiency may decrease. Further, there may be a risk of an increase of the amount of heat generated due to the light absorption and degradation of the material.

Conversely, according to the embodiment, the insulating member 27 includes the tilted portion 27r; and the tilted portion 27r has an acute angle with respect to the lower surface of the insulating member 27. Thereby, the occurrence of the optical confinement at the side surface of the insulating member 27 can be suppressed; the reflection direction of the radiated light can be promoted to be toward the light extraction surface side; and it is possible to increase the light extraction efficiency. It is possible to suppress the light returning to the semiconductor layer 15 side. The amount of heat generated can be reduced as the light absorption decreases.

The angle of the tilted portion 27r with respect to the lower surface of the insulating member 27 is, for example, less than 30 degrees. Thereby, it is possible to further increase the light extraction efficiency.

Figure 26:
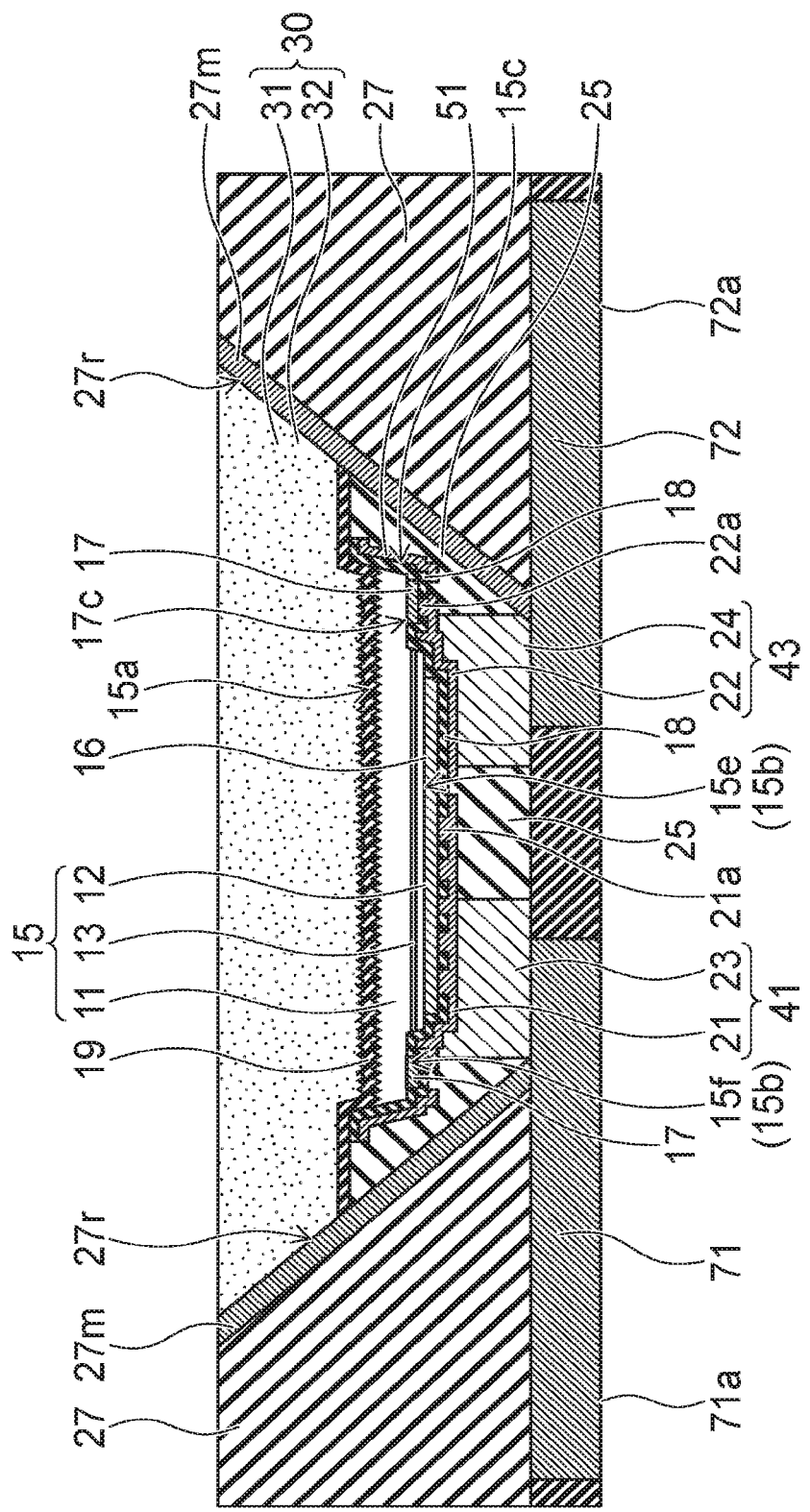
FIG. 26 is a schematic cross-sectional view of the semiconductor light emitting device of the eighth embodiment.

In addition to the description recited above, as shown in FIG. 26, a metal layer 27m that is light-reflective may be provided on the tilted portion 27r. Thereby, the radiated light reflectance at the side surface of the insulating member 27 can be improved; and it is possible to further increase the light extraction efficiency.

A method for manufacturing the semiconductor light emitting device of the embodiment will now be described with reference to FIG. 27A and FIG. 27B.

In the method for manufacturing the semiconductor light emitting device of the embodiment, the processes prior to the singulation of the multiple semiconductor chips 3 are similar to the processes shown in FIG. 3A to FIG. 7A; and a description is therefore omitted.

As shown in FIG. 27A, the multiple semiconductor chips 3 are supported by the support body 95. Subsequently, the resin layer 25, the insulating layer 19, and the fluorescer layer 30 are cut (diced). At this time, the side surface of the semiconductor chip 3 is formed to be tilted with respect to the first surface 15a of the semiconductor layer 15. In other words, dicing is performed in a tapered configuration. Therefore, the volume where the resin layer 25 is removed is larger than the volume where the fluorescer layer 30 is removed.

As shown in FIG. 27B, the singulated multiple semiconductor chips 3 are rearranged on the support body 96. The fluorescer layer 30 contacts the support body 96.

Subsequently, the insulating member 27 is formed as one body on the surfaces of the multiple semiconductor chips 3. The insulating member 27 is formed as one body between the multiple semiconductor chips 3.

The tilted portion 27r is formed at the side surface of the insulating member 27. The tilted portion 27r contacts the side surface of the fluorescer layer 30 and the side surface of the resin layer 25. In other words, the insulating member 27 includes the tilted portion 27r contacting the side surfaces of the multiple semiconductor chips 3.

Subsequently, similarly to the manufacturing method described above, the interconnects 71 and 72, etc., are formed; and the singulated multiple semiconductor chips 3 are formed. Thereby, the semiconductor light emitting device of the embodiment is formed.

According to the embodiment, similarly to the embodiment described above, the insulating member 28 includes a material that is different from the resin layer 25. Thereby, the characteristics that are necessary for the mounting surface side and the characteristics that are necessary for the side surface side of the fluorescer layer 30 can be provided simultaneously; and it is possible to provide a semiconductor light emitting device having excellent optical characteristics.

In addition to the description recited above, according to the embodiment, the tilted portion 27r is formed at the side surface of the insulating member 27. The tilted portion 27r has an acute angle with respect to the lower surface of the insulating member 27. Thereby, the occurrence of the optical confinement at the side surface of the insulating member 27 can be suppressed; the reflection direction of the radiated light can be promoted to be toward the light extraction surface side; and it is possible to increase the light extraction efficiency. In other words, it is possible to provide a semiconductor light emitting device having excellent optical characteristics.

Ninth Embodiment

Examples of the configurations of semiconductor light emitting devices of the embodiment will now be described with reference to FIG. 28 and FIG. 29.

The main difference between the embodiment and the embodiment described above is the configurations of the insulating member and the fluorescer layer. Therefore, a description is partially omitted for portions similar to those of the embodiment described above.

Figure 28:
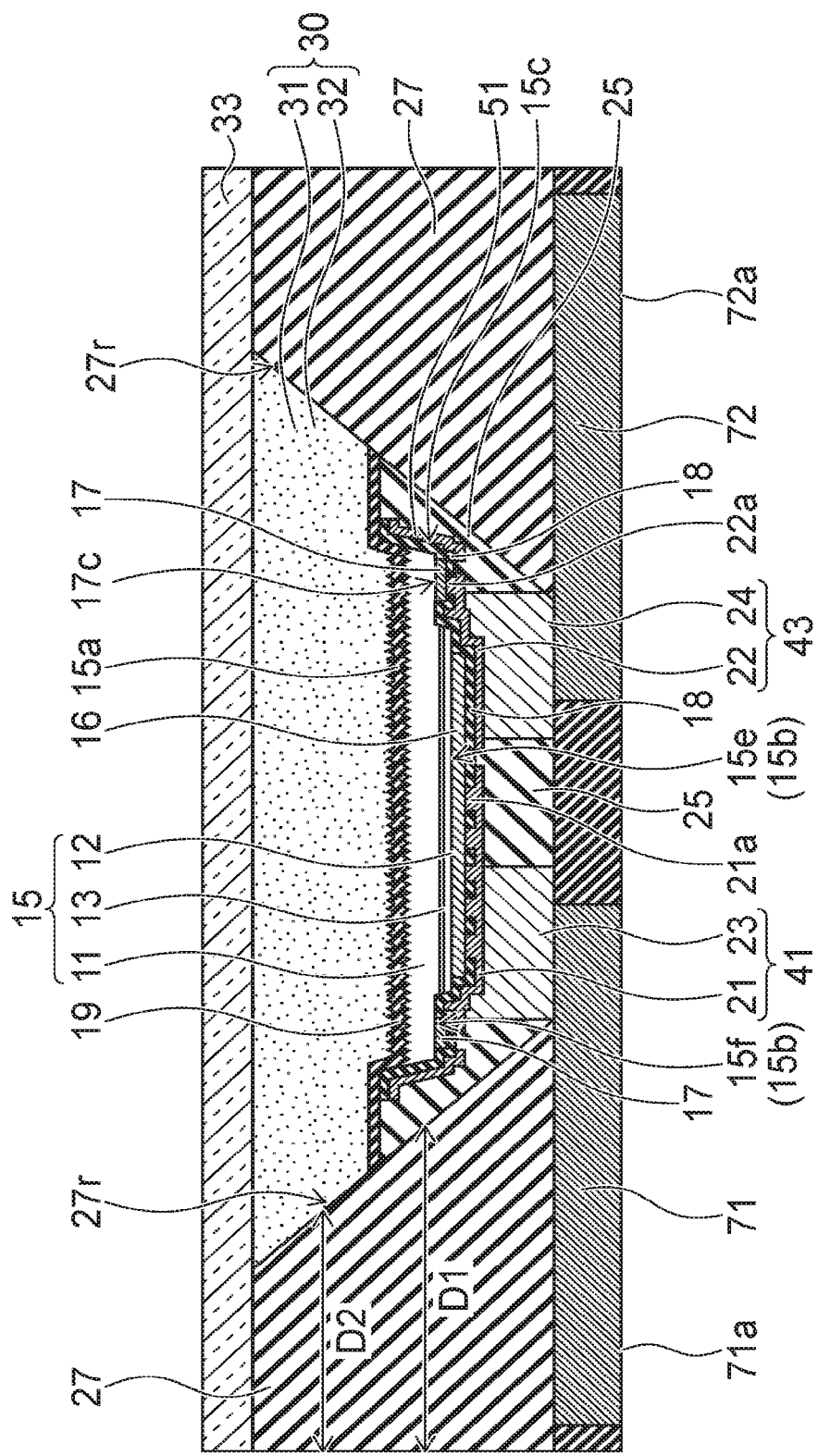
FIG. 28 is a schematic cross-sectional view of the semiconductor light emitting device of a ninth embodiment.

As shown in FIG. 28, the transparent layer 33 is provided as one body on the insulating member 27 and on the fluorescer layer 30. The transparent layer 33 is provided across the tilted portion 27r of the insulating member 27. For example, the insulating member 27 upper surface and the fluorescer layer 30 upper surface contact the transparent layer 33 in the same plane.

The transparent layer 33 is light-transmissive. The refractive index of the transparent layer 33 is, for example, lower than the refractive index of the fluorescer layer 30 and is 1 or more.

The insulating member 27 includes the tilted portion 27r. The tilted portion 27r contacts the side surface of the resin layer 25 and the side surface of the fluorescer layer 30.

Figure 29:
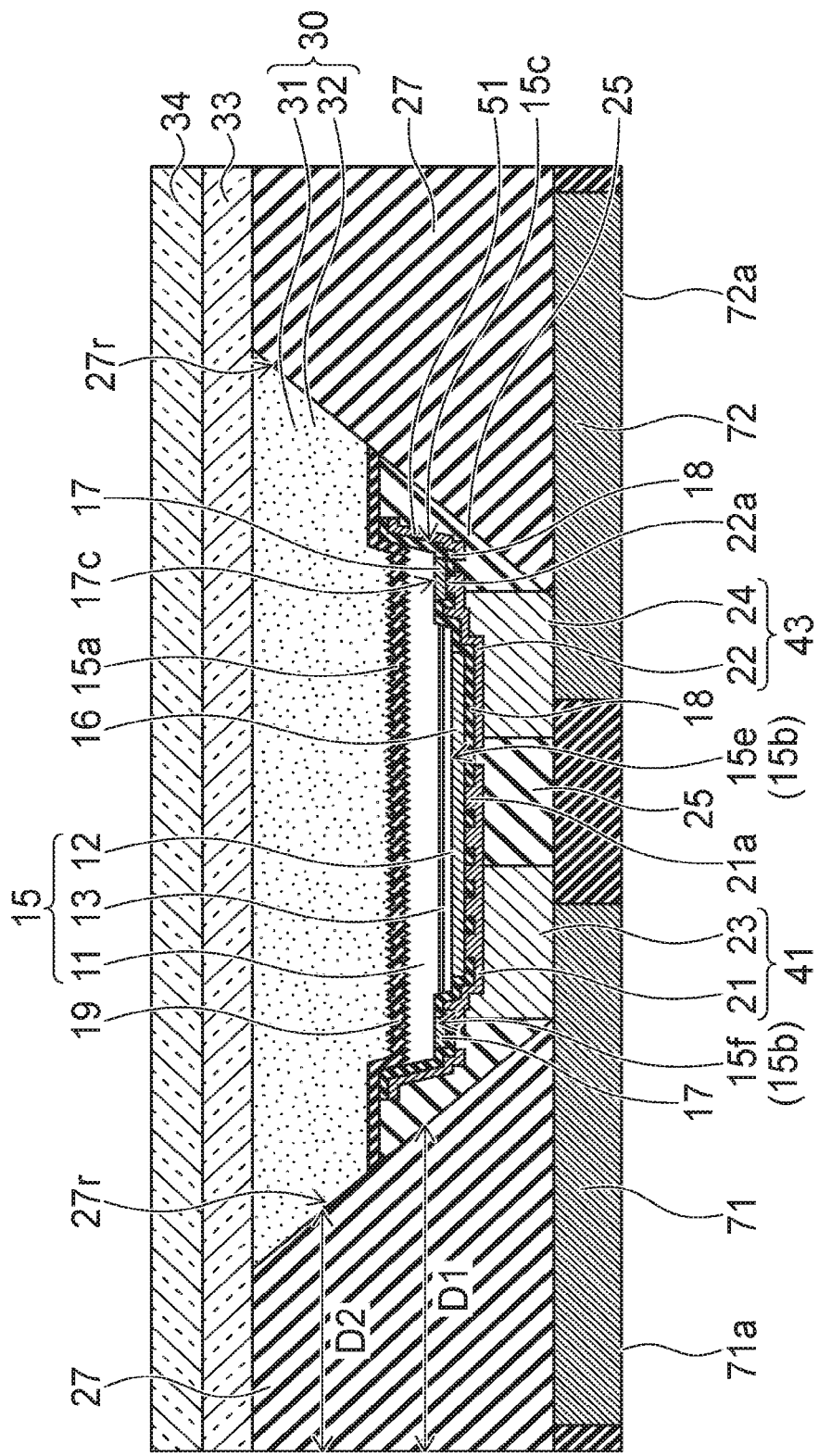
FIG. 29 is a schematic cross-sectional view of the semiconductor light emitting device of the ninth embodiment.

As shown in FIG. 29, for example, the substrate 34 is provided on the transparent layer 33. The substrate 34 is light-transmissive. The refractive index of the substrate 34 is, for example, not greater than the refractive index of the transparent layer 33. The substrate 34 includes, for example, the glass described above.

According to the embodiment, similarly to the embodiment described above, the insulating member 27 includes a material that is different from the resin layer 25. Thereby, the characteristics that are necessary for the mounting surface side and the characteristics that are necessary for the side surface side of the fluorescer layer 30 can be provided simultaneously; and it is possible to provide a semiconductor light emitting device having excellent optical characteristics.

In addition to the description recited above, according to the embodiment, the transparent layer 33 is provided on the insulating member 27 and on the fluorescer layer 30. Thereby, the light that is emitted from the fluorescer layer 30 to the outside travels via a substance in which the refractive index decreases in steps. Therefore, the light extraction efficiency of the radiated light can be increased.

According to the embodiment, the substrate 34 is provided on the transparent layer 33. Thereby, the light extraction efficiency of the radiated light can be increased further. In the case where a thick film of glass is used as the substrate 34, the strength of the device can be increased. In other words, it is possible to provide a semiconductor light emitting device that has excellent optical characteristics and physical strength.

In addition to the description recited above, according to the embodiment, the tilted portion 27r is provided at the side surface of the insulating member 27. The tilted portion 27r has an acute angle with respect to the lower surface of the insulating member 27. Thereby, the occurrence of the optical confinement at the side surface of the insulating member 27 can be suppressed; the reflection direction of the radiated light can be promoted to be toward the light extraction surface side; and it is possible to increase the light extraction efficiency. In other words, it is possible to provide a semiconductor light emitting device having excellent optical characteristics.

Tenth Embodiment

An example of the configuration of a semiconductor light emitting device of the embodiment will now be described with reference to FIG. 30.

The main difference between the embodiment and the embodiment described above is the material and configuration of the insulating member. Therefore, a description is partially omitted for portions similar to those of the embodiment described above.

Figure 30:
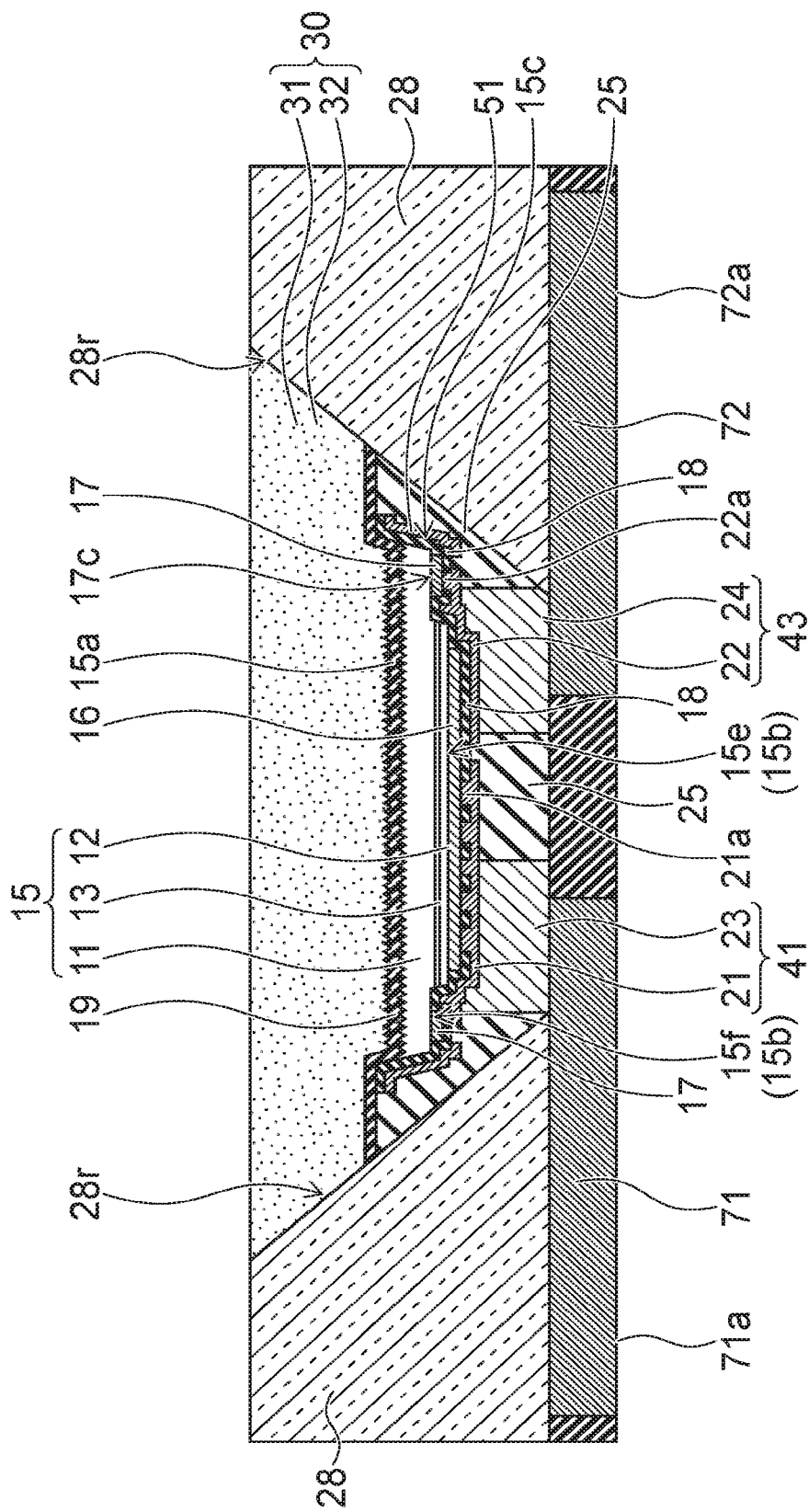
FIG. 30 is a schematic cross-sectional view of the semiconductor light emitting device of a tenth embodiment.

As shown in FIG. 30, the insulating member 28 is provided in the region outside the chip on the outer side of the side surface of the resin layer 25. A material that is light-transmissive is used as the insulating member 28.

The insulating member 28 includes a tilted portion 28r. The tilted portion 28r contacts the side surface of the resin layer 25 and the side surface of the fluorescer layer 30.

According to the embodiment, similarly to the embodiment described above, the insulating member 28 includes a material that is different from the resin layer 25. Thereby, the characteristics that are necessary for the mounting surface side and the characteristics that are necessary for the side surface side of the fluorescer layer 30 can be provided simultaneously; and it is possible to provide a semiconductor light emitting device having excellent optical characteristics.

In addition to the description recited above, according to the embodiment, the insulating member 28 that is light-transmissive is used. Thereby, the absorption loss can be suppressed; and the light extraction efficiency of the radiated light can be increased. In other words, it is possible to provide a semiconductor light emitting device having excellent optical characteristics.

In addition to the description recited above, according to the embodiment, the tilted portion 28r is formed at the side surface of the insulating member 28. The tilted portion 28r has an acute angle with respect to the lower surface of the insulating member 28. Thereby, the occurrence of the optical confinement at the side surface of the insulating member 28 can be suppressed; the reflection direction of the radiated light can be promoted to be toward the light extraction surface side; and it is possible to increase the light extraction efficiency.

Eleventh Embodiment

An example of the configuration of a semiconductor light emitting device of the embodiment will now be described with reference to FIG. 31.

The main difference between the embodiment and the embodiment described above is the material and configuration of the insulating member. Therefore, a description is partially omitted for portions similar to those of the embodiment described above.

Figure 31:
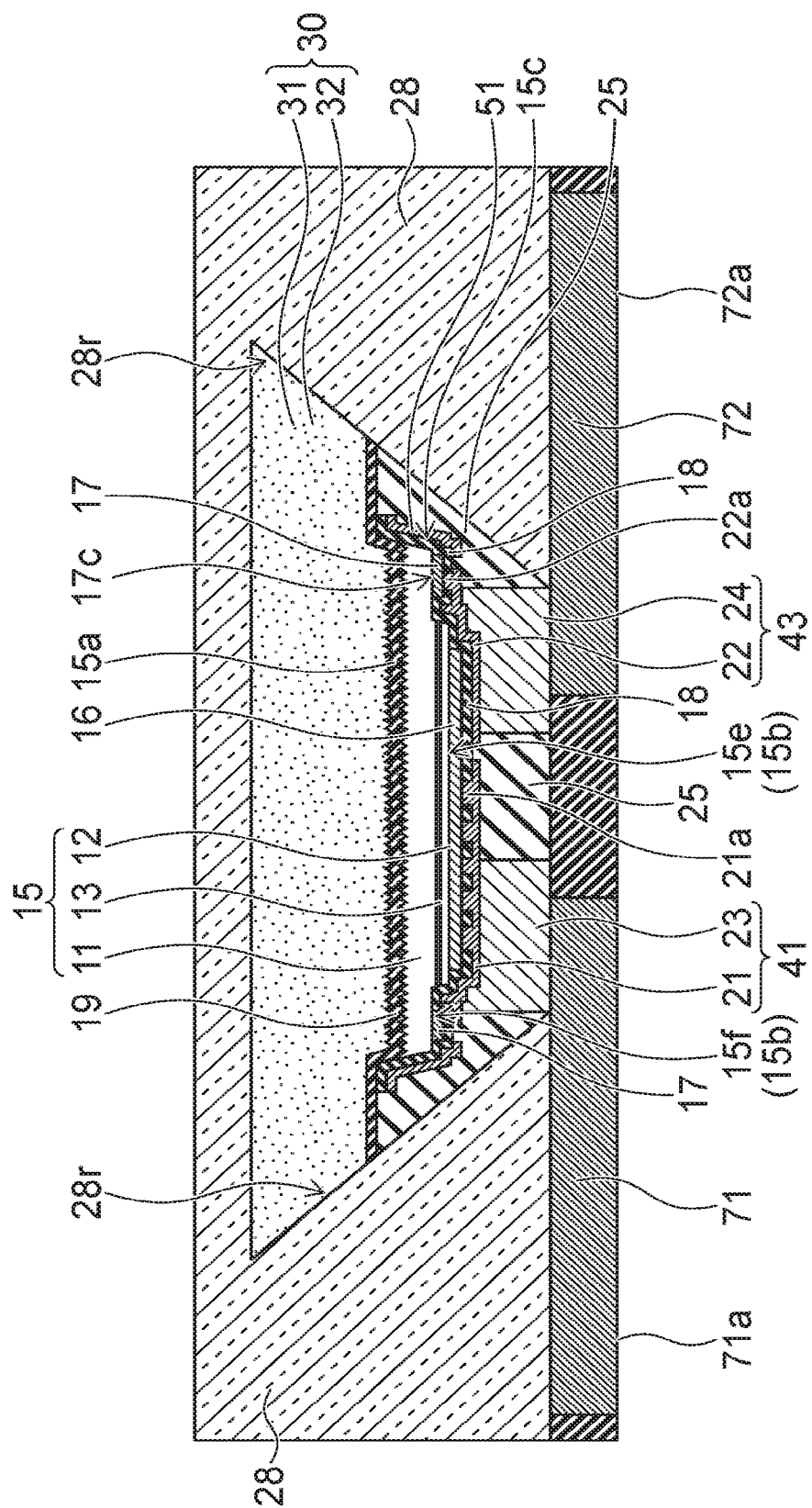
FIG. 31 is a schematic cross-sectional view of the semiconductor light emitting device of a eleventh embodiment.

As shown in FIG. 31, the insulating member 28 is provided in the region outside the chip on the outer side of the side surface of the resin layer 25. The insulating member 28 is provided as one body from the outer side of the side surface of the fluorescer layer 30 to the upper surface of the fluorescer layer 30. A material that is light-transmissive is used as the insulating member 28.

The insulating member 28 includes the tilted portion 28r. The tilted portion 28r contacts the side surface of the resin layer 25 and the side surface of the fluorescer layer 30.

According to the embodiment, similarly to the embodiment described above, the insulating member 28 includes a material that is different from the resin layer 25. Thereby, the characteristics that are necessary for the mounting surface side and the characteristics that are necessary for the side surface side of the fluorescer layer 30 can be provided simultaneously; and it is possible to provide a semiconductor light emitting device having excellent optical characteristics.

In addition to the description recited above, according to the embodiment, the insulating member 28 that is light-transmissive is used. Thereby, the absorption loss can be suppressed; and the light extraction efficiency of the radiated light can be increased. In other words, it is possible to provide a semiconductor light emitting device having excellent optical characteristics.

The insulating member 28 is provided as one body from the outer side of the side surface of the fluorescer layer 30 to the upper surface of the fluorescer layer 30. Thereby, the light extraction efficiency of the radiated light can be increased further. In other words, it is possible to provide a semiconductor light emitting device having excellent optical characteristics.

In addition to the description recited above, according to the embodiment, the tilted portion 28r is formed at the side surface of the insulating member 28. The tilted portion 28r has an acute angle with respect to the lower surface of the insulating member 28. Thereby, the occurrence of the optical confinement at the side surface of the insulating member 28 can be suppressed; the reflection direction of the radiated light can be promoted to be toward the light extraction surface side; and it is possible to increase the light extraction efficiency. In other words, it is possible to provide a semiconductor light emitting device having excellent optical characteristics.

Twelfth Embodiment

Examples of the configurations of semiconductor light emitting devices of the embodiment will now be described with reference to FIG. 32 and FIG. 33.

The main difference between the embodiment and the embodiment described above is the configurations of the transparent resin (a third insulating layer) and the insulating member. Therefore, a description is partially omitted for portions similar to those of the embodiment described above.

Figure 32:
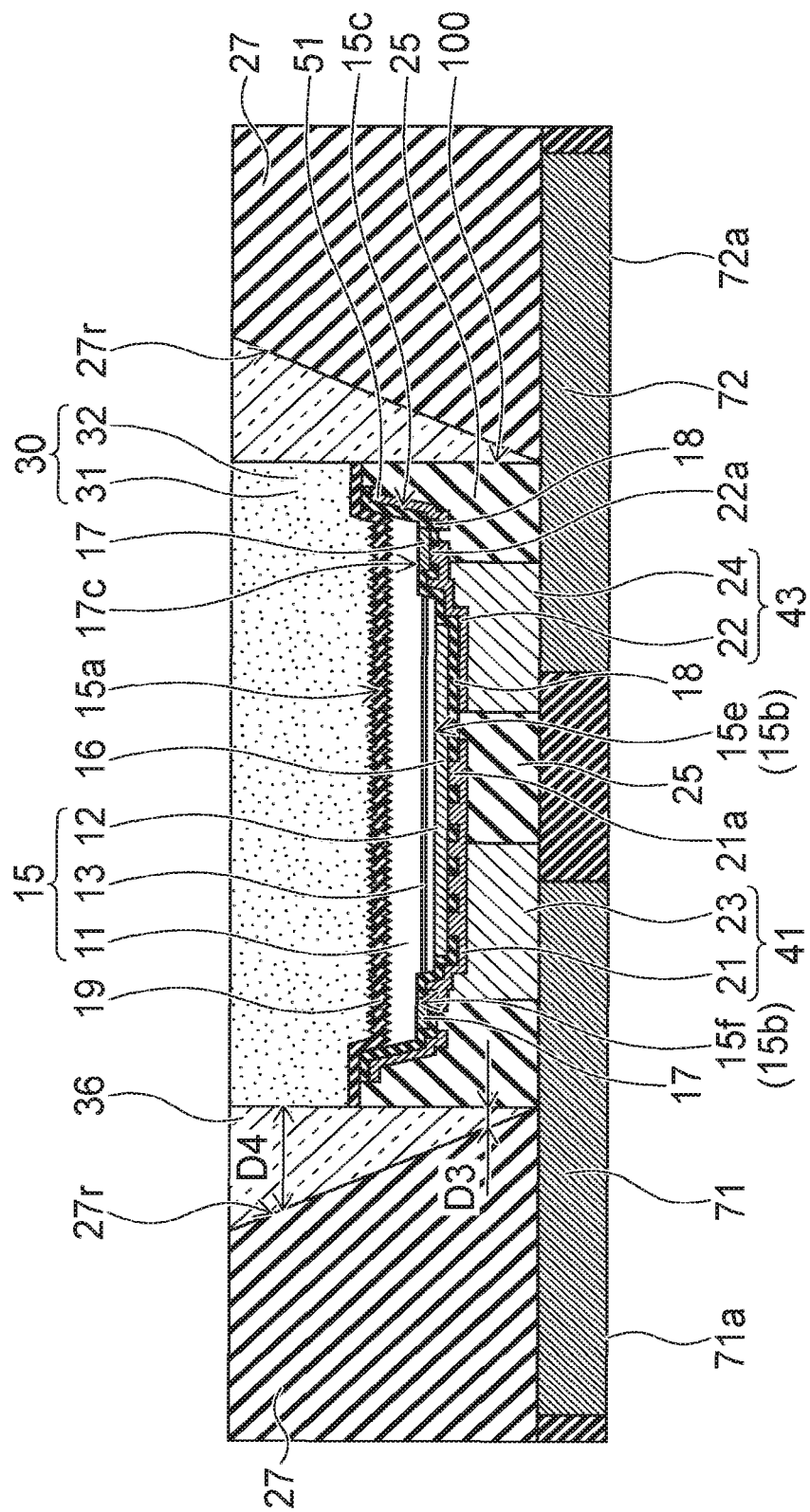
FIG. 32 is a schematic cross-sectional view of the semiconductor light emitting device of a twelfth embodiment.

As shown in FIG. 32, the insulating member 27 and a transparent resin 36 are provided in the region outside the chip on the outer side of the side surface of the resin layer 25. The transparent resin 36 is provided between the resin layer 25 and the insulating member 27. The transparent resin 36 contacts the side surface of the resin layer 25 and the side surface of the fluorescer layer 30. The transparent resin 36 is provided as one body from the side surface of the resin layer 25 to the side surface of the fluorescer layer 30. The transparent resin 36 is light-transmissive and may include, for example, various resin materials such as a silicone resin, an epoxy resin, a polycarbonate resin, etc.

The insulating member 27 includes the tilted portion 27r. The tilted portion 27r contacts the transparent resin 36. The tilted portion 27r is separated, with the transparent resin 36 interposed, from the side surface of the resin layer 25 and the side surface of the fluorescer layer 30.

The tilted portion 27r is tilted with respect to the first surface 15a of the semiconductor layer 15. In the second direction intersecting the first direction, a third width D3 between the tilted portion 27r and the side surface of the resin layer 25 is wider than a fourth width D4 between the insulating member 27 and the side surface of the fluorescer layer 30.

In other words, the transparent resin 36 that is surrounded with the insulating member 27 enlarges from the interconnects 71 and 72 side toward the fluorescer layer 30 and has a tapered configuration. Thereby, the radiated light that is incident on the transparent resin 36 can be promoted to travel toward the light extraction surface side by the tilted portion 27r; and it is possible to increase the light extraction efficiency. It is possible to suppress the light returning to the semiconductor layer 15 side. The amount of heat generated can be reduced as the light absorption decreases.

The angle of the tilted portion 27r with respect to the lower surface of the insulating member 27 is, for example, less than 30 degrees. Thereby, it is possible to further increase the light extraction efficiency.

Figure 33:
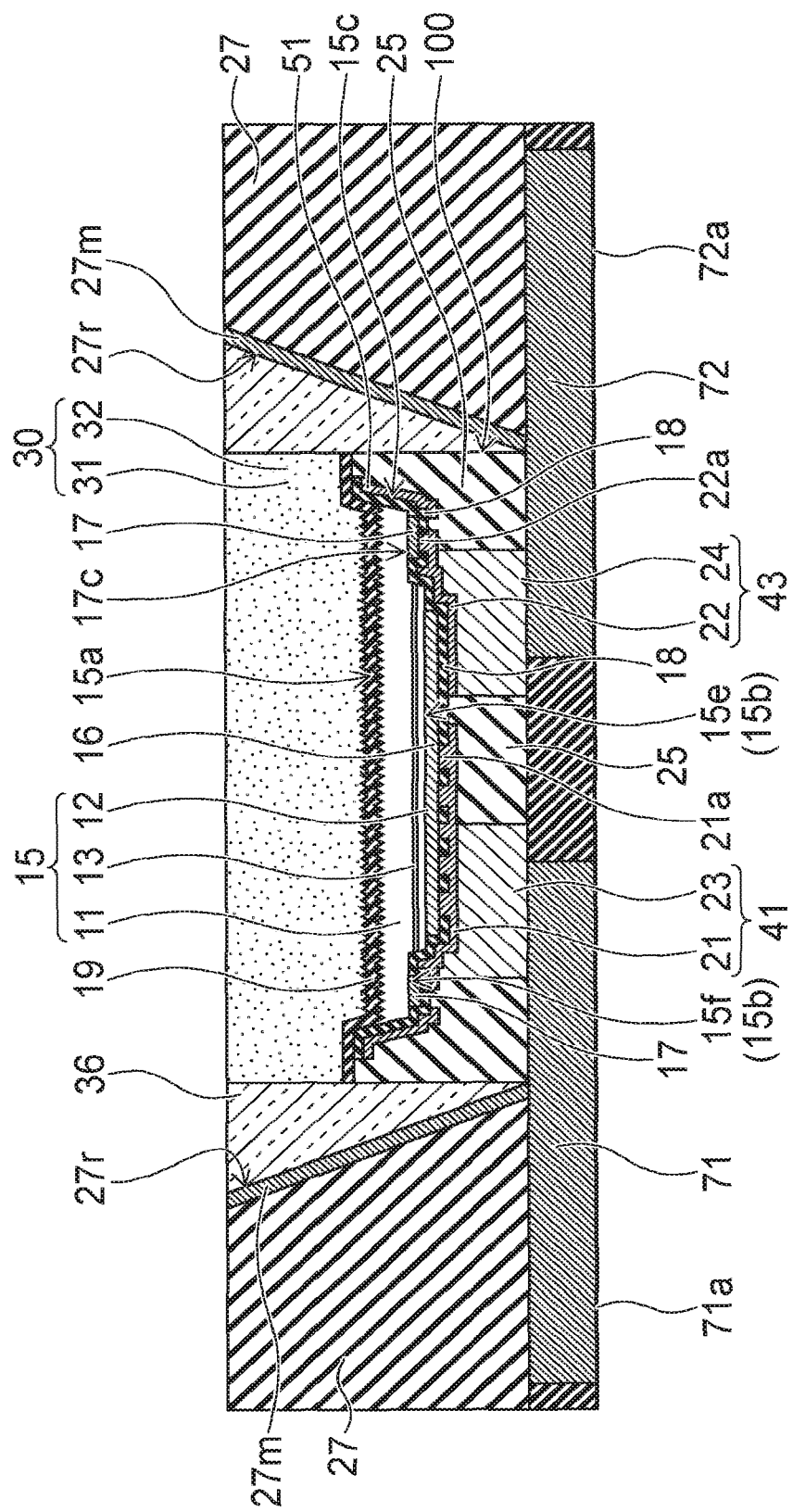
FIG. 33 is a schematic cross-sectional view of the semiconductor light emitting device of the twelfth embodiment.

In addition to the description recited above, as shown in FIG. 33, the metal layer 27m that is light-reflective may be provided on the tilted portion 27r. Thereby, the radiated light reflectance at the side surface of the insulating member 27 can be improved; and it is possible to further increase the light extraction efficiency. In other words, it is possible to provide a semiconductor light emitting device having excellent optical characteristics.

A method for manufacturing the semiconductor light emitting device of the embodiment will now be described with reference to FIG. 34A to FIG. 35B.

In the method for manufacturing the semiconductor light emitting device of the embodiment, the processes up to the singulation of the multiple semiconductor chips 3 are similar to the processes shown in FIG. 3A to FIG. 7B; and a description is therefore omitted.

As shown in FIG. 34A, the singulated multiple semiconductor chips 3 are rearranged on the support body 96. The fluorescer layer 30 contacts the support body 96. Subsequently, the transparent resin 36 is formed as one body on the surfaces of the multiple semiconductor chips 3. The transparent resin 36 is formed as one body between the multiple semiconductor chips 3. The transparent resin 36 contacts the side surface of the fluorescer layer 30, the side surface and lower surface of the resin layer 25, and the lower surfaces of the interconnects 71 and 72.

As shown in FIG. 34B, the transparent resin 36 that is formed between the multiple semiconductor chips 3 is diced. At this time, the side surface of the transparent resin 36 is formed to be tilted with respect to the first surface 15a of the semiconductor layer 15. In other words, the removal of the transparent resin 36 is performed in a tapered configuration. Therefore, the width of the transparent resin 36 that is removed between the multiple semiconductor chips 3 decreases toward the support body 96.

As shown in FIG. 35A, the insulating member 27 is formed as one body in the portion where the transparent resin 36 is removed. The insulating member 27 contacts the side surface of the transparent resin 36 and the lower surface of the resin layer. The insulating member 27 is formed as one body between the multiple semiconductor chips 3.

The tilted portion 27r of the insulating member 27 is formed on the side surface of the transparent resin 36. The tilted portion 27r is separated from the side surface of the fluorescer layer 30 and the side surface of the resin layer 25 with the transparent resin 36 interposed. In other words, the insulating member 27 includes the tilted portion 27r contacting the side surface of the transparent resin 36.

As shown in FIG. 35B, similarly to the manufacturing method described above, the interconnects 71 and 72, etc., are formed. Subsequently, the singulated multiple semiconductor chips 3 are formed. Thereby, the semiconductor light emitting device of the embodiment is formed.

According to the embodiment, similarly to the embodiment described above, the insulating member 27 includes a material that is different from the resin layer 25. Thereby, the characteristics that are necessary for the mounting surface side and the characteristics that are necessary for the side surface side of the fluorescer layer 30 can be provided simultaneously; and it is possible to provide a semiconductor light emitting device having excellent optical characteristics.

In addition to the description recited above, according to the embodiment, the insulating member 27 and the transparent resin 36 are formed in the chip region on the outer side of the side surface of the resin layer 25. The tilted portion 27r is formed at the side surface of the insulating member 27. The tilted portion 27r has an acute angle with respect to the lower surface of the insulating member 27.

The transparent resin 36 is formed between the resin layer 25 and the insulating member 27. By providing this structure, the tilted portion 27r can be formed after rearranging the singulated multiple semiconductor chips 3; and inexpensive manufacturing is possible.

For example, in the case where the tilted portion is formed simultaneously with the singulation process of the multiple semiconductor chips 3, it is necessary to form the semiconductor chips having the wafer configuration by considering the width of the tilted portion. Therefore, the number of semiconductor chips 3 obtained after the singulation process may be reduced.

Conversely, according to the embodiment, the tilted portion 27r is formed after the multiple semiconductor chips 3 are rearranged. Therefore, the width of the dicing in the singulation process can be kept to a minimum; the number of semiconductor chips 3 obtained after the singulation process can be increased; and inexpensive manufacturing is possible.

By forming the tilted portion 27r, the occurrence of the optical confinement at the side surface of the insulating member 27 can be suppressed; the reflection direction of the radiated light can be promoted to be toward the light extraction surface side; and it is possible to increase the light extraction efficiency. In other words, it is possible to provide a semiconductor light emitting device having excellent optical characteristics.

Thirteenth Embodiment

Examples of the configurations of semiconductor light emitting devices of the embodiment will now be described with reference to FIG. 36 and FIG. 37.

The main difference between the embodiment and the embodiment described above is the configurations of the insulating member and the fluorescer layer. Therefore, a description is partially omitted for portions similar to those of the embodiment described above.

Figure 36:
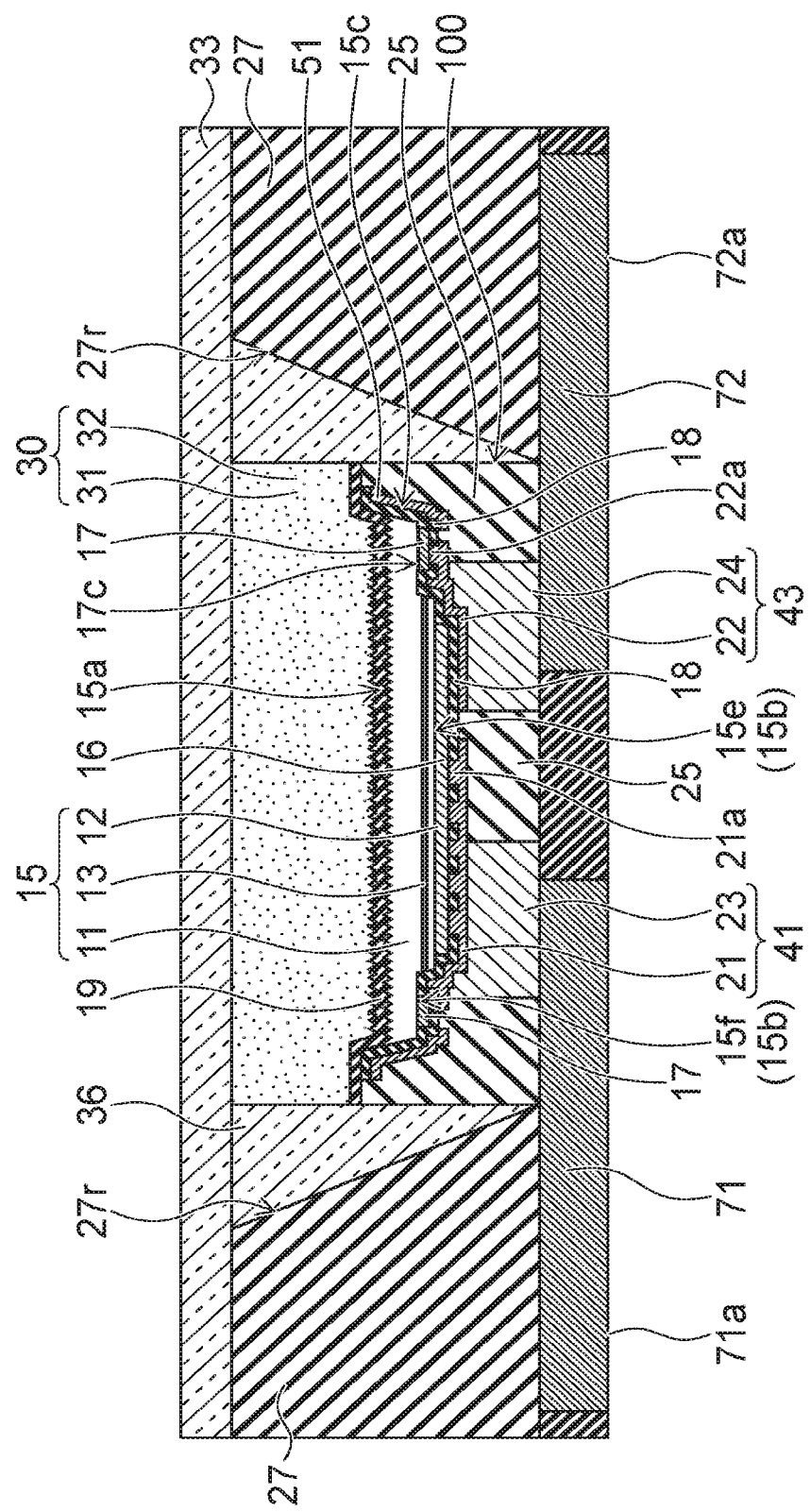
FIG. 36 is a schematic cross-sectional view of the semiconductor light emitting device of a thirteenth embodiment.

As shown in FIG. 36, the insulating member 27 and the transparent resin 36 are provided in the region outside the chip on the outer side of the side surface of the resin layer 25. The transparent resin 36 is provided between the resin layer 25 and the insulating member 27. The transparent resin 36 contacts the side surface of the resin layer 25 and the side surface of the fluorescer layer 30.

The insulating member 27 includes the tilted portion 27r. The tilted portion 27r contacts the transparent resin 36. The tilted portion 27r is separated, with the transparent resin 36 interposed, from the side surface of the resin layer 25 and the side surface of the fluorescer layer 30.

The transparent layer 33 is provided as one body on the insulating member 27, on the transparent resin 36, and on the fluorescer layer 30. The transparent layer 33 is provided across the tilted portion 27r of the insulating member 27. For example, the insulating member 27 upper surface, the transparent resin 36, and the fluorescer layer 30 upper surface contact the transparent layer 33 in the same plane.

The transparent layer 33 is light-transmissive. The refractive index of the transparent layer 33 is, for example, lower than the refractive index of the fluorescer layer 30 and is 1 or more.

Figure 37:
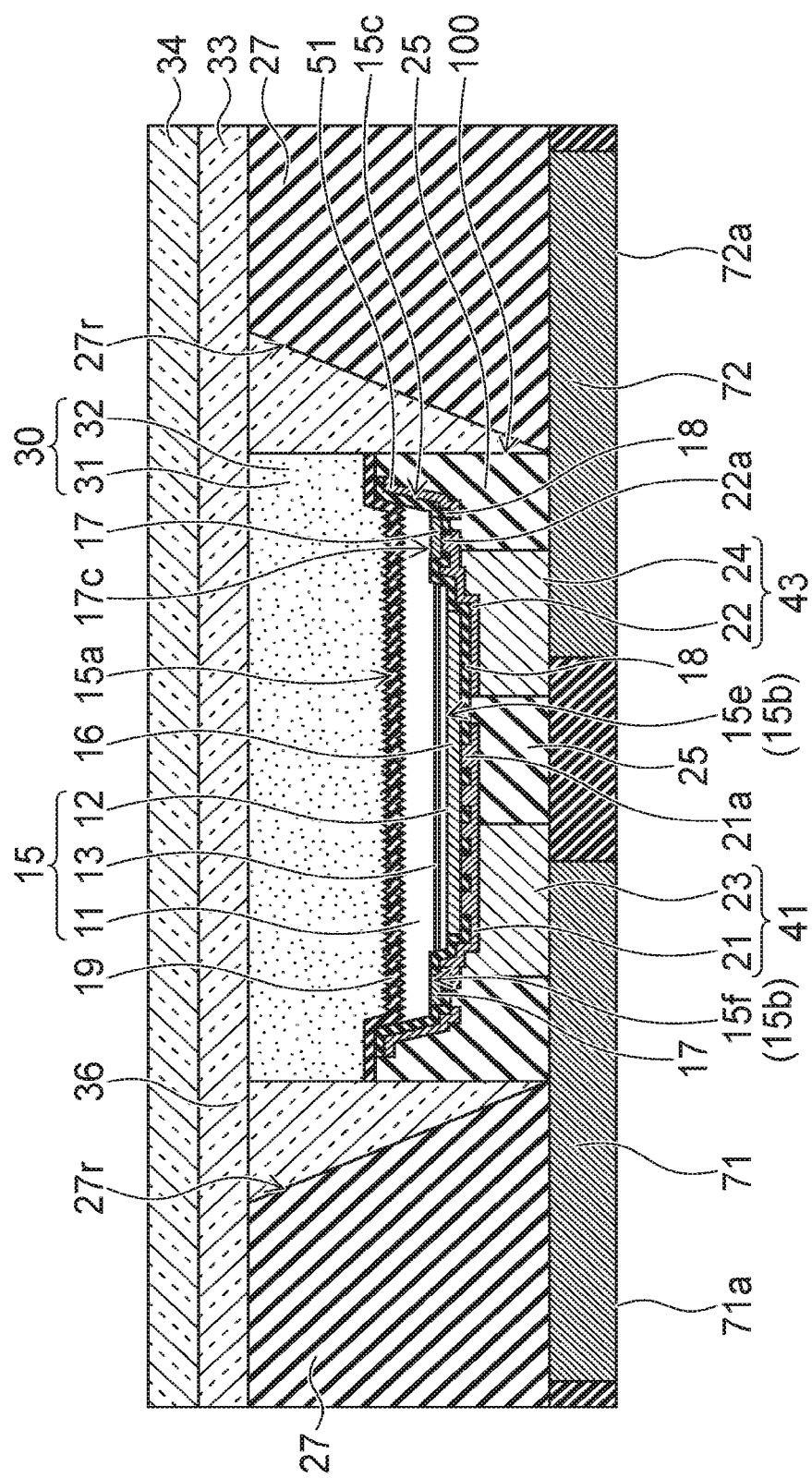
FIG. 37 is a schematic cross-sectional view of the semiconductor light emitting device of a thirteenth embodiment.

As shown in FIG. 37, for example, the substrate 34 is provided on the transparent layer 33. The substrate 34 is light-transmissive. The refractive index of the substrate 34 is, for example, not greater than the refractive index of the transparent layer 33. The substrate 34 includes, for example, the glass described above.

According to the embodiment, similarly to the embodiment described above, the insulating member 27 includes a material that is different from the resin layer 25. Thereby, the characteristics that are necessary for the mounting surface side and the characteristics that are necessary for the side surface side of the fluorescer layer 30 can be provided simultaneously; and it is possible to provide a semiconductor light emitting device having excellent optical characteristics.

In addition to the description recited above, according to the embodiment, the transparent layer 33 is provided on the insulating member 27 and on the transparent resin 36 and the fluorescer layer 30. Thereby, the light that is emitted from the fluorescer layer 30 to the outside travels via a substance in which the refractive index decreases in steps. Therefore, the light extraction efficiency of the radiated light can be increased.

According to the embodiment, the substrate 34 is provided on the transparent layer 33. Thereby, the light extraction efficiency of the radiated light can be increased further. In the case where a thick film of glass is used as the substrate 34, the strength of the device can be increased. In other words, it is possible to provide a semiconductor light emitting device that has excellent optical characteristics and physical strength.

In addition to the description recited above, according to the embodiment, the tilted portion 27r is formed at the side surface of the insulating member 27. The tilted portion 27r has an acute angle with respect to the lower surface of the insulating member 27. Thereby, the occurrence of the optical confinement at the side surface of the insulating member 27 can be suppressed; the reflection direction of the radiated light can be promoted to be toward the light extraction surface side; and it is possible to increase the light extraction efficiency.

The transparent resin 36 is formed between the resin layer 25 and the insulating member 27. By providing this structure, the tilted portion 27r can be formed after rearranging the singulated multiple semiconductor chips 3; and inexpensive manufacturing is possible.

Fourteenth Embodiment

An example of the configuration of a semiconductor light emitting device of the embodiment will now be described with reference to FIG. 38.

The main difference between the embodiment and the embodiment described above is the configurations of the transparent resin and the insulating member. Therefore, a description is partially omitted for portions similar to those of the embodiment described above.

Figure 38:
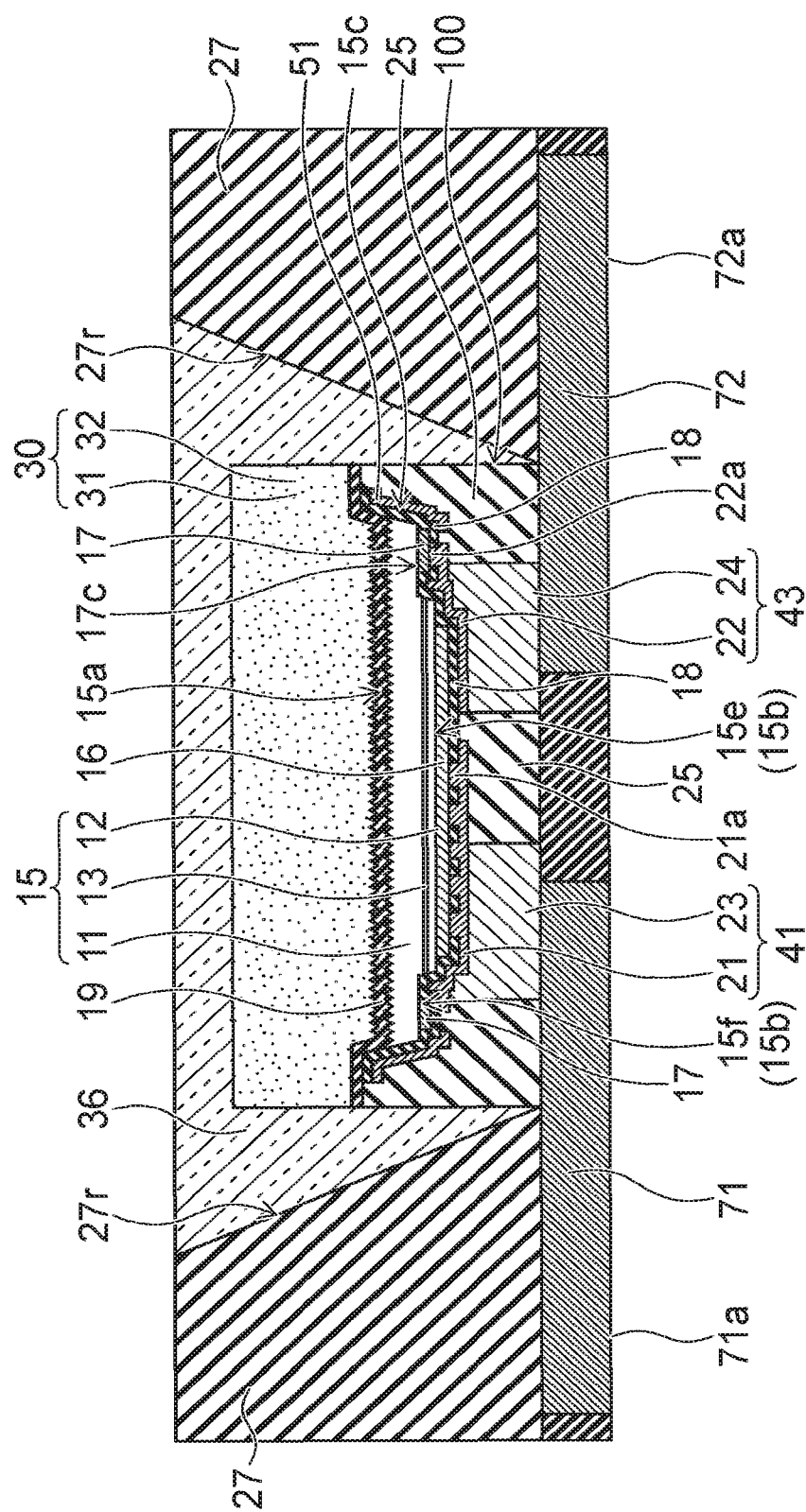
FIG. 38 is a schematic cross-sectional view of the semiconductor light emitting device of a fourteenth embodiment.

As shown in FIG. 38, the insulating member 27 and the transparent resin 36 are provided in the region outside the chip on the outer side of the side surface of the resin layer 25. The transparent resin 36 is provided between the resin layer 25 and the insulating member 27. The transparent resin 36 contacts the side surface of the resin layer 25 and the side surface of the fluorescer layer 30. The transparent resin 36 is provided as one body to the outer side upper surface of the side surface of the fluorescer layer 30.

The insulating member 27 includes the tilted portion 27r. The tilted portion 27r contacts the transparent resin 36. The tilted portion 27r is separated, with the transparent resin 36 interposed, from the side surface of the resin layer 25 and the side surface of the fluorescer layer 30.

The insulating member 27 includes the tilted portion 27r. The tilted portion 27r contacts the transparent resin 36. The tilted portion 27r is separated, with the transparent resin 36 interposed, from the side surface of the resin layer 25 and the side surface of the fluorescer layer 30.

According to the embodiment, similarly to the embodiment described above, the insulating member 27 includes a material that is different from the resin layer 25. Thereby, the characteristics that are necessary for the mounting surface side and the characteristics that are necessary for the side surface side of the fluorescer layer 30 can be provided simultaneously; and it is possible to provide a semiconductor light emitting device having excellent optical characteristics.

The transparent resin 36 is provided as one body from the outer side of the side surface of the fluorescer layer 30 to the upper surface of the fluorescer layer 30. Thereby, the light extraction efficiency of the radiated light can be increased further. In other words, it is possible to provide a semiconductor light emitting device having excellent optical characteristics.

In addition to the description recited above, according to the embodiment, the tilted portion 27r is formed at the side surface of the insulating member 27. The tilted portion 27r has an acute angle with respect to the lower surface of the insulating member 27. Thereby, the occurrence of the optical confinement at the side surface of the insulating member 27 can be suppressed; the reflection direction of the radiated light can be promoted to be toward the light extraction surface side; and it is possible to increase the light extraction efficiency.

The transparent resin 36 is formed between the resin layer 25 and the insulating member 27. By providing this structure, the tilted portion 27r can be formed after rearranging the singulated multiple semiconductor chips 3; and inexpensive manufacturing is possible.

According to an embodiment, the semiconductor light emitting device further includes, for example, a light-reflective metal layer provided on the tilted portion.

According to an embodiment, the semiconductor light emitting device further includes, for example, a third insulating layer that includes a light-transmissive material and is provided between the first insulating layer and the second insulating layer and between the fluorescer layer and the second insulating layer; and the width in the second direction of the third insulating layer provided between the first insulating film and the second insulating layer is narrower than the width in the second direction of the third insulating layer provided between the fluorescer layer and the second insulating layer.

According to an embodiment, for example, the second insulating layer includes a material that is light-transmissive.

According to an embodiment, for example, the second insulating layer is provided as one body from the outer side of the side surface of the fluorescer layer onto the fluorescer layer; and the refractive index of the second insulating layer is lower than the refractive index of the fluorescer layer.

According to an embodiment, for example, the first insulating layer includes a material that is light-shielding.

According to an embodiment, for example, the first insulating layer includes a material that is light-reflective.

According to an embodiment, for example, the first insulating layer includes a material that is light-transmissive.

According to an embodiment, for example, the semiconductor light emitting device further includes a p-side second metal layer that is light-reflective and provided between the first p-side pillar and the first insulating layer, and an n-side second metal layer that is light-reflective and provided between the first n-side pillar and the first insulating layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device, comprising:
a semiconductor layer including a first semiconductor layer, a second semiconductor layer, a light emitting layer, a first surface, and a second surface, the light emitting layer being provided between the first semiconductor layer and the second semiconductor layer, the second surface opposing the first surface;
a p-side electrode electrically connected to the second semiconductor layer;
an n-side electrode electrically connected to the first semiconductor layer;
a first p-side pillar provided on the second surface side and electrically connected to the p-side electrode;
a first n-side pillar provided on the second surface side and electrically connected to the n-side electrode;
a first insulating layer provided between the first p-side pillar and the first n-side pillar, on an outer side of a side surface of the first p-side pillar, on an outer side of a side surface of the first n-side pillar, and on an outer side of a side surface of the semiconductor layer;
a fluorescer layer provided on the first surface of the first semiconductor layer and on the first insulating layer, the fluorescer layer including a fluorescer;
a second insulating layer provided as one body in at least a portion of an outer side of a side surface of the first insulating layer and at least a portion of an outer side of a side surface of the fluorescer layer, the second insulating layer being made of a material different from the first insulating layer, the second insulating layer including a material being light-reflective;
a p-side interconnect electrically connected to the first p-side pillar, the p-side interconnect extending onto the second insulating layer across the first insulating layer; and
an n-side interconnect electrically connected to the first n-side pillar, the n-side interconnect extending onto the second insulating layer;
the first insulating layer contacting the first p-side pillar, the first n-side pillar, the p-side interconnect, and the n-side interconnect, and
at least a portion of the second insulating layer contacting the side surface of the first insulating layer, the side surface of the fluorescer layer, the p-side interconnect, and the n-side interconnect.

2. The device according to claim 1, further comprising:
a p-side intermediate interconnect layer provided between the p-side electrode and the first p-side pillar, the p-side intermediate interconnect layer being electrically connected to the p-side electrode and the first p-side pillar; and
an n-side intermediate interconnect layer provided between the n-side electrode and the first n-side pillar, the n-side intermediate interconnect layer being electrically connected to the n-side electrode and the first n-side pillar.

3. The device according to claim 1, further comprising a buffering insulating material provided across a boundary between the first insulating layer and the second insulating layer, the buffering insulating material being provided between the p-side interconnect and the first insulating layer, between the p-side interconnect and the second insulating layer, between the n-side interconnect and the first insulating layer, and between the n-side interconnect and the second insulating layer.

4. The device according to claim 1, further comprising:
a second p-side pillar electrically connected to the p-side interconnect; and
a second n-side pillar electrically connected to the n-side interconnect.

5. The device according to claim 1, further comprising a first layer provided as one body on the fluorescer layer and on the second insulating layer, the first layer being light-transmissive.

6. The device according to claim 5, further comprising a substrate provided on the first layer, the substrate being light-transmissive.

7. The device according to claim 1, wherein
at least an end portion of the fluorescer layer is higher than an upper surface of the second insulating layer in a first direction, the first direction being from the second surface toward the first surface, and
an upper surface of the first insulating layer is lower than the upper surface of the fluorescer layer in the first direction.

8. The device according to claim 1, wherein the first insulating layer is separated from the side surface of the fluorescer layer.

9. The device according to claim 1, wherein
the second insulating layer includes a tilted portion, and
a width in a second direction of the second insulating layer provided on the outer side of the side surface of the first insulating film is wider than the width in the second direction of the second insulating layer provided on the outer side of the side surface of the fluorescer layer, the second direction intersecting a first direction from the second surface toward the first surface.

10. The device according to claim 9, further comprising a metal layer provided on the tilted portion, the metal layer being light-reflective.

11. The device according to claim 9, further comprising a third insulating layer provided between the first insulating layer and the second insulating layer and between the fluorescer layer and the second insulating layer, the third insulating layer including a material being light-transmissive,
a width in the second direction of the third insulating layer provided between the first insulating layer and the second insulating layer being narrower than the width in the second direction of the third insulating layer provided between the fluorescer layer and the second insulating layer.

12. The device according to claim 1, further comprising:
a p-side first metal layer provided as one body between the first insulating layer and the p-side interconnect, between the second insulating layer and the p-side interconnect, and between the first p-side pillar and the p-side interconnect, the p-side first metal layer being light-reflective; and
an n-side first metal layer provided as one body between the first insulating layer and the n-side interconnect, between the second insulating layer and the n-side interconnect, and between the first n-side pillar and the n-side interconnect, the n-side first metal layer being light-reflective.

13. The device according to claim 1, wherein the first insulating layer includes a stress reliever.

14. The device according to claim 1, wherein the second insulating layer includes a material being light-transmissive.

15. The device according to claim 1, wherein
the second insulating layer is provided as one body onto the fluorescer layer from the outer side of the side surface of the fluorescer layer, and
a refractive index of the second insulating layer is lower than a refractive index of the fluorescer layer.

16. The device according to claim 1, wherein the first insulating layer includes a material being light-shielding.

* * * * *